US012563822B2

(12) United States Patent
Wen et al.

(10) Patent No.: US 12,563,822 B2
(45) Date of Patent: *Feb. 24, 2026

(54) SEMICONDUCTOR DEVICE AND METHOD

(71) Applicant: Taiwan Semiconductor Manufacturing Co., Ltd., Hsinchu (TW)

(72) Inventors: Kai-Qiang Wen, Hsinchu (TW); Shih-Fen Huang, Jhubei (TW); Shih-Chun Fu, Hsinchu (TW); Chi-Yuan Shih, Hsinchu (TW); Feng Yuan, Hsinchu (TW); Wan-Lin Tsai, Hsinchu (TW); Chung-Liang Cheng, Changhua County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 841 days.

This patent is subject to a terminal disclaimer.

(21) Appl. No.: 17/848,605

(22) Filed: Jun. 24, 2022

(65) Prior Publication Data

US 2023/0420452 A1 Dec. 28, 2023

(51) Int. Cl.
| | |
|---|---|
| *H10D 84/80* | (2025.01) |
| *H10D 1/00* | (2025.01) |
| *H10D 1/43* | (2025.01) |
| *H10D 30/01* | (2025.01) |
| *H10D 30/62* | (2025.01) |
| *H10D 64/01* | (2025.01) |

(52) U.S. Cl.
CPC ........... *H10D 84/811* (2025.01); *H10D 1/025* (2025.01); *H10D 1/43* (2025.01); *H10D 30/024* (2025.01); *H10D 30/6211* (2025.01); *H10D 64/017* (2025.01)

(58) Field of Classification Search
CPC .. H10D 84/811; H10D 84/817; H10D 30/797; H10D 1/025
See application file for complete search history.

(56) References Cited

U.S. PATENT DOCUMENTS

| | | | |
|---|---|---|---|
| 9,647,071 B2 | 5/2017 | Peng et al. | |
| 10,157,987 B1 | 12/2018 | Liaw | |
| 12,237,227 B2 * | 2/2025 | Wen ......................... H10D 1/47 |
| 2011/0117710 A1 * | 5/2011 | Lin ...................... H10D 30/797 |
| | | | 257/E21.616 |
| 2013/0307076 A1 | 11/2013 | Cheng | |
| 2015/0333057 A1 * | 11/2015 | Hoentschel .......... H01L 21/308 |
| | | | 257/379 |
| 2022/0262730 A1 | 8/2022 | Liaw | |
| 2023/0317714 A1 | 10/2023 | Wen | |
| 2023/0420452 A1 | 12/2023 | Wen | |

* cited by examiner

*Primary Examiner* — Tuan A Hoang
(74) *Attorney, Agent, or Firm* — Slater Matsil, LLP

(57) ABSTRACT

Embodiments include a FinFET transistor including an embedded resistor disposed in the fin between the source epitaxial region and the source contact. A control contact may be used to bias the embedded resistor, thereby changing the resistivity of the resistor. Edge gates of the FinFET transistor may be replaced with insulating structures. Multiple ones of the FinFET/embedded resistor combination may be utilized together in a common drain/common source contact design.

20 Claims, 61 Drawing Sheets

SEMICONDUCTOR DEVICE AND METHOD

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
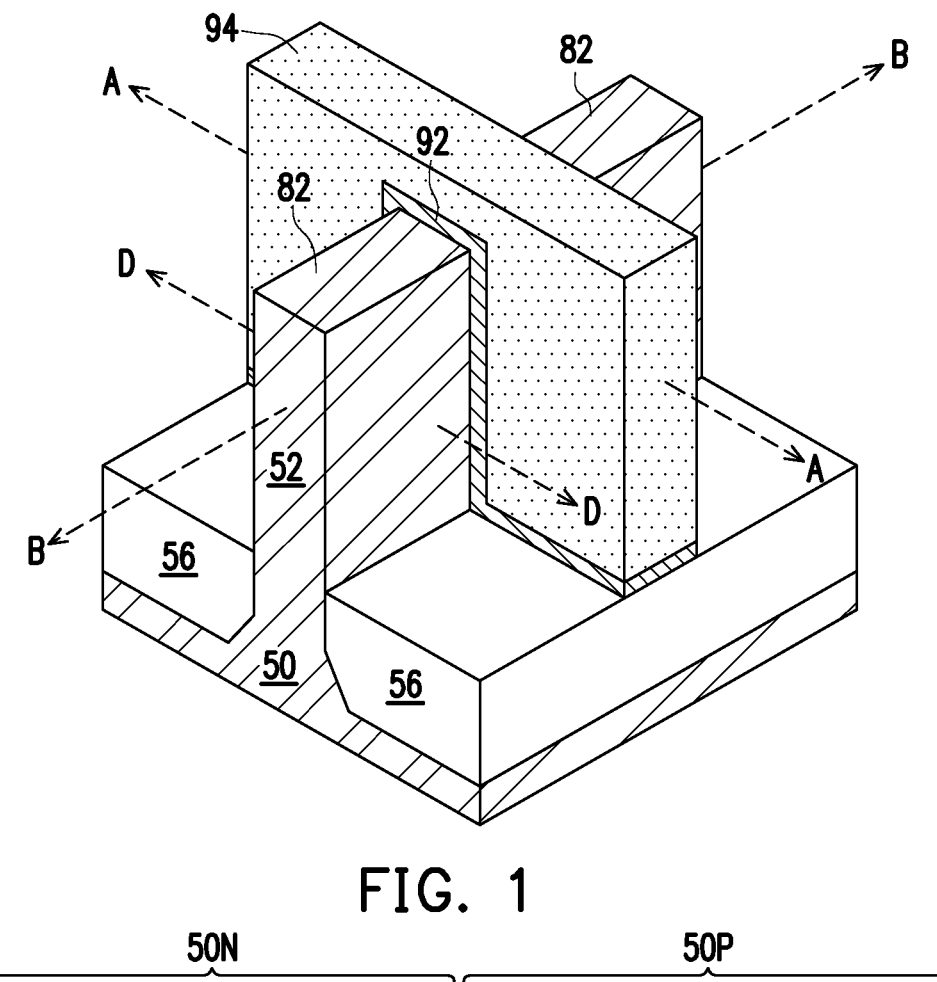
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistor devices including transistors electrically connected to adjacent resistors and the methods of forming the same are provided, in accordance with some embodiments. The resistors are formed using the same processing steps as the transistors, which can decrease device size and manufacturing cost. For example, the resistors may be formed in the same fin as an adjacent FinFET. The resistors may include passive resistors or variable resistors that have a resistance controllable by an applied voltage. Some embodiments include a transistor device comprising a transistor and resistor(s) coupled in a source-degenerated configuration. Using the resistors described herein as source-degeneration resistors coupled to a transistor can reduce the effects of the transistor's noise (e.g., flicker noise).

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. Source/drain region(s) may refer to a source or a drain, individually or collectively dependent upon the context. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section D-D is parallel to cross-section A-A and extends through a source/drain region 82 of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 15F include cross-sectional views and plan views of intermediate stages in the manufacturing of FinFETs, in accordance with some embodiments. Simplified circuit diagrams are also included. FIGS. 2 through 5 are illustrated along reference cross-section A-A illustrated in FIG. 1, except for multiple fins/FinFETs. FIGS. 6A, 8A, 9A, 10A, 11A, 12A, 13A, 14A, 15A, and 17A are illustrated along reference cross-section A-A illustrated in FIG. 1, and FIGS. 6B, 8B, 9B, 10B, 11B, 12B, 13B, 14B, 14D, 15B, and 15E are illustrated along reference cross-section B-B illustrated in FIG. 1, except for multiple fins/FinFETs. FIGS. 8C, 10C, 14C, and 15C are plan views. FIGS. 10D and 10E are illustrated along reference cross-section D-D illustrated in FIG. 1, except for multiple fins/FinFETs.

Figure 2:
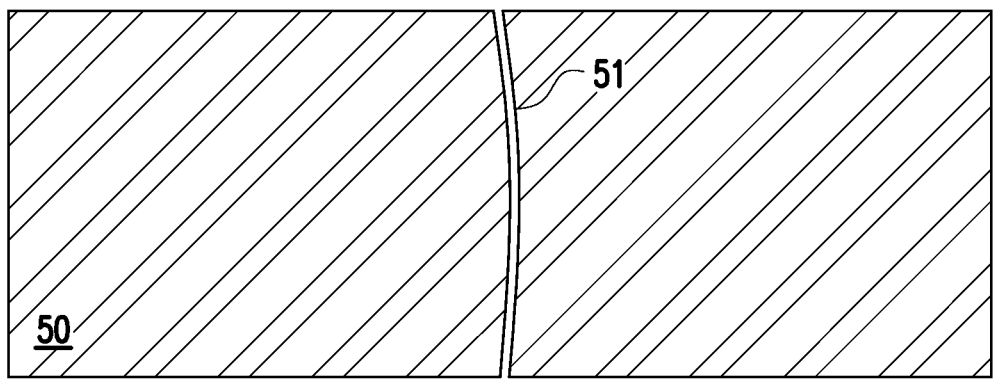
FIGS. 2, 3, 4, and 5 are cross-sectional views of intermediate stages in the manufacturing of a transistor device, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate.

Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
Figure 3:
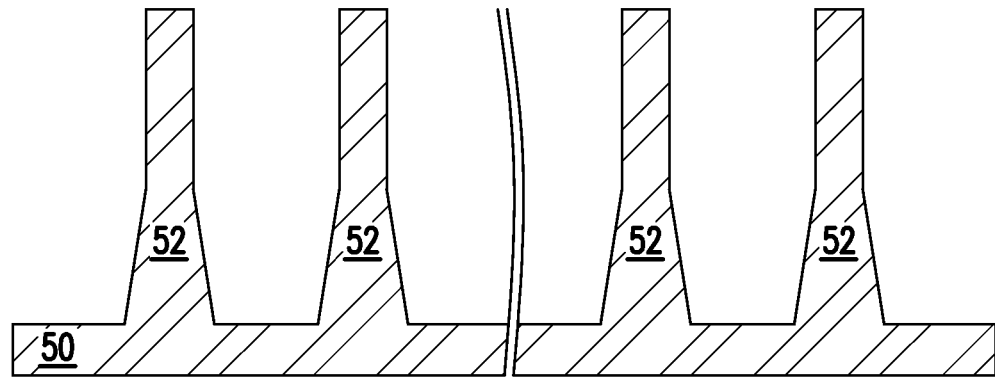

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
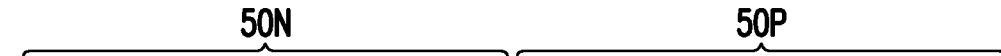
Figure 4:
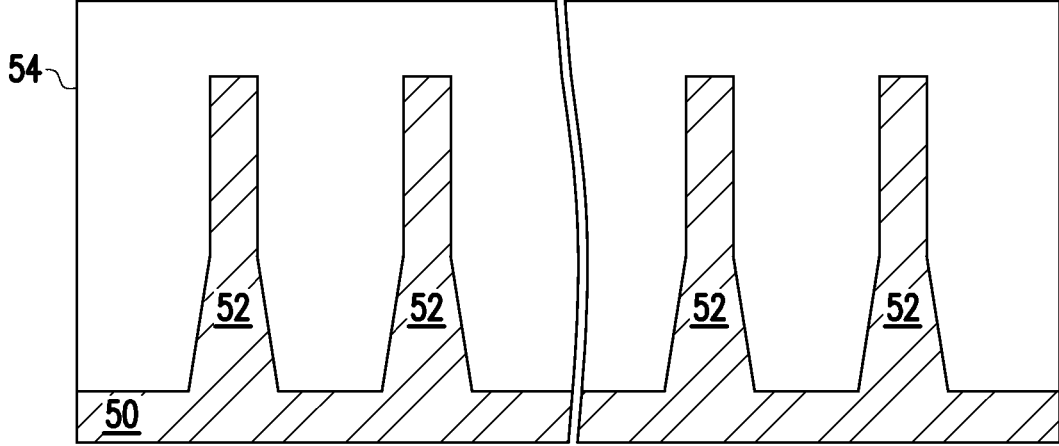

In FIG. 4, an insulation material 54 is formed over the substrate 50 and between neighboring fins 52. The insulation material 54 may be an oxide, such as silicon oxide, a nitride, the like, or a combination thereof, and may be formed by a high-density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
Figure 5:
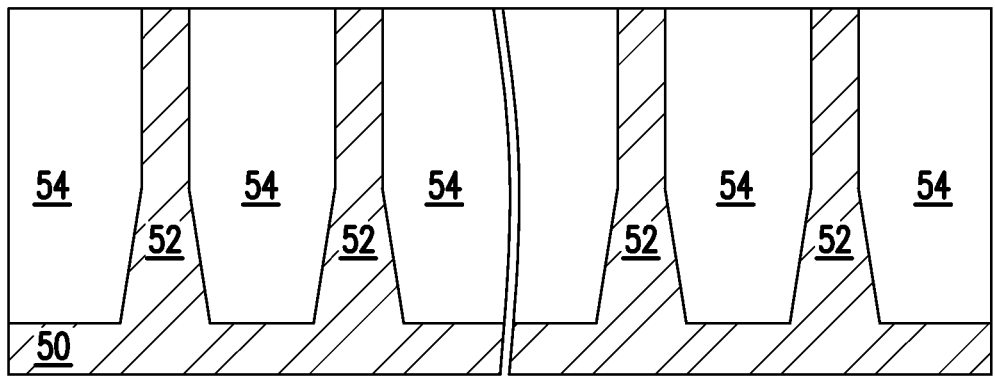

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6A:
FIGS. 6A, 6B, 7, 8A, 8B, 8C, 9A, 9B, 10A, 10B, 10C, 10D, 10E, 11A, 11B, 12A, 12B, 13A, 13B, 14A, 14B, 14C, 14D, 15A, 15B, and 15C are various views of intermediate stages in the manufacturing of a transistor device with an active resistor, in accordance with some embodiments.
Figure 6A:
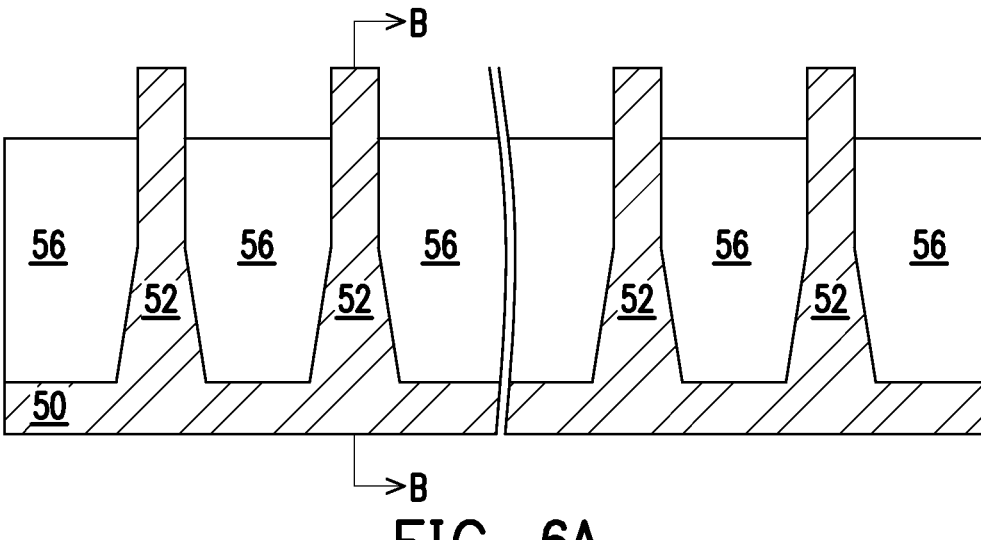

In FIG. 6A, the insulation material 54 is recessed to form Shallow Trench Isolation (STI) regions 56. The insulation material 54 is recessed such that upper portions of fins 52 in the n-type region and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6A is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium (Si$_x$Ge$_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6A, appropriate wells may be formed in the fins 52 and/or the substrate 50. In some embodiments, a P-well may be formed in the n-type region 50N, and an N-well may be formed in the p-type region 50P. In some embodiments, a P-well or an N-well are formed in both the n-type region 50N and the p-type region 50P. In some embodiments one or more of the well types may be omitted. For example, if the fins 52 are formed from a p-type substrate or have all been implanted with a p-type impurity, then a separate P-well may not be needed. Similarly, if the fins 52 are formed from an n-type substrate or have all been implanted with an n-type impurity, then a separate N-well may not be needed.

Figure 6B:
Figure 6B:
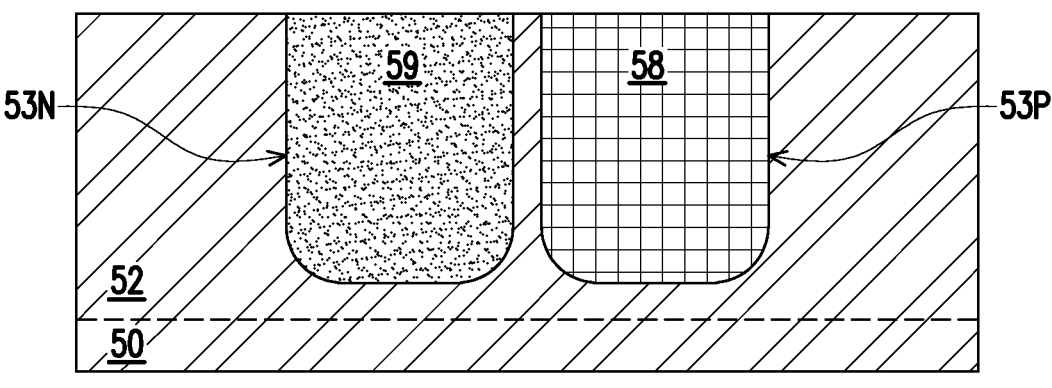

As an illustrative example, FIG. 6B shows a cross-sectional view of the n-type region 50N along the reference cross-section B-B shown in FIG. 6A, in accordance with some embodiments. As shown in FIG. 6B, both an N-well 53N and a P-well 53P may be formed in the fins 52. A P-well 53P may be formed in the fin 52 for an n-type device such as a FinFET (e.g., FinFET 120 in FIGS. 15A-15D) or the like. For example, a channel region 58 of a FinFET may be formed within a P-well 53P or in a p-type substrate. In some embodiments, an N-well 53N may be formed in the fin 52 for an active resistor (e.g., active resistor 121 in FIGS. 15A-15D), a passive resistor (e.g., passive resistor 123 in FIGS. 17A-17D), or the like. For example, a conductive channel 59 of an active resistor and/or a passive resistor may be formed within an N-well 53N.

FIG. 6B shows the n-type region 50N, but N-wells 53N and/or P-wells 53P may be formed in the p-type region 50P for FinFETs, active resistors, passive resistors, the like, or for other devices. In other embodiments, a region 50N/50P may have a different number or configuration of wells. For example, in other embodiments, more than one N-well 53N or P-well 53P may be present, or a region 50N/50P may be free of either N-wells 53N or P-wells 53P. The wells may have different sizes or shapes than shown, and may extend across multiple devices (e.g., across multiple FinFETs, active resistors, passive resistors, or other devices). An N-well 53N may be adjacent to a P-well 53P or separated from a P-well 53P. In some cases, an N-well 53N and a P-well 53P may overlap. While FIG. 6B illustrates both an N-well 53N and a P-well 53P, Figures of the similar cross-section (the reference cross-section B-B shown in FIG. 6A) will only illustrate the N-well 53N and not the P-well 53P (e.g., as in situations where the fin 52 includes a p-type impurity or is a p-substrate). In the illustrated embodiments, as a representative example, the N-well 53N is used for forming an active resistor or passive resistor as noted above. One will understand that for the p-type region 50P, the roles of these wells will be reversed, i.e., a similarly formed P-well 53P is used to form an active or passive resistor (see FIG. 18). Accordingly, one may switch the conductivity of the dopants and so forth for wells of the p-type region 50P.

In the embodiments with different well types (i.e., in the same region or in different regions), the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, the like, or a combination thereof implanted in the region to a concentration of equal to or less than about $10^{18}$ cm$^{-3}$, such as in the range of about $10^{16}$ cm$^{-3}$ to about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than about $10^{18}$ cm$^{-3}$, such as in the range of about $10^{16}$ cm$^{-3}$ to about $10^{18}$ cm$^{-3}$. After the implant, the photoresist may be removed, such as by an acceptable ashing process.

In other embodiments, the implants of the n-type region 50N and the p-type region 50P may be performed at a different stage in the manufacturing process than described above. For example, the implants may be performed prior to forming the fins 52 in the substrate 50 or at another step. In some embodiments, multiple implants may be performed at different stages, and additional implants may be performed in addition to those for the N-well 53N and the P-well 53P. For example, implants for lightly doped source/drain (LDD) regions may also be performed, described in greater detail below. Any suitable combination or configuration of implants may be used to form FinFETs, active resistors, and passive resistors as described herein, and all such variations are considered within the scope of the present disclosure.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
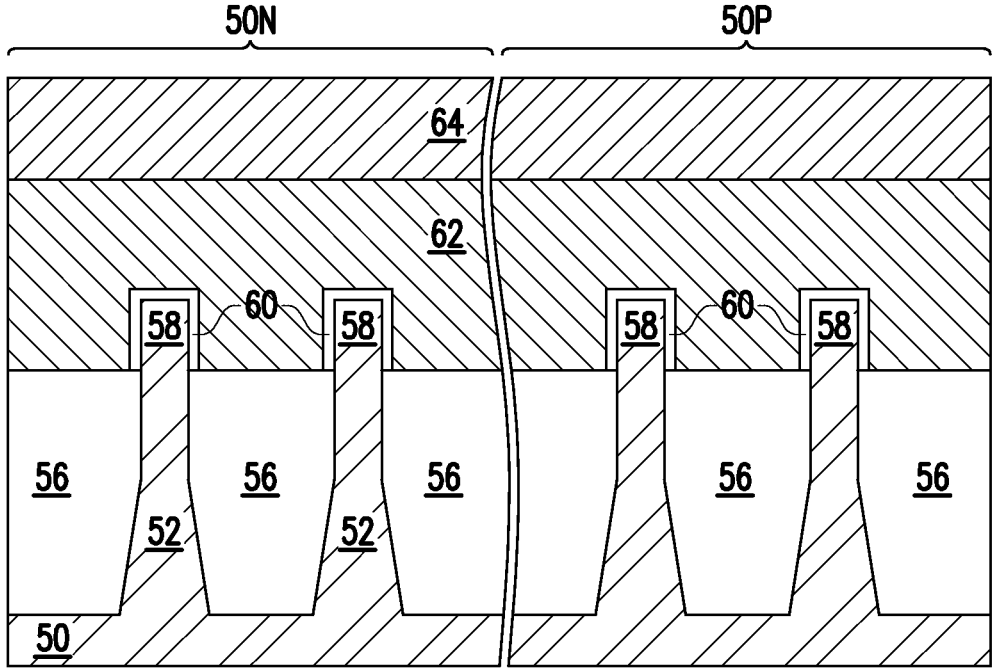

In FIG. 7, a dummy dielectric layer 60 is formed on the fins 52. The dummy dielectric layer may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

FIGS. 8A through 15F illustrate various additional steps in the manufacturing of embodiment devices. FIGS. 8A through 15F illustrate features in the n-type region 50N, but similar embodiments may be formed in the p-type region 50P. An example of a device in the p-type region 50P is described below for FIG. 18. The structures illustrated in FIGS. 8A through 15F may be applicable (with appropriate modifications) to both the n-type region 50N and the p-type region 50P (but with a different well conductivity type). Additional differences (if any) in the structures of the n-type region 50N and the p-type region 50P are described in the text accompanying each figure.

Figure 8A:
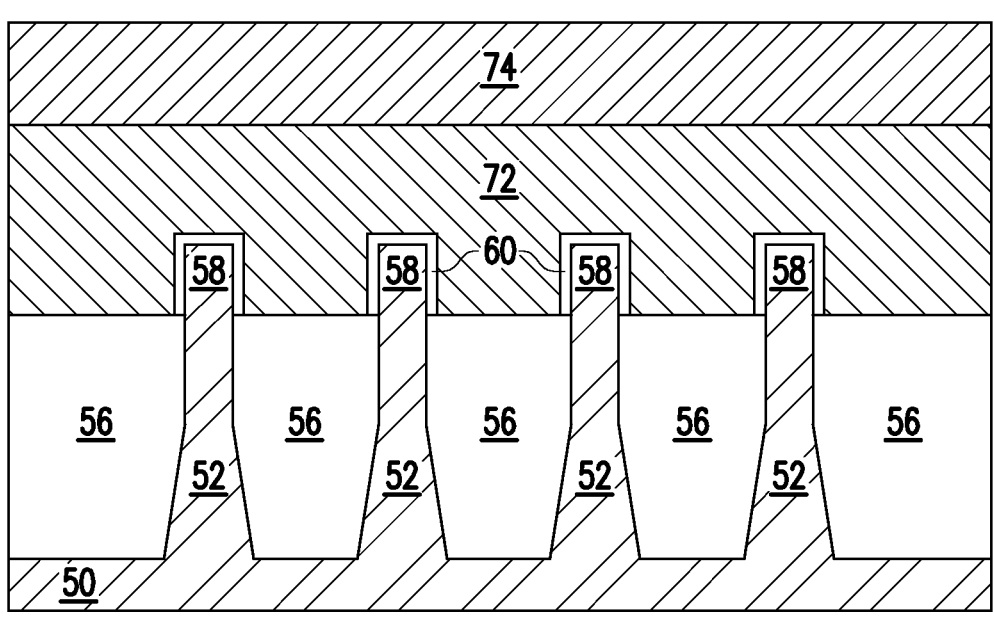
Figure 8B:
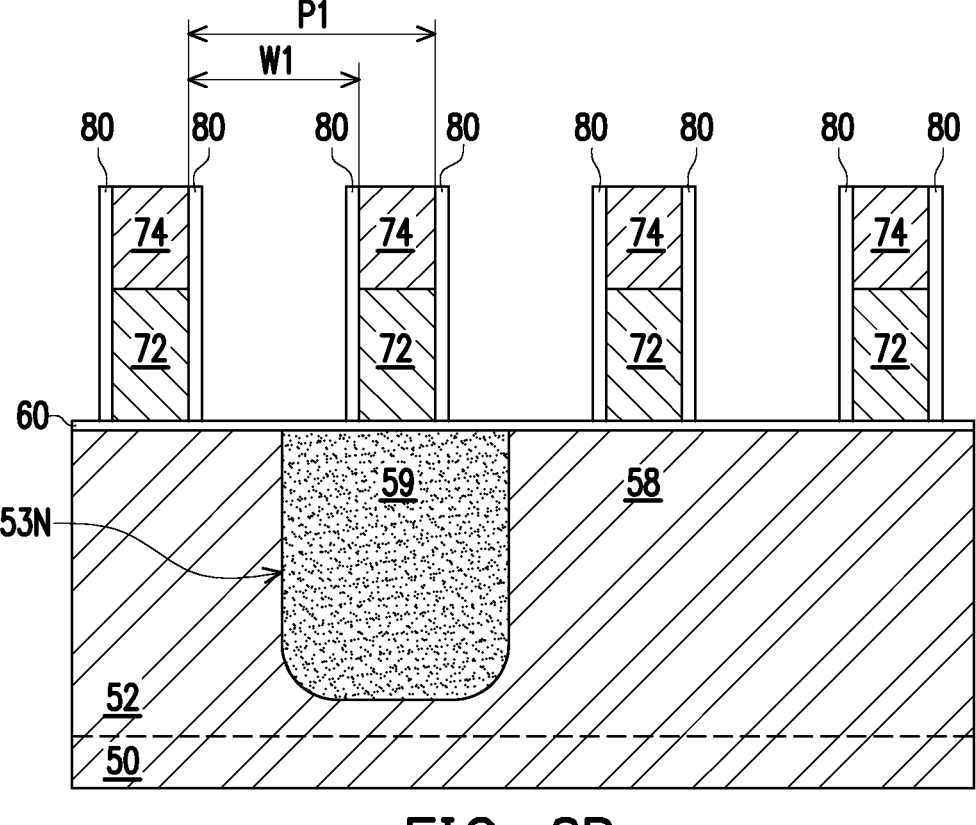
Figure 8C:
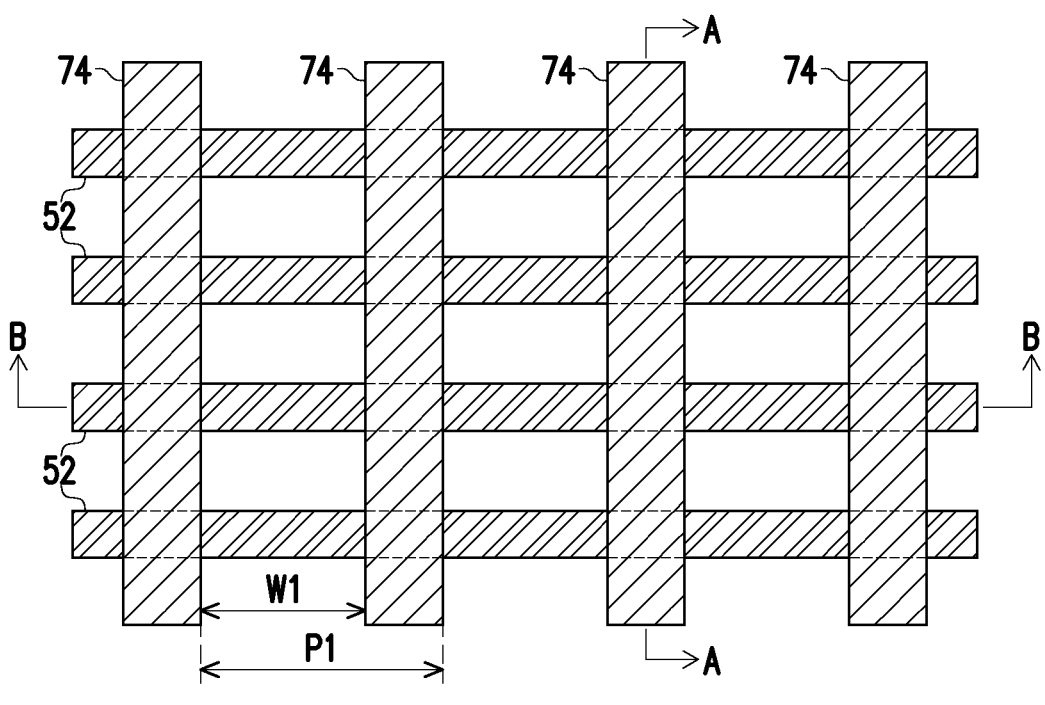

In FIGS. 8A, 8B and 8C, the mask layer 64 (see FIG. 7) may be patterned and gate seal spacers 80 may be formed, in accordance with some embodiments. FIG. 8A illustrates a cross-sectional view along reference cross-section A-A, and FIG. 8B illustrates a cross-sectional view along reference cross-section B-B. FIG. 8C illustrates a plan view, though some features are not shown for clarity reasons. The mask layer 64 may be pattered using acceptable photolithography and etching techniques to form masks 74. The pattern of the masks 74 may be transferred to the dummy gate layer 62 to form dummy gates 72. A dummy gate 72 and its overlying mask 74 may be collectively referred to herein as a "dummy gate stack." In some embodiments (not illustrated), the pattern of the masks 74 may also be transferred to the dummy dielectric layer 60 by an acceptable etching technique. One or more of the dummy gates 72 may cover respective channel regions 58 of the fins 52 or respective conductive channels 59 of the fins 52. The pattern of the masks 74 may be used to physically separate each of the dummy gates 72 from adjacent dummy gates 72. The dummy gates 72 may also have a lengthwise direction substantially perpendicular to the lengthwise direction of respective epitaxial fins 52. In some embodiments, adjacent dummy gate stacks may be separated by a distance W1 that is in the range of about 3 nm to about 1000 nm. The dummy gate stacks may be formed having a pitch P1 that is in the range of about 16 nm to about 1500 nm. Other distances are possible.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, the like, or a combination thereof.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in the range of about $10^{15}$ $cm^{-3}$ to about $10^{19}$ $cm^{-3}$. An anneal may be used to repair implant damage and to activate the implanted impurities. In some embodiments, a region 50N/50P may have both n-type and p-type implants. In some embodiments, the LDD implants may be implanted as part of the formation of the conductive channel 59.

Figure 9A:
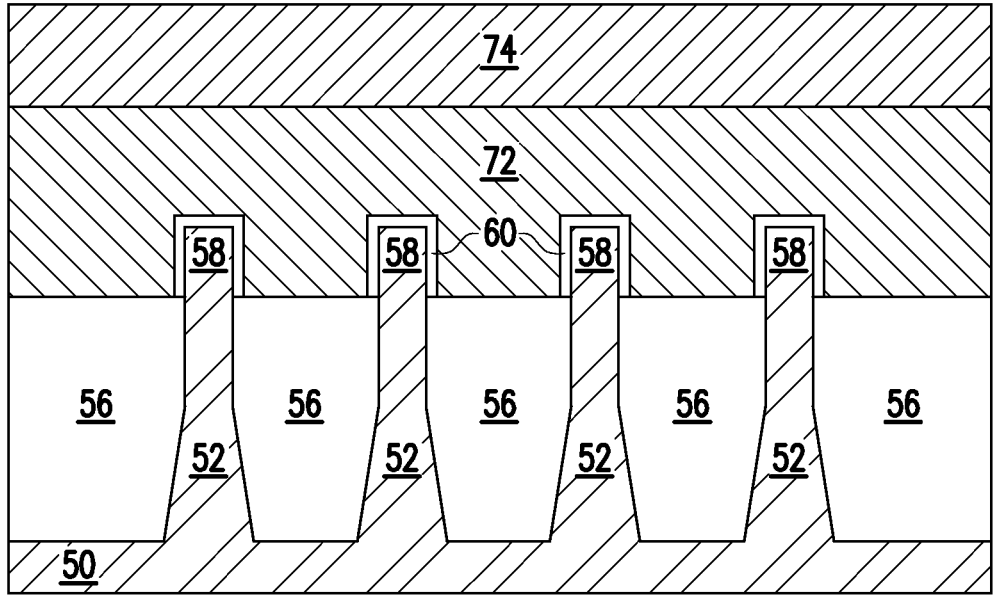
Figure 9B:
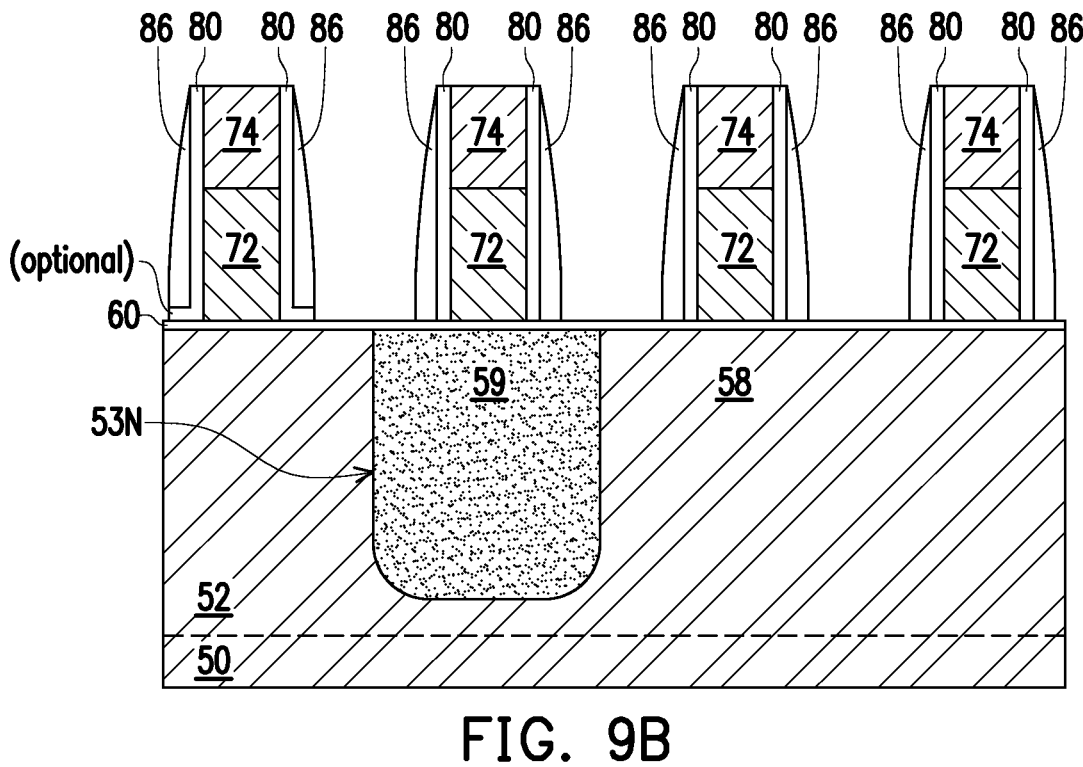

In FIGS. 9A and 9B, gate spacers 86 are formed on the gate seal spacers 80 along sidewalls of the dummy gates 72 and the masks 74, in accordance with some embodiments. The gate spacers 86 may be formed by conformally depositing an insulating material and subsequently anisotropically etching the insulating material. The insulating material of the gate spacers 86 may comprise silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, such as provided for illustration purposes with the leftmost gate seal spacers 80 of FIG. 9B), spacers may be formed and removed, and/or the like. Furthermore, the n-type and p-type devices may be formed using different structures and steps. For example, LDD regions for n-type devices may be formed prior to forming the gate seal spacers 80 while the LDD regions for p-type devices may be formed after forming the gate seal spacers 80.

Figure 10A:
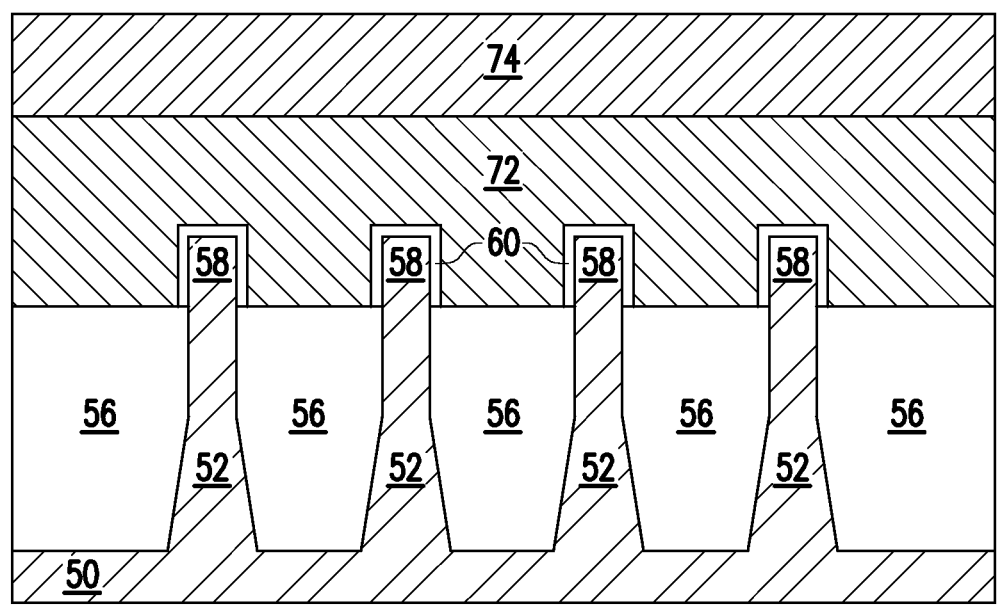
Figure 10B:
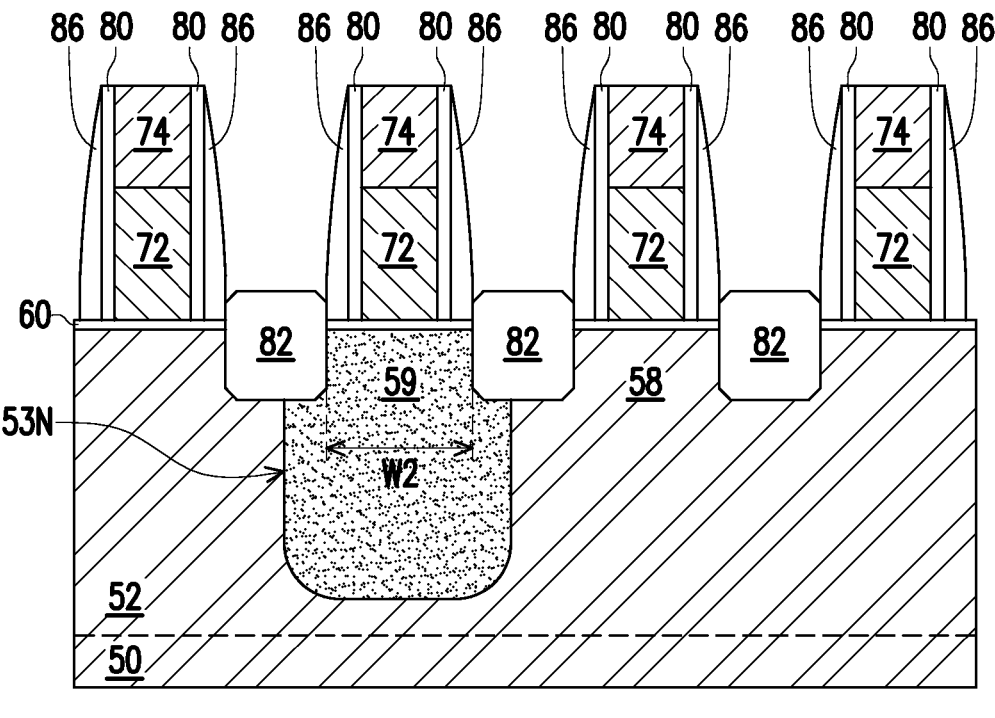
Figure 10C:
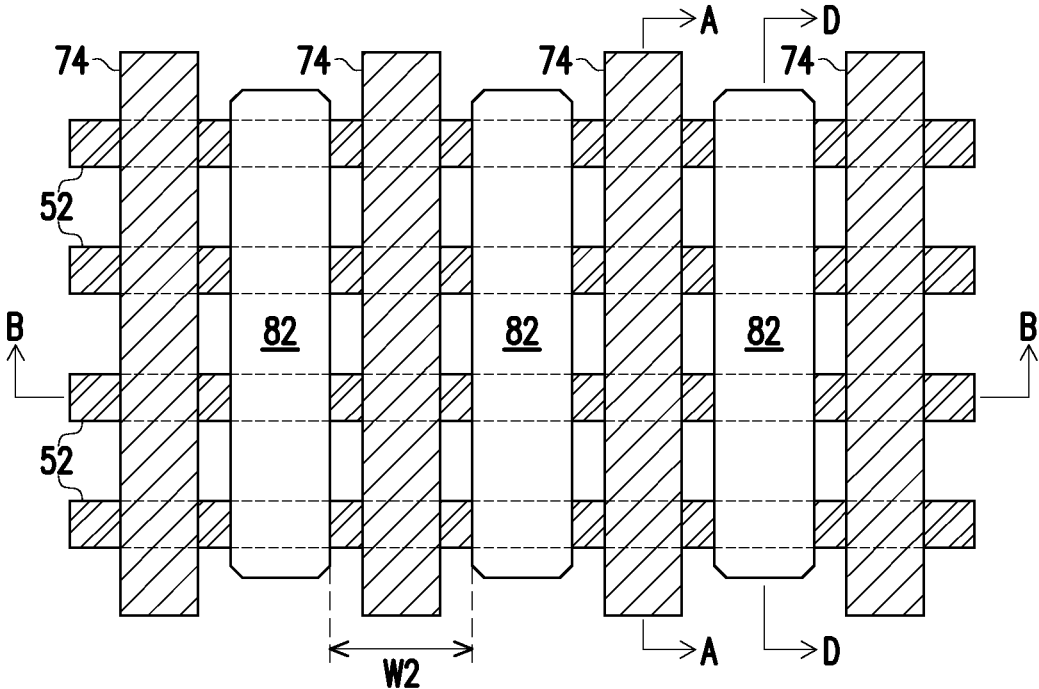
Figure 10D:
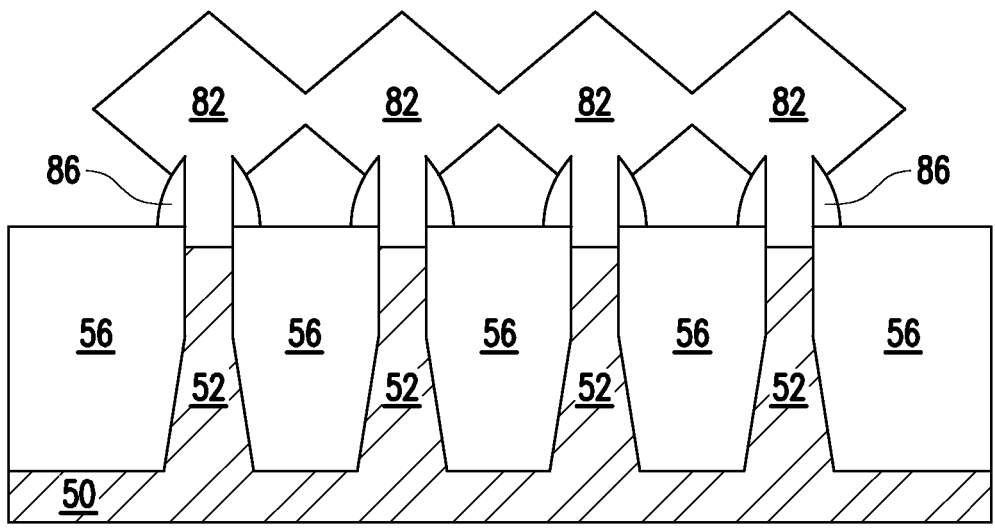
Figure 10E:
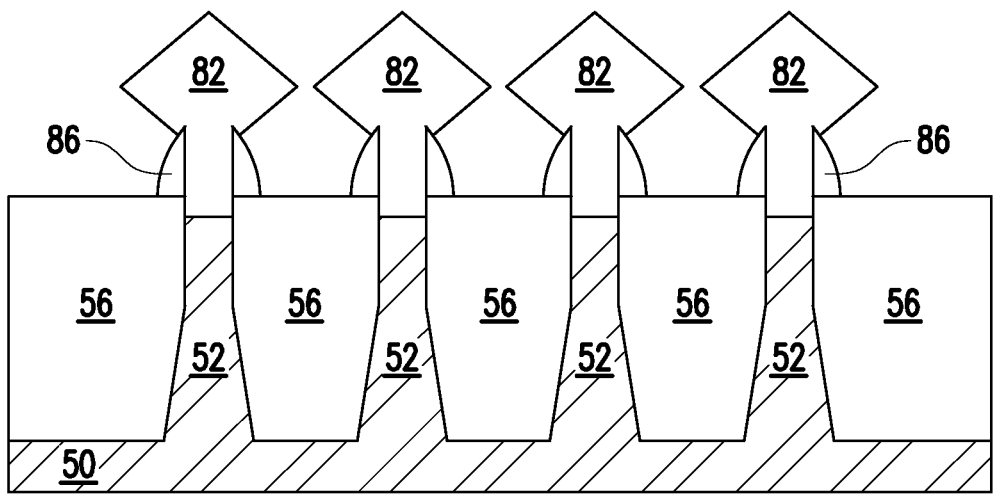

In FIGS. 10A, 10B, 10C, 10D, and 10E, epitaxial regions 82 are formed in the fins 52, in accordance with some embodiments. FIG. 10A illustrates a cross-sectional view along reference cross-section A-A, and FIG. 10B illustrates a cross-sectional view along reference cross-section B-B. Figure illustrates a plan view, though some features are not shown for clarity reasons. FIGS. 10D and 10E are illustrated along reference cross-section D-D. The epitaxial regions 82 are formed in the fins 52 such that each dummy gate 72 is disposed between respective neighboring pairs of the epitaxial regions 82. In some embodiments the epitaxial regions 82 may extend into, and may also penetrate through, the fins 52. In some embodiments, the gate spacers 86 are used to separate the epitaxial regions 82 from the dummy gates 72 by an appropriate lateral distance so that the epitaxial regions 82 do not short out subsequently formed gates of the resulting FinFETs. A material of the epitaxial regions 82 may be selected to exert stress in the respective channel regions 58, thereby improving performance.

The epitaxial regions 82 in the n-type region 50N may be formed by masking the p-type region and etching source/drain regions of the fins 52 in the n-type region 50N to form recesses in the fins 52. Then, the epitaxial regions 82 in the n-type region 50N are epitaxially grown in the recesses. The epitaxial regions 82 may include any acceptable material, such as appropriate for n-type FinFETs. For example, if the fin 52 is silicon, the epitaxial regions 82 in the n-type region 50N may include materials exerting a tensile strain in the channel region 58, such as silicon, silicon carbide, phosphorous-doped silicon carbide, silicon phosphide, the like, or a combination thereof. The epitaxial regions 82 in the n-type region 50N may have surfaces raised from respective surfaces of the fins 52 and may have facets.

The epitaxial regions 82 in the p-type region 50P may be formed by masking the n-type region and etching source/drain regions of the fins 52 in the p-type region 50P to form recesses in the fins 52. Then, the epitaxial regions 82 in the p-type region 50P are epitaxially grown in the recesses. The epitaxial regions 82 may include any acceptable material, such as appropriate for p-type FinFETs. For example, if the fin 52 is silicon, the epitaxial regions 82 in the p-type region 50P may comprise materials exerting a compressive strain in the channel region 58, such as silicon germanium, boron-doped silicon germanium, germanium, germanium tin, the like, or a combination thereof. The epitaxial regions 82 in the p-type region may have surfaces raised from respective surfaces of the fins 52 and may have facets.

The epitaxial regions 82 and/or the fins 52 may be implanted with dopants to form source/drain regions, similar to the process previously discussed for forming lightly-doped source/drain regions, followed by an anneal. The source/drain regions may have an impurity concentration in the range of about $10^{19}$ $cm^{-3}$ to about $10^{21}$ $cm^{-3}$. The n-type and/or p-type impurities for source/drain regions may be any of the impurities previously discussed. In some embodiments, the epitaxial regions 82 may be in situ doped during growth.

As a result of the epitaxy processes used to form the epitaxial regions 82 in the n-type region and the p-type region 50P, upper surfaces of the epitaxial regions have facets which expand laterally outward beyond sidewalls of the fins 52. In some embodiments, these facets cause adjacent epitaxial regions 82 to merge, as illustrated by FIGS. 10C and 10D. In other embodiments, adjacent epitaxial regions 82 remain separated after the epitaxy process is completed, as illustrated by FIG. 10E. In the embodiments illustrated in FIGS. 10D and 10E, gate spacers 86 are formed covering a portion of the sidewalls of the fins 52 that extend above the STI regions 56, thereby blocking the epitaxial growth. In some other embodiments, the spacer etch used to form the gate spacers 86 may be adjusted to remove the spacer material to allow the epitaxially grown region to extend to the surface of the STI region 56.

Figures 11A, 11B:
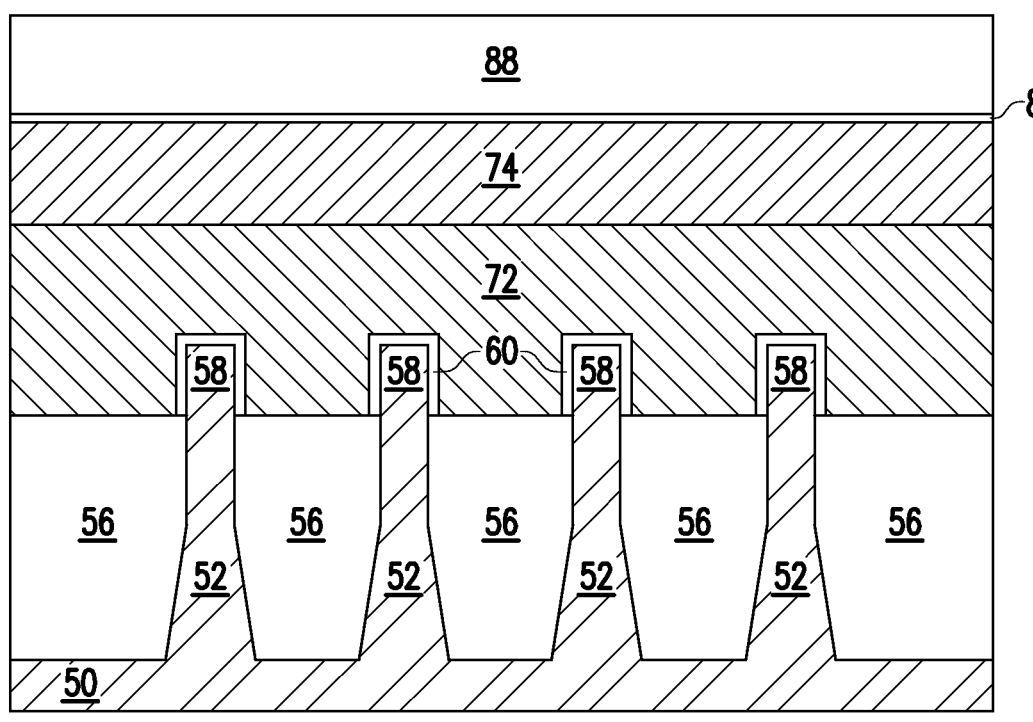

In FIGS. 11A and 11B, a first interlayer dielectric (ILD) 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), the like, or a combination thereof. Other insulation materials formed by any acceptable process may be used. In some embodiments, a contact etch stop layer (CESL) 87 is disposed between the first ILD 88 and the epitaxial regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figure 12A:
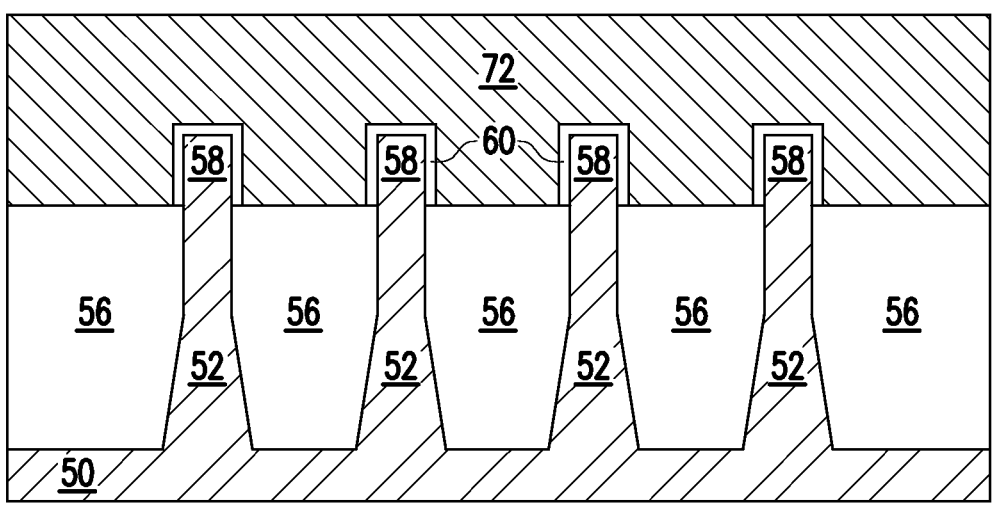
Figure 12B:
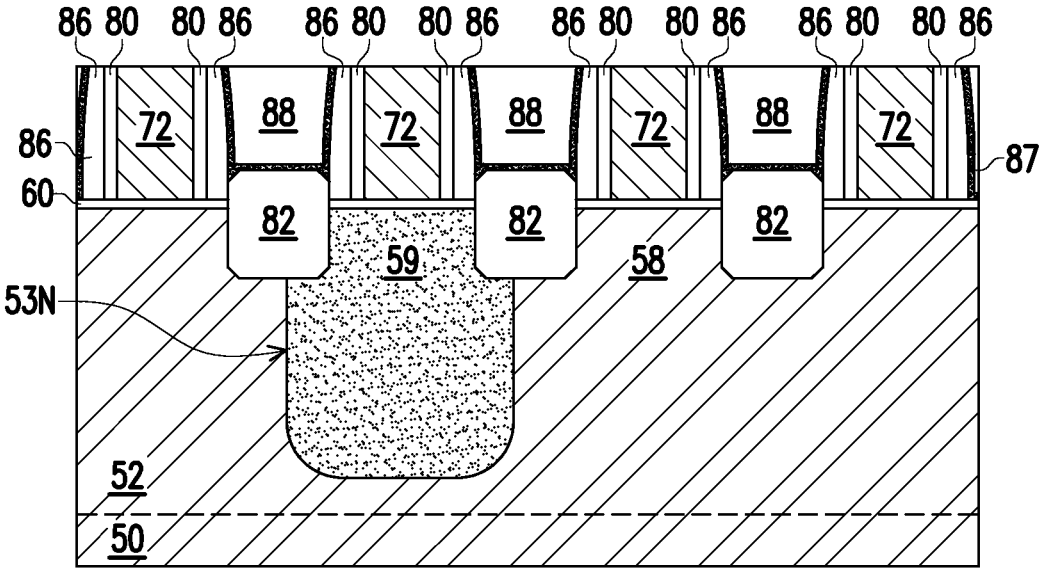

In FIGS. 12A and 12B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the masks 74.

Figure 13A:
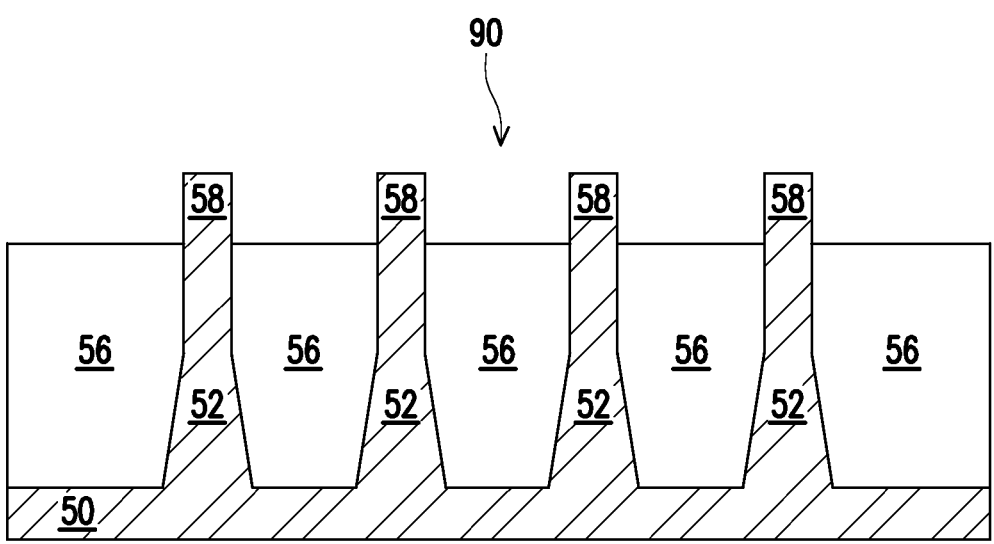
Figure 13B:
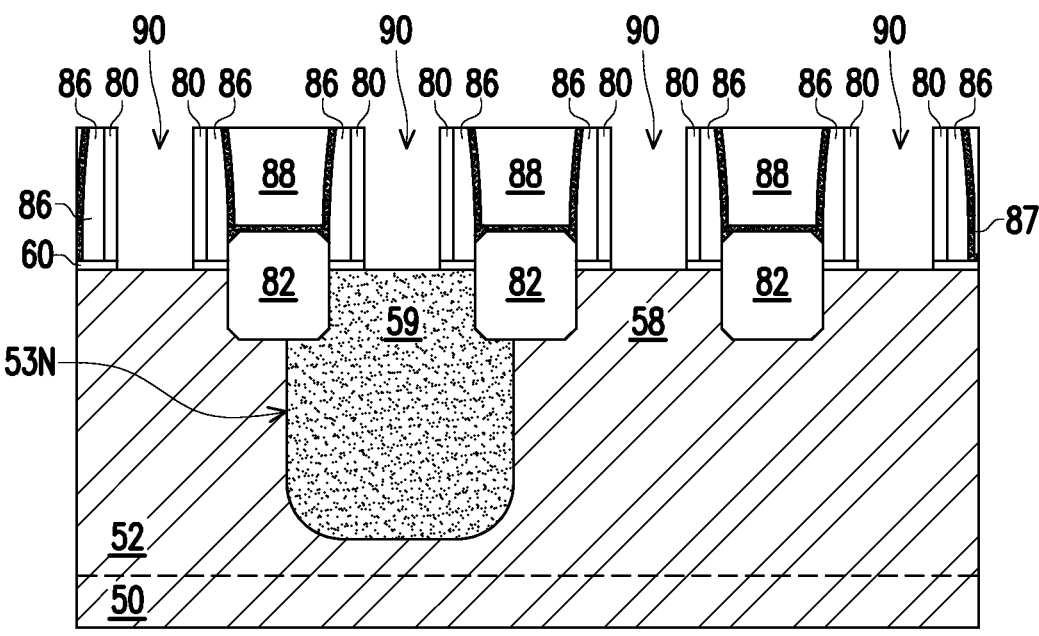

In FIGS. 13A and 13B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 may expose and/or overlie a channel region 58 of a respective fin 52 or a conductive channel 59 of a respective fin 52. In this manner, each channel region 58 or conductive channel 59 is disposed between neighboring pairs of the epitaxial regions 82. During the removal, the dummy dielectric layer 60 may be used as an etch stop layer when the dummy gates 72 are etched. The dummy dielectric layer 60 may then be optionally removed after the removal of the dummy gates 72.

Figure 14A:
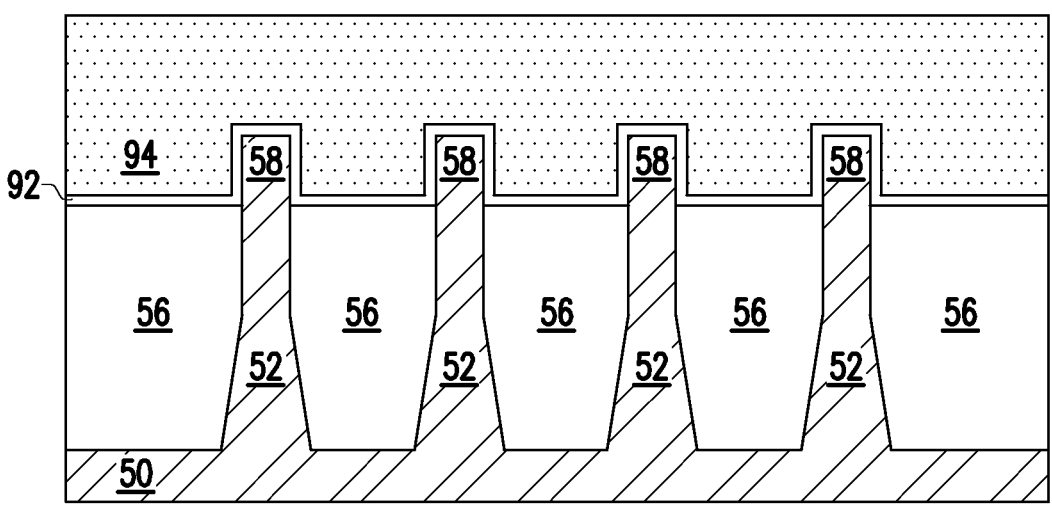
Figure 14B:
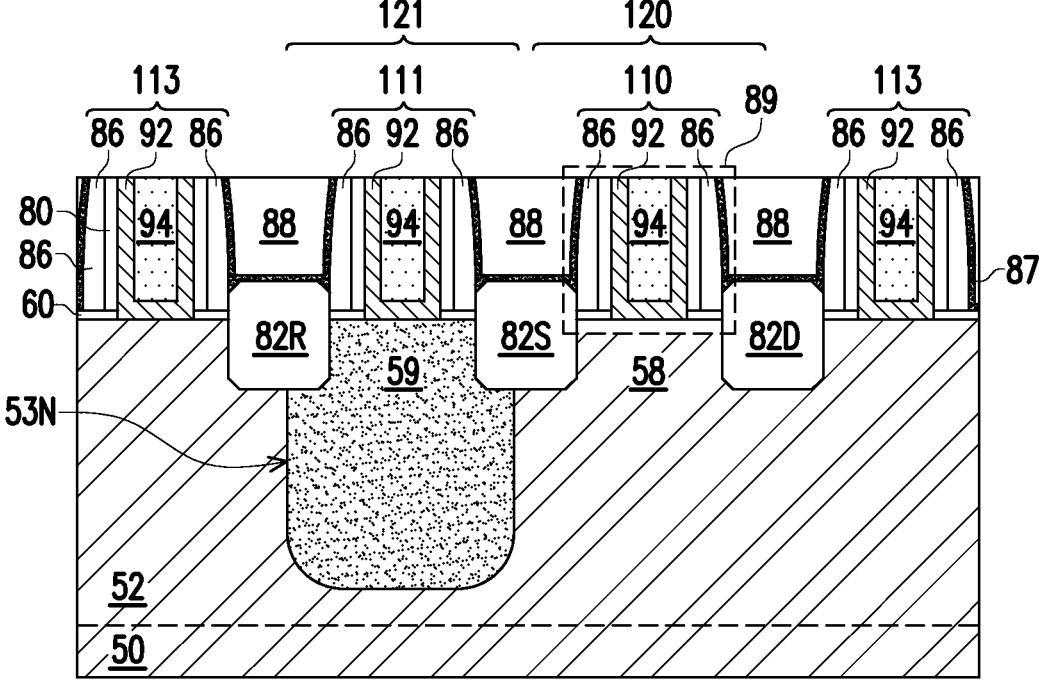
Figures 14C, 14D:
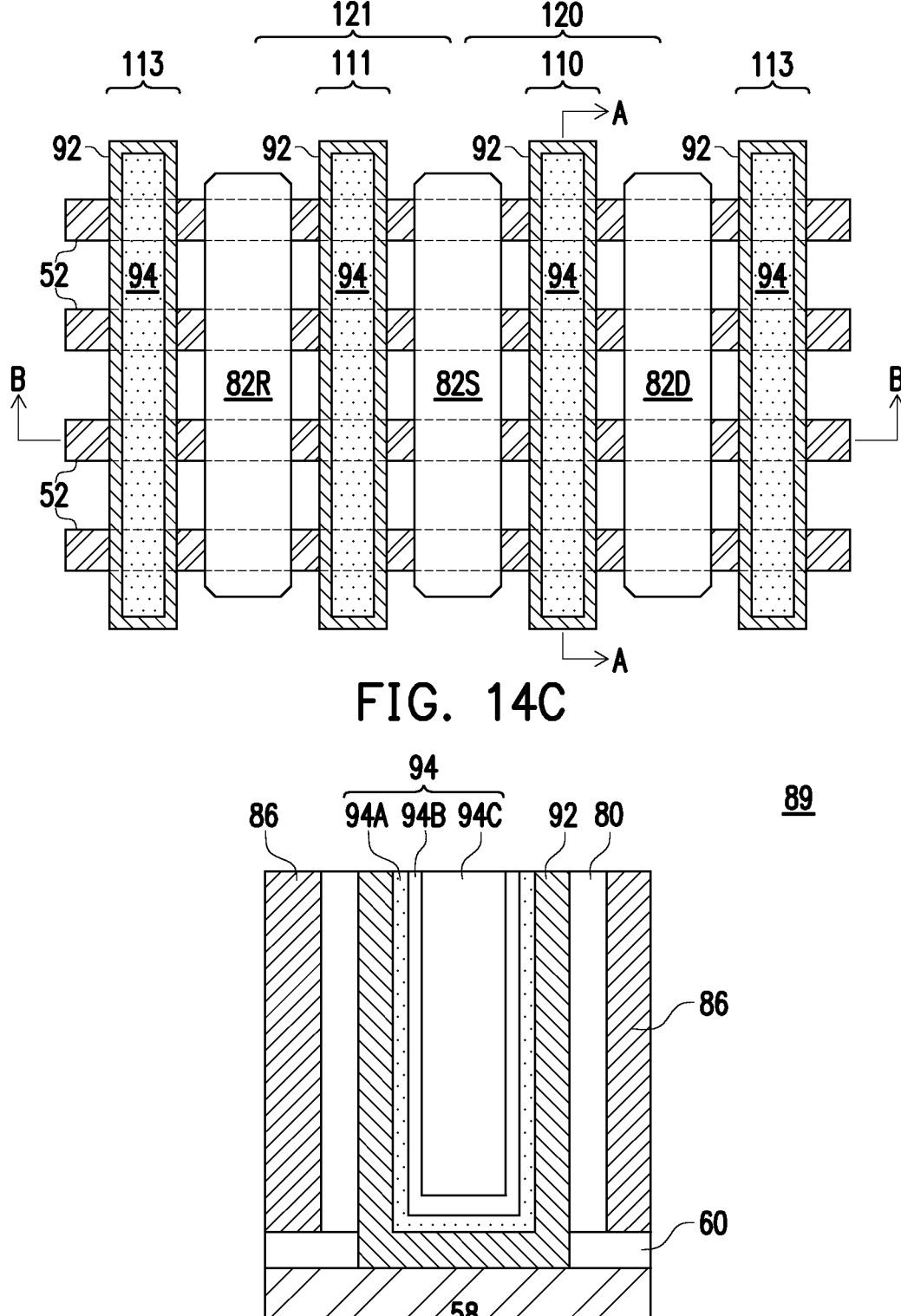

In FIGS. 14A, 14B, 14C, and 14D, gate dielectric layers 92 and gate electrodes 94 are formed in the recesses 90 to form gate structures 110 of FinFETs 120 and control structures 111 of active resistors 121, in accordance with some embodiments. FIG. 14A illustrates a cross-sectional view along reference cross-section A-A, and FIG. 14B illustrates a cross-sectional view along reference cross-section B-B. FIG. 14C illustrates a plan view, though some features are not shown for clarity reasons. FIG. 14D illustrates a detailed view of region 89 of FIG. 14B.

The gate dielectric layers 92 may comprise one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, the like, or combinations thereof. The gate dielectric layers 92 may include a dielectric layer having a k-value greater than about 7.0. The formation methods of the gate dielectric layers 92 may include Molecular-Beam Deposition (MBD), ALD, PECVD, or the like. In embodiments where portions of the dummy dielectric layer 60 remains in the recesses 90, the gate dielectric layers 92 include a material of the dummy dielectric layer 60 (e.g., silicon oxide).

The gate electrodes 94 are deposited over the gate dielectric layers 92, respectively and fill the remaining portions of the recesses 90. The gate electrodes 94 may include a metal-containing material such as titanium nitride, titanium oxide, tantalum nitride, tantalum carbide, cobalt, ruthenium, aluminum, tungsten, the like, combinations thereof, or multi-layers thereof. For example, although a single layer gate electrode 94 is illustrated in FIG. 14B, the gate electrode 94 may comprise any number of liner layers 94A, any number of work-function tuning layers 94B, and a fill material 94C, as illustrated by FIG. 14D After filling the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement structures of the resulting devices, such as gate structures 110 or control structures 111, described in greater detail below.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

The gate dielectric layers 92 and the gate electrodes 94 formed over a channel region 58 of a fin 52 may form a gate structure 110 of a FinFET 120, in some embodiments. The gate electrodes 94 and the gate dielectric layers 92 over a channel region 58 are collectively referred to as a gate structure 110 herein, but may also be referred to as a "replacement gate," a "gate stack," or the like. The gate structure 110 may extend along sidewalls of the corresponding channel region 58. The channel region 58 of a FinFET 120 may extend under the gate structure 110 and be disposed between neighboring epitaxial regions 82 comprising the source/drain regions of the FinFET 120. For example, as shown in FIG. 14B, the channel region 58 may be disposed between an epitaxial source region 82S and an epitaxial drain region 82D. A gate structure 110 may extend over one fin 52 or over multiple fins 52, and accordingly, a FinFET 120 may have a single fin 52 or multiple fins 52.

In some embodiments, the gate dielectric layers 92 and the gate electrodes 94 formed over a conductive channel 59 of a fin 52 may form a control structure 111 of an active resistor 121 (described in greater detail below for FIGS. 15A-15C). The gate electrodes 94 and the gate dielectric layers 92 over a conductive channel 59 are collectively referred to as a control structure 111 herein, but may also be referred to as a "control terminal," a "resistor control gate," or the like. The control structure 111 may extend along sidewalls of the corresponding conductive channel 59. The conductive channel 59 of an active resistor 121 may extend under the control structure 111 and be disposed between neighboring epitaxial regions 82 of the active resistor 121. In some embodiments, one of the neighboring epitaxial regions 82 of an active resistor 121 is also a source/drain region of an adjacent FinFET 120. For example, as shown in FIG. 14B, the conductive channel 59 may be disposed between an epitaxial source region 82S and an epitaxial resistor region 82R. In some embodiments, one of the neighboring epitaxial regions 82 of an active resistor 121 is also an epitaxial region of another adjacent active resistor 121, or is an epitaxial region of an adjacent passive resistor 123 (see FIGS. 17E-17F).

In some embodiments, some of the gate dielectric layers 92 and the gate electrodes 94 formed over a fin 52 may be dummy gate structures 113. In some cases, the dummy gate structures 113 are not a functional part of an active or passive device, and may be electrically isolated from other structures. In some cases, the dummy gate structures 113 are formed adjacent one side or opposite sides of a device such as a source-degenerated transistor device 125 (see FIGS. 15B-15C). In some embodiments, portions of dummy gate structures 113 are subsequently removed and replaced with an insulating material (see, e.g., FIGS. 20A through 23C).

Figure 15A:
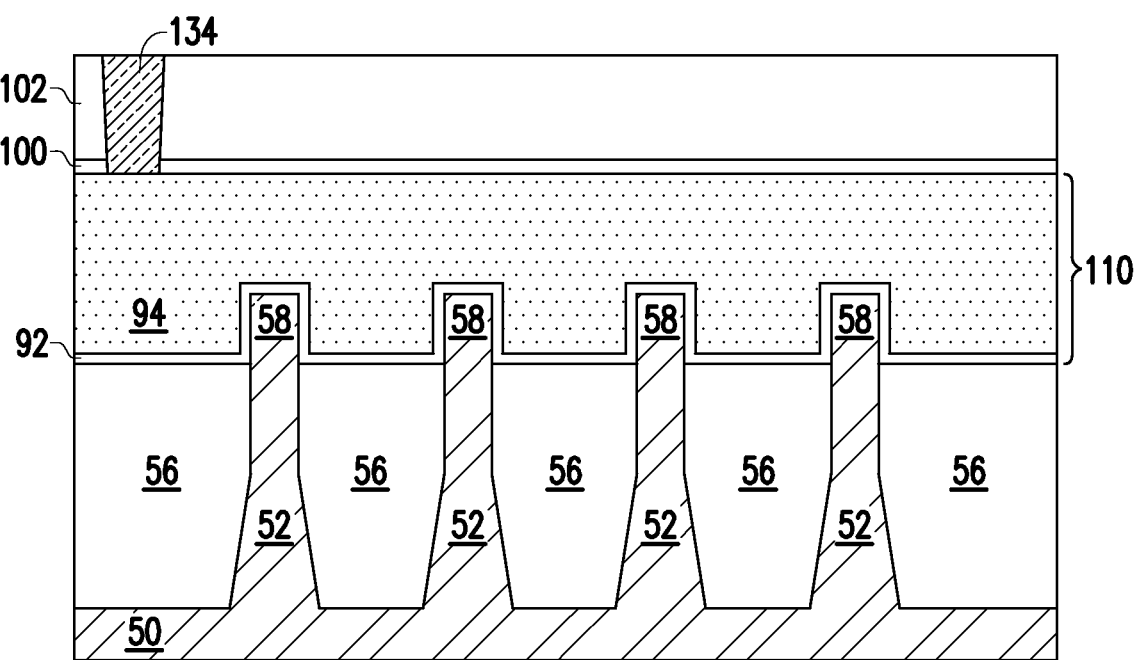
Figure 15B:
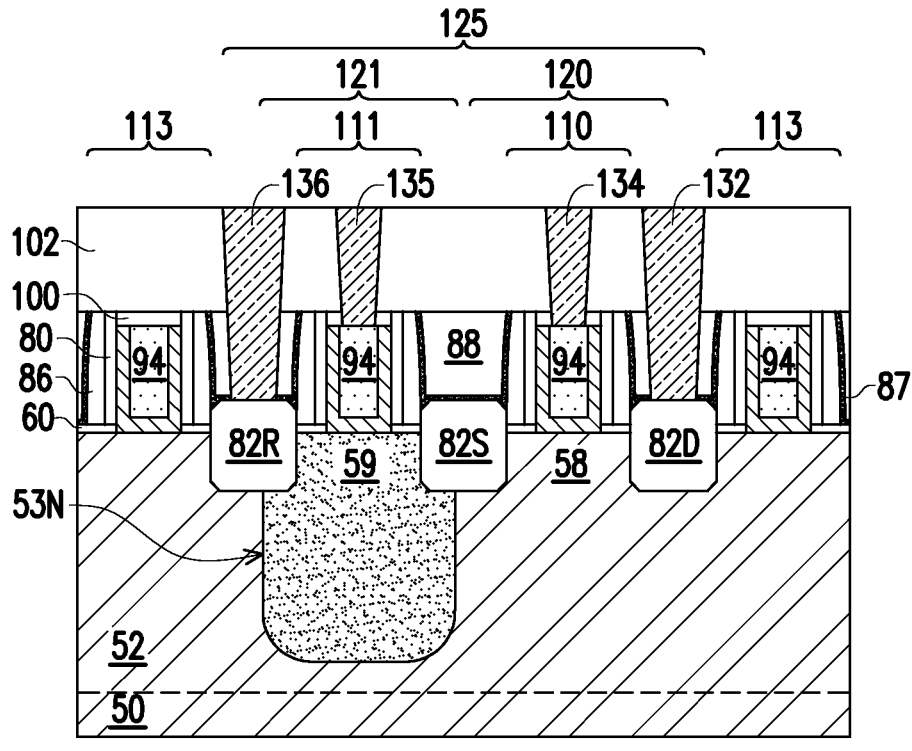
Figure 15C:
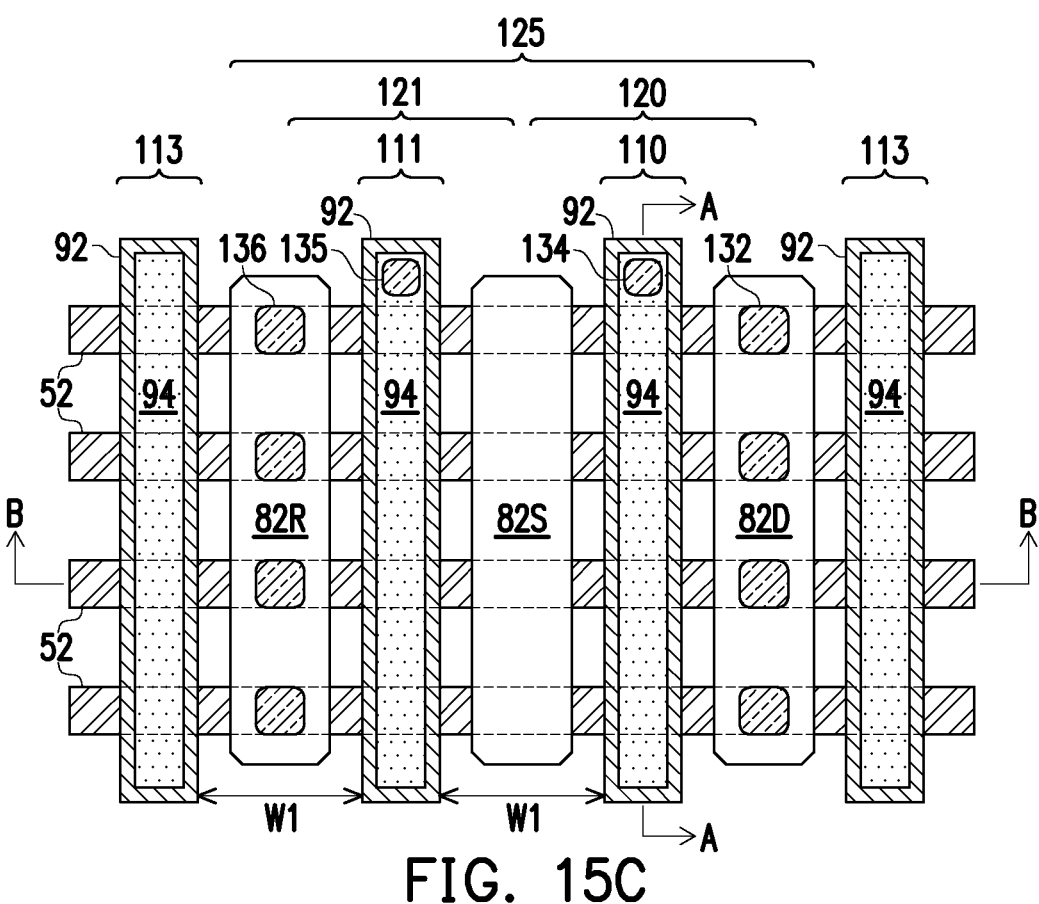
Figure 15D:
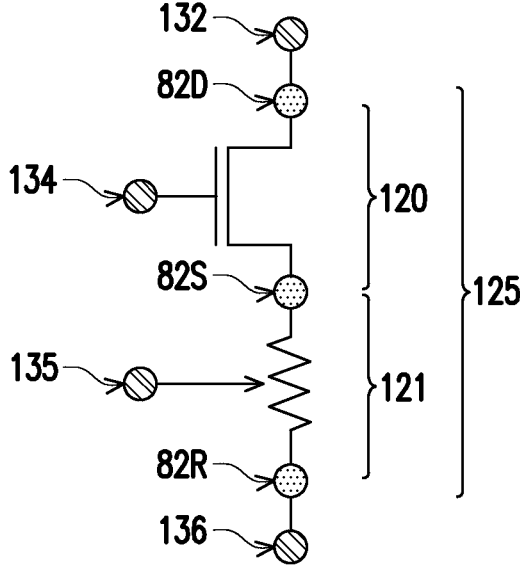
FIG. 15D is a schematic of a such a transistor device, in accordance with some embodiments.

In FIGS. 15A, 15B, 15C, and 15D various contacts are formed to epitaxial regions 82, gate structures 110, and control structures 111 to form a source-degenerated transistor (SDT) device 125, in accordance with some embodiments. FIG. 15A illustrates a cross-sectional view along reference cross-section A-A, and FIG. 15B illustrates a cross-sectional view along reference cross-section B-B. FIG. 15C illustrates a plan view, though some features are not shown for clarity reasons. FIG. 15D illustrates a simplified circuit schematic of the SDT device 125 shown in FIGS. 15A-15C.

Initially, a gate mask 100 may be formed over the gate dielectric layers 92 and corresponding gate electrodes 94. In some embodiments, forming the gate mask 100 includes recessing the gate dielectric layers 92 and gate electrodes 94 so that a recess is formed between opposing portions of respective gate spacers 86. The gate mask 100 may comprise one or more layers of dielectric material, such as silicon nitride, silicon oxynitride, or the like, is filled in the recess, followed by a planarization process to remove excess portions of the dielectric material extending over the first ILD 88, as illustrated in FIG. 15B. In other embodiments, the gate dielectric layers 92 and gate electrodes 94 are not recessed. In some embodiments, the gate structure 110, control structure 111, or dummy gate structure 113 may remain level with top surfaces of the first ILD 88. The gate mask 100 is optional and may be omitted in some embodiments.

As also illustrated in FIGS. 15A and 15B, a second ILD 102 is deposited over the first ILD 88. In some embodiments, the second ILD 102 is a flowable film formed by a flowable CVD method. In some embodiments, the second ILD 102 is formed of a dielectric material such as PSG, BSG, BPSG, USG, or the like, and may be deposited by any suitable method, such as CVD and PECVD.

Contacts such as gate contacts 134, control contacts 135, and epitaxial region contacts 132/136 (which may also be referred to in brief as contacts 134, contacts 135, contacts 132, and contacts 136, respectively) may then be formed through the second ILD 102 and the first ILD 88, in accordance with some embodiments. For example, openings for the epitaxial region contacts 132/136 may be formed through the first ILD 88, the second ILD 102, and the gate mask 100 (if present). Openings for the gate contacts 134 and control contacts 135 may be formed through the second ILD 102 and the gate mask 100 (if present). The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, the like, or a combination thereof. A planarization process, such as a CMP, may be performed to remove excess material from a surface of the second ILD 102. The remaining liner and conductive material form the gate contacts 134, the control contacts 135, and the epitaxial region contacts 132/136 in the openings. An anneal process may be performed to form a silicide (not shown) at the interface between the epitaxial regions 82 and the epitaxial region contacts 132/136.

The epitaxial region contacts 132/136 are physically and electrically coupled to the epitaxial regions 82, the gate contacts 134 are physically and electrically coupled to the gate electrodes 94 of the gate structures 110, and the control contacts 135 are physically and electrically coupled to the gate electrodes 94 of the control structures 111. The epitaxial region contacts 132/136, the gate contacts 134, and/or the control contacts 135 may be formed in different processes, or may be formed in the same process. Although shown as being formed in the same cross-sections in FIG. 15B, it should be appreciated that each of the gate contacts 134, control contacts 135, and epitaxial region contacts 132/136 may be formed in different cross-sections, which may avoid shorting of the contacts. One or more epitaxial region contacts 132/136 may be formed on an epitaxial region 82, one or more gate contacts 134 may be formed on a gate structure 110, and one or more control contacts 135 may be formed on a control structure 111.

In this manner, a source-degenerated transistor (SDT) device 125 may be formed, in accordance with some embodiments. FIG. 15D illustrates a simplified circuit schematic of the SDT device 125 shown in FIGS. 15A-15C. The SDT device 125 shown in FIGS. 15A-15D includes an active resistor 121 electrically coupled in series with the epitaxial source region 82S of a FinFET 120. The epitaxial source region 82S of the FinFET 120 is free of contacts such that a current flowing through the FinFET 120 also flows through the active resistor 121. In other words, current flows through the SDT device 125 from the epitaxial region contact 132 to the epitaxial region contact 136 (or vice versa). In this manner, the active resistor 121 and the FinFET 120 together form a SDT device 125 that is similar to a transistor with source-degeneration, in which the active resistor 121 acts as a degeneration resistor. In the illustrated embodiment, the epitaxial region contact 136 serves as the source pick up contact for the FinFET 120, however, it is separated from the actual source region of the FinFET 120 by the active resistor 121. For all of the discussed embodiments and variations, the epitaxial region contact 136x (where x may be a, b, c, d, or empty) serves as the source pick up contact for the discussed FinFET at the far side of one or more embedded active and/or passive resistors (such as active resistor 121 or passive resistor 123 (discussed below)).

In some embodiments, current in the active resistor 121 is conducted from the epitaxial source region 82S to the epitaxial resistor region 82R (or vice versa) through the conductive channel 59. In this manner, an active resistor 121 may be similar to a dopant diffused resistor in some cases. In some embodiments, the degeneration resistance of the active resistor 121 can be controlled by applying a voltage to the control structure 111 of the active resistor 121. The voltage may be applied to the control structure 111 through a corresponding control contact 135. In some cases, applying a voltage to the control structure 111 may cause accumulation or depletion of the conductive channel 59 that changes the resistance of the active resistor 121. For example, applying a more positive voltage to the control structure 111 of an active resistor 121 with an n-type conductive channel 59 can decrease the resistance of the active resistor 121, and applying a more negative voltage to the control structure 111 of an active resistor 121 with an n-type conductive channel 59 can increase the resistance of the active resistor 121. In this manner, an active resistor 121 may operate similarly to a depletion-mode MOSFET in some cases. The formation of an active resistor 121 as a degeneration resistor as described herein can allow for improved device flexibility, device parameter tuning, or more efficient device operation.

In some embodiments, an active resistor 121 may provide an unbiased resistance that is in the range of about 150 ohms to about 2000 ohms, though other resistances are possible. In some embodiments, applying appropriate biasing voltages to the control structure 111 of an active resistor 121 can change the degeneration resistance of that active resistor 121 between about 5% and about 100%, though other resistances are possible.

In some embodiments, the resistance or range of resistances of an active resistor 121 may be further controlled by controlling the doping of the conductive channel 59. For example, in some cases, a conductive channel 59 with a higher doping concentration may result in the respective active resistor 121 having a smaller degeneration resistance, e.g., closer to 150 ohms, while less doping results in a higher degeneration resistance, e.g., closer to 2000 ohms, though other values are contemplated and depend on other factors such as the width of the conductive channel 59.

In some embodiments, the overall resistance of the SDT device 125 may also be adjusted by forming more or fewer epitaxial region contacts 136. For example, a smaller number of epitaxial region contacts 136 on an epitaxial resistor region 82R may have a larger overall contact resistance than a larger number of epitaxial region contacts 136. Thus, forming fewer epitaxial region contacts 136 on an SDT device 125 can increase the total resistance of the SDT device 125 due to an increase in contact resistance which is then in-series added to the degeneration resistance. In a similar manner, the overall resistance of the SDT device 125 may also be adjusted by increasing or decreasing the size(s) of the epitaxial region contact(s) 136, in particular, increasing or decreasing the contact surface area to the epitaxial region contact(s) 136. For example, utilizing smaller epitaxial region contacts 136 results in a larger overall source-side resistance and reduced noise than when using larger formed epitaxial region contacts 136. A reduced contact surface area for the contact(s) 136 causes an increase in resistance because it acts as a bottleneck for the transfer of electrons from the semiconductor based epitaxial region 82R to the metallic epitaxial region contact 136. Likewise, utilizing larger epitaxial region contacts 136 results in a smaller overall source-side resistance than when using smaller formed epitaxial region contacts 136. Therefore, because series resistors add, using both the number of contacts 136 and the size of contacts 136 in addition to the active resistor(s) 121 and/or passive resistor(s) 123 (see, e.g., FIG. 17B), the total resistance from the source epitaxial region 82S to the source pick up at the contacts 136 may be adjusted to achieve a desired resistive value.

In some embodiments, the control structure 111 of the active resistor 121 is equidistant between a neighboring gate structure 110 and a neighboring dummy gate structure 113. In some embodiments, the distance between the control structure 111 of the active resistor 121 and a neighboring gate structure 110 is approximately the distance W1. In some embodiments, the distance between the control structure 111 of the active resistor 121 and a neighboring dummy gate structure 113 is also approximately the distance W1.

Figure 15E:
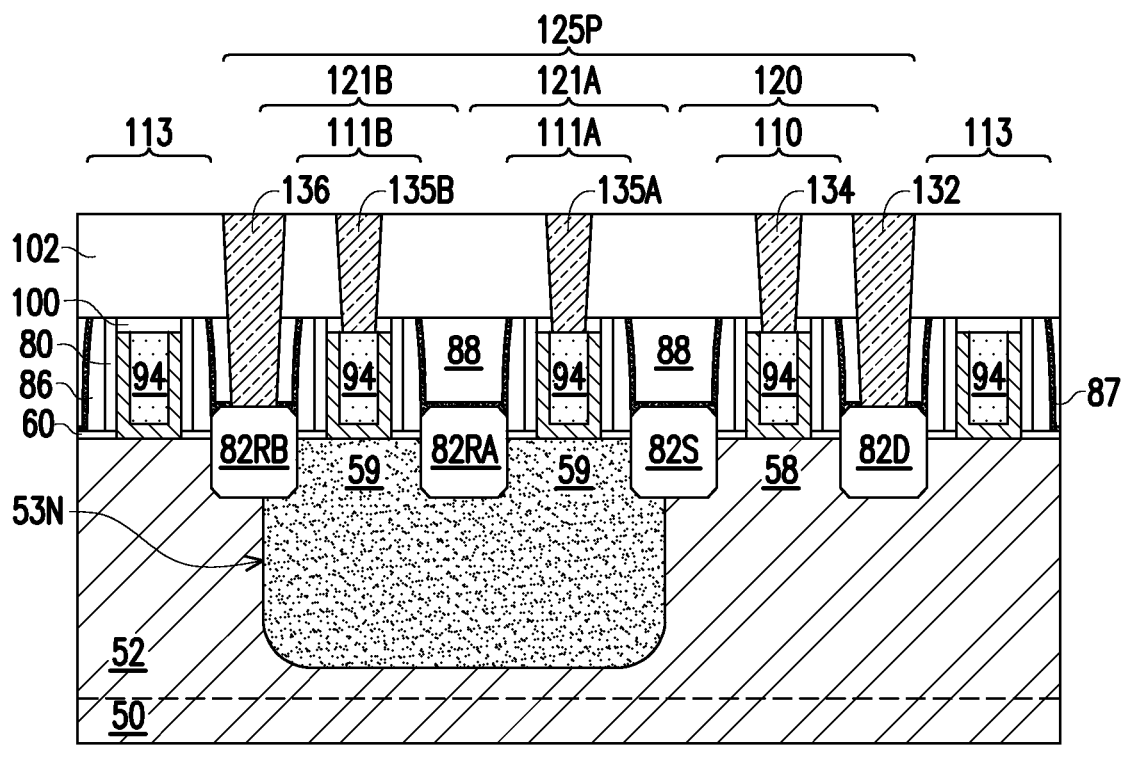
FIGS. 15E and 15F are a cross-sectional view and schematic, respectively, of a transistor device with multiple active resistors, in accordance with some embodiments.
Figure 15F:
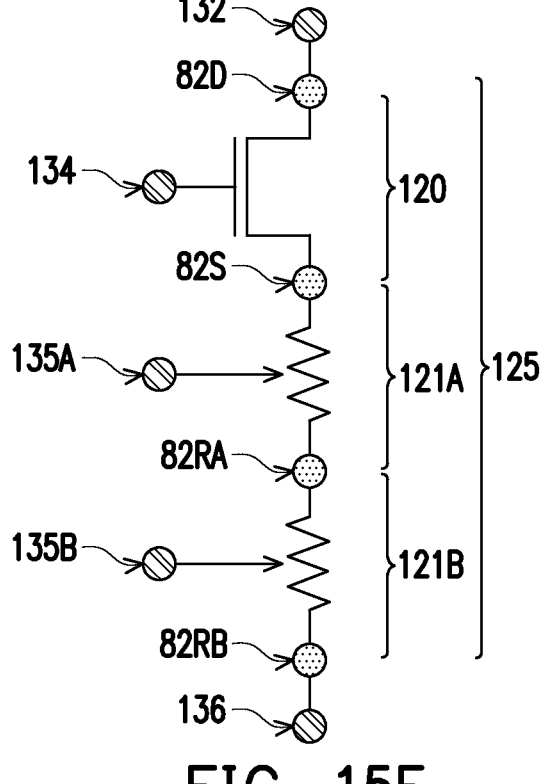

FIGS. 15A-15D show an embodiment of a SDT device 125 with a single active resistor 121, but in other embodiments, such as illustrated in FIGS. 15E and 15F, a SDT device 125 may have more than one active resistor 121, such as a first active resistor 121A and a second active resistor 121B. Figure illustrates a simplified circuit schematic of the SDT device 125 shown in FIG. 15E. For example, a SDT device 125 may include two or more adjacent active resistors 121A and 121B disposed between the FinFET 120 and the epitaxial region contacts 136. In this manner, two or more active resistors 121 may be connected in series to increase the degeneration resistance of the SDT device 125. The conductive channel 59 of each respective active resistor 121 may be similar or may have different doping concentrations or doping profiles. A pair of neighboring active resistors 121 may share an epitaxial region 82 (e.g., epitaxial region 82RA), and the source region contact may be picked up at an epitaxial region at the end of the series coupled active resistors (e.g., epitaxial region 82RB). The respective control structures 111 (e.g., control structures 111A and 111B) of multiple active resistors 121 (e.g., active resistors 121A and 121B, respectively) may be collectively controlled (e.g., electrically coupling by respective control contacts 135A and 135B) or may be independently controlled. In this manner, the characteristics or configuration of a SDT device 125 as described herein may be controlled to provide a desired degeneration resistance or desired range of degeneration resistances.

In some cases, forming a device comprising a transistor with source degeneration such as the SDT device 125 described herein can reduce the effects of noise and improve device operation. For example, in some cases, forming a SDT device 125 with an active resistor 121 as described herein can reduce the effects of flicker noise (e.g., 1/f noise).

Figure 16:
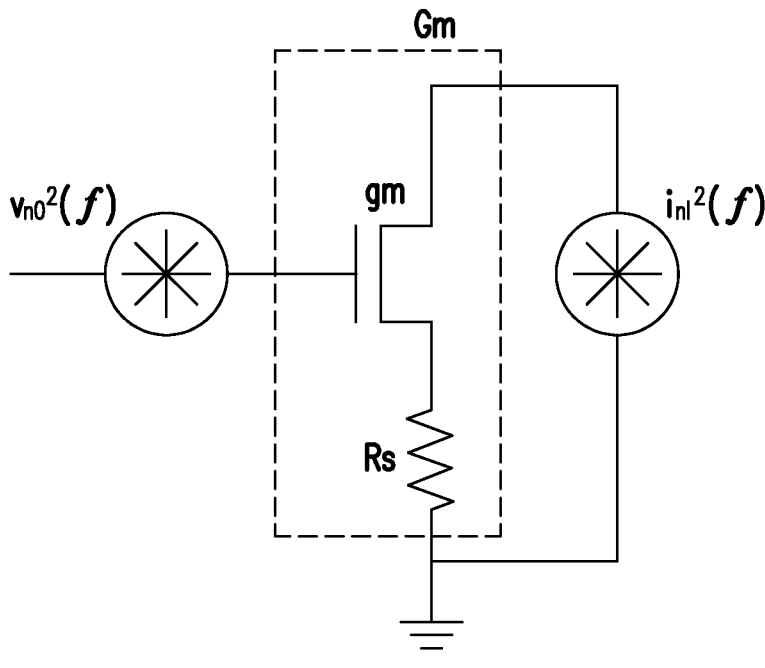
FIG. 16 is a schematic of a source-degenerated transistor, in accordance with some embodiments.

Turning to FIG. 16, a simplified schematic of a MOSFET with source degeneration is shown, and is analogous to the SDT device 125. This schematic may apply to each of the embodiments described herein. The MOSFET in FIG. 16 is analogous to the FinFET 120 in the schematic of FIG. 15D, and the source degeneration of the MOSFET is provided by a resistor Rs, which is analogous to the active resistor 121 in the schematic of FIG. 15D. The flicker noise of the MOSFET may be modeled as a voltage source $(v_{no}{}^2)$ in series with the gate of the MOSFET, which corresponds to an equivalent noise current $(i_{no}{}^{2z})$ equal to $(gm^2 \, v_{no}{}^2)$, where gm is the transconductance of the MOSFET. However, the transconductance Gm of the MOSFET with source degeneration resistor Rs is equal to $(gm/(1+gm \, Rs))$. Thus, the equivalent noise current $(i_{n1}{}^2)$ of the MOSFET with source degeneration is equal to $(gm^2 \, ve_{no}{}^2/(1+gm \, Rs)^2)$, or $(i_{no}{}^2/(1+gm \, Rs)^2))$. In other words, the presence of the source degeneration resistor Rs effectively reduces the magnitude of the MOSFET's flicker noise, with a larger resistance of Rs resulting in a smaller noise magnitude. Similarly, the presence of the active resistor 121 in the SDT device 125 can effectively reduce the magnitude of the flicker noise of the FinFET 120. In this manner, the use of the SDT device 125 can reduce the effects of noise and improve device performance. In some embodiments, the value Rs can be determined by multiple series connected active resistors and/or passive resistors.

Figure 17A:
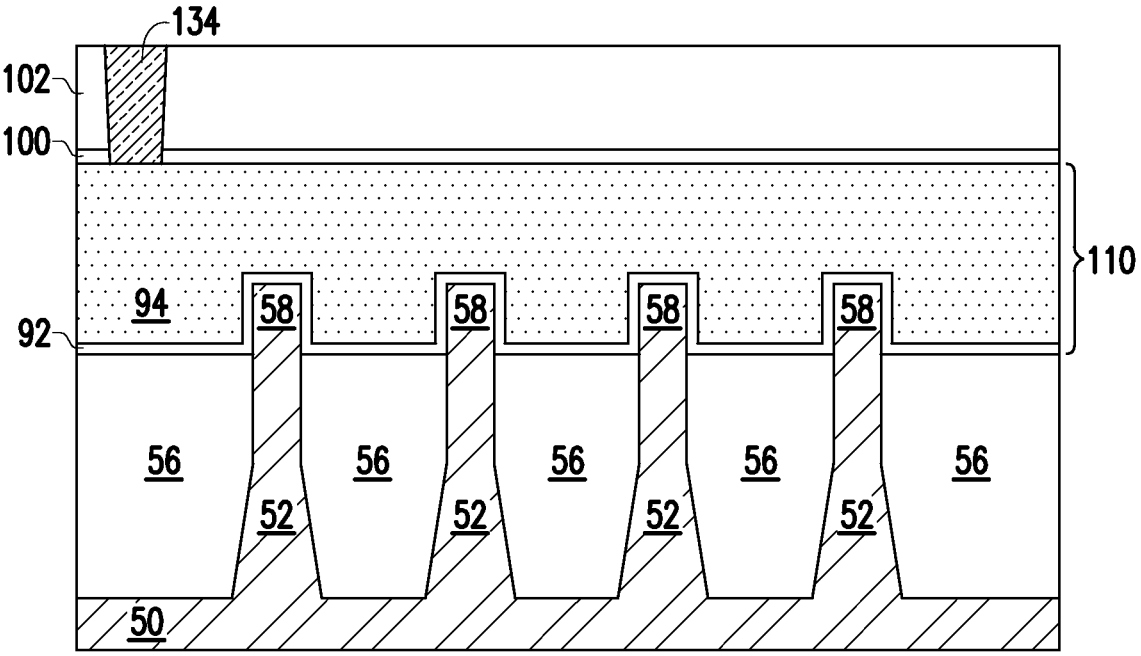
FIGS. 17A, 17B, and 17C are various views of an intermediate stage in the manufacturing of a transistor device with a passive resistor, in accordance with some embodiments.
Figure 17B:
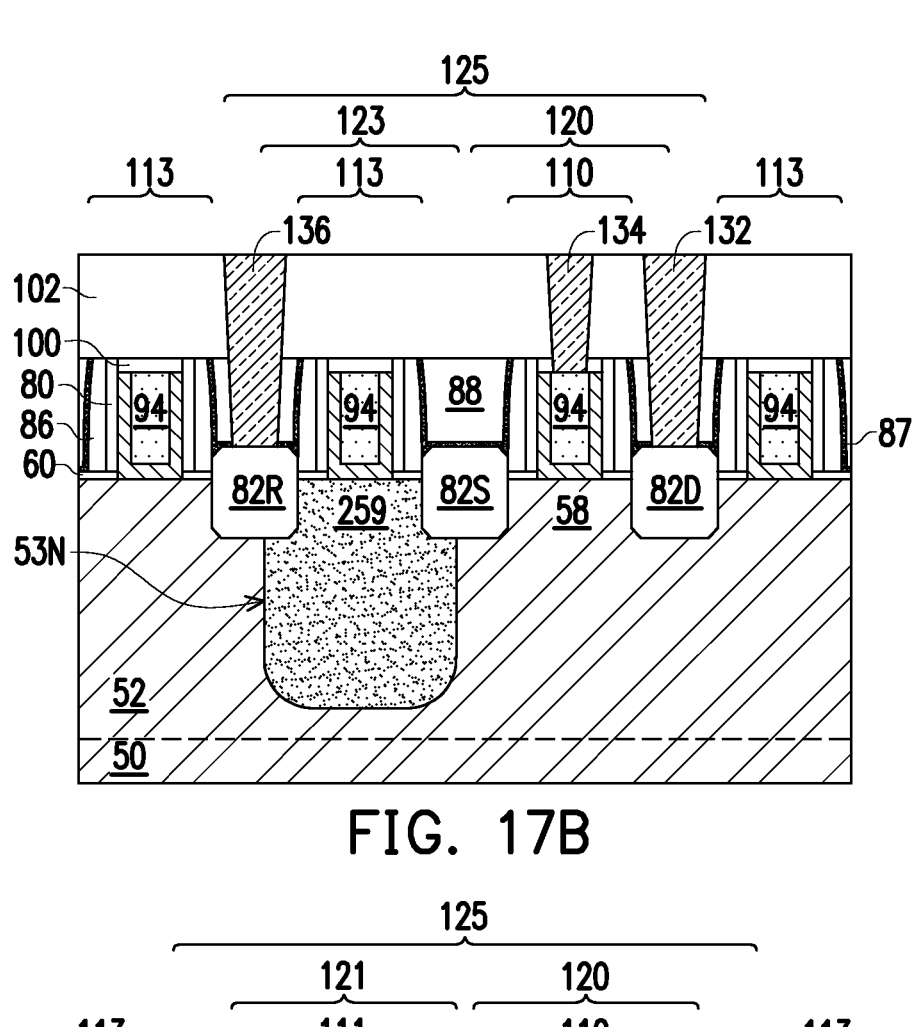
Figure 17C:
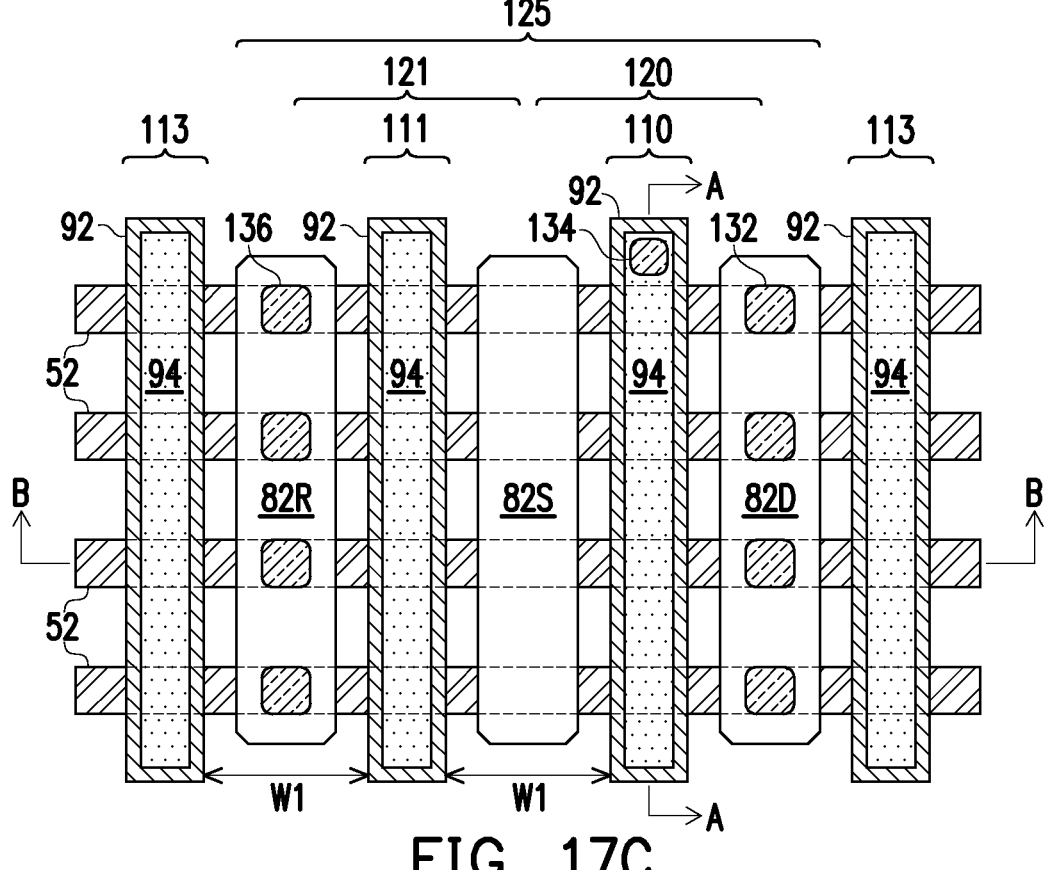
Figure 17D:
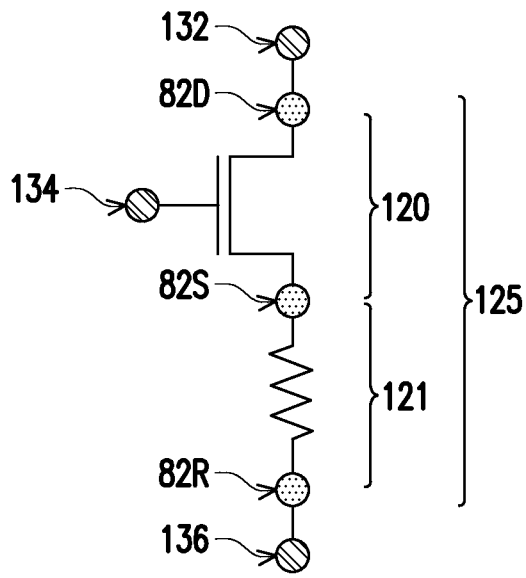
FIG. 17D is a schematic of such a transistor device, in accordance with some embodiments.
Figure 17E:
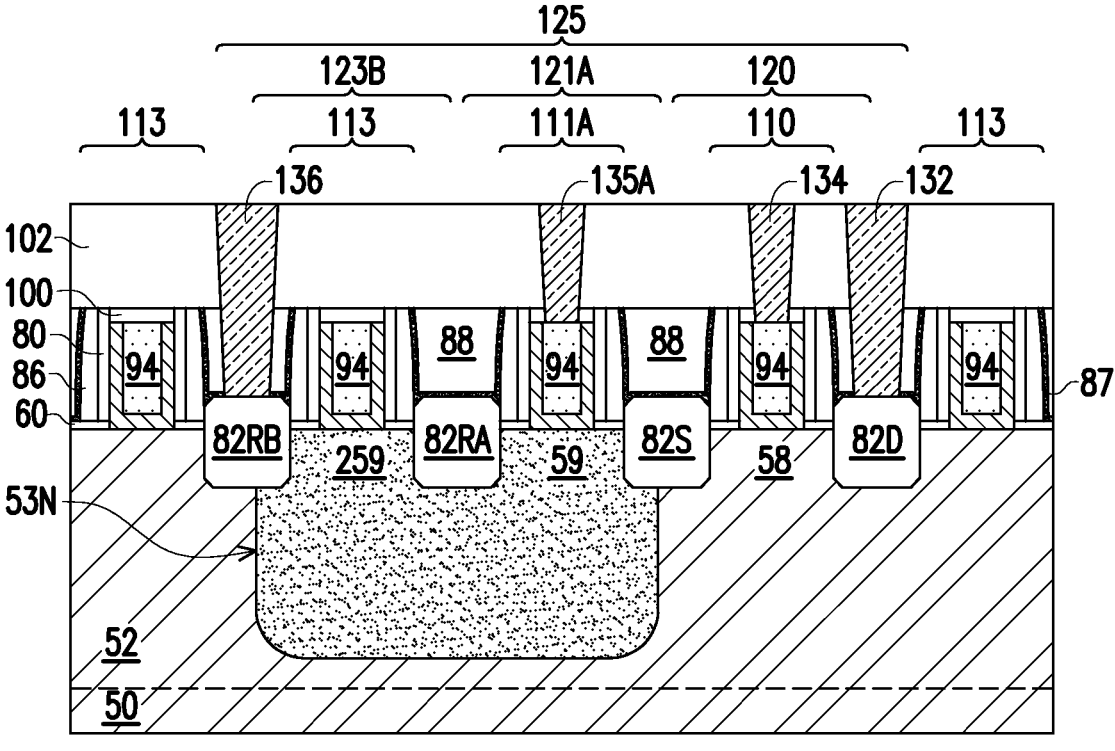
FIGS. 17E and 17F; 17G and 17H; and 17I and 17J are each pairs of a cross-sectional view and schematic of a transistor device with various configurations of multiples of passive resistors and/or active resistors, in accordance with some embodiments.
Figure 17F:
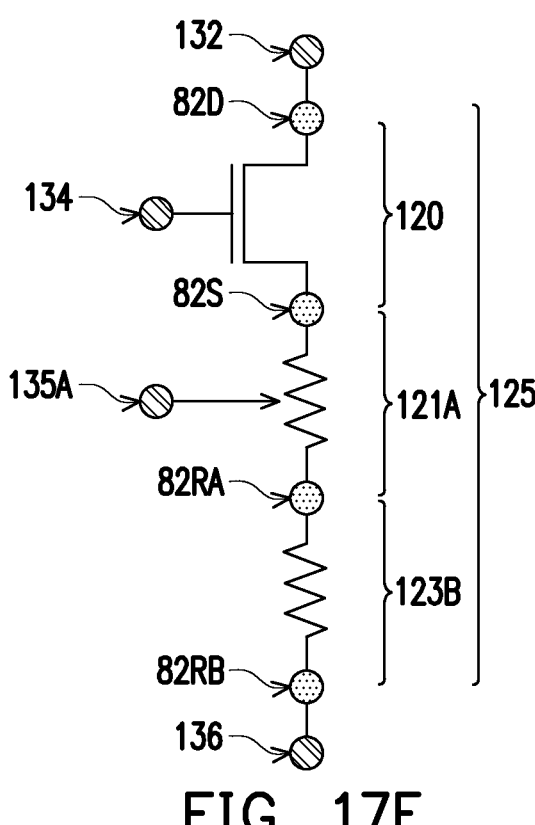
Figure 17G:
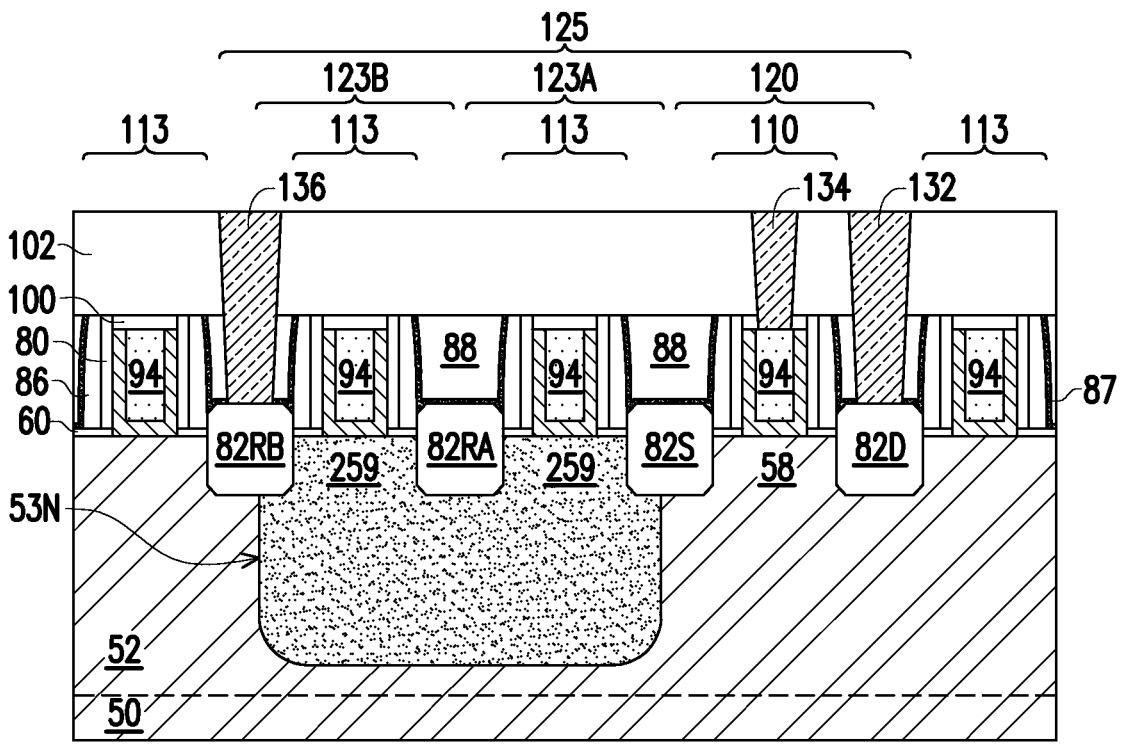

FIGS. 17A through 17J include cross-sectional views and plan views of intermediate stages in the manufacturing of FinFETs, in accordance with some embodiments. Simplified circuit diagrams are also included. FIG. 17A is illustrated along reference cross-section A-A illustrated in FIG. 1, except for multiple fins/FinFETs, and applies to the other device variations discussed in relation to FIGS. 17A through 17J. FIGS. 17B, 17E, and 17G are illustrated along reference cross-section B-B illustrated in FIG. 1, except for multiple fins/FinFETs. FIG. 17C is a plan view.

In FIGS. 17A, 17B, 17C, and 17D the SDT device 125 includes a passive resistor 112 that provides degeneration resistance, in accordance with some embodiments. FIG. 17D illustrates a simplified circuit schematic of the SDT device 125 shown in FIGS. 17A-17C. The SDT device 125 shown in FIGS. 17A-17D is similar to the SDT device 125 shown in FIGS. 15A-15D, except that a passive resistor 123 is formed in the fins 52 instead of the active resistor 121. The passive resistor 123 may be similar to an active resistor 121 as described above, except that the resistance of the passive resistor 123 is substantially fixed and is not controlled by applying a control voltage.

The passive resistor 123 may be formed using a process similar to that described for an active resistor 121, except that control contacts 135 are not formed for the passive resistor 123. In this manner, the gate electrode 94 and the gate dielectric layer 92 over a passive resistor 123 may form a dummy gate structure 113. As shown in FIG. 17B, a passive resistor 123 may comprise a conductive channel 259 in a fin 52 that is disposed between neighboring epitaxial regions 82 of the passive resistor 123 (e.g. epitaxial resistor regions 82S and 82R in FIGS. 17B-17D). In some embodiments, one of the neighboring epitaxial regions 82 of a passive resistor 123 is also an epitaxial region 82 of an adjacent active resistor 121 (e.g. epitaxial resistor region 82RA in FIGS. 17E and 17F), an adjacent FinFET 120, or another passive resistor 123 (e.g., epitaxial resistor region 82RA in FIG. 17H). A passive resistor 123 may be similar to an active resistor 121 as described herein, except that the resistance of the passive resistor 123 is substantially fixed and is not controlled by applying a control voltage. In some embodiments, a passive resistor 123 may provide a resistance that is in the range of about 150 ohms to about 2000 ohms, though other resistances are possible. In some embodiments, the distance between the dummy gate structure 113 over the passive resistor 123 and a neighboring control structure 111 is approximately the distance W1 (see FIGS. 8B-8C).

The SDT device 125 shown in FIGS. 17A-17D is an example, and SDT devices having other configurations of active resistors 121 or passive resistors 123 are possible. For example, in other embodiments, a SDT device may have two or more active resistors 121 and/or two or more passive resistors 123. The conductive channels 59/259 of the active resistors 121 and passive resistors 123 may be similar or may be different (e.g., have different doping concentrations or doping profiles). In this manner, a suitable number of active resistors 121 and/or passive resistors 123 may be formed to provide a suitable degeneration resistance. The active resistors 121 and passive resistors 123 may be connected in any suitable series configuration to a FinFET 120. This can allow for flexibility in the design and layout of an SDT device.

In FIGS. 17E and 17F, as a non-limiting example, a SDT device 125 may be similar to the SDT device 125 of FIGS. 15E and 15F except that the active resistor 121B is replaced with a passive resistor 123B, so that the passive resistor 123B is between the active resistor 121A and the epitaxial region 82RB. FIG. 17F illustrates a simplified circuit schematic of the SDT device 125 shown in FIG. 17E. The conductive channel 259 of a passive resistor 123 may be similar to or different from a conductive channel 59 of an active resistor 121 in the same SDT device 125. The passive resistor 123A is electrically coupled in series with the active resistor 121B, and thus adds to the degeneration resistance of the SDT device 125.

Figure 17H:
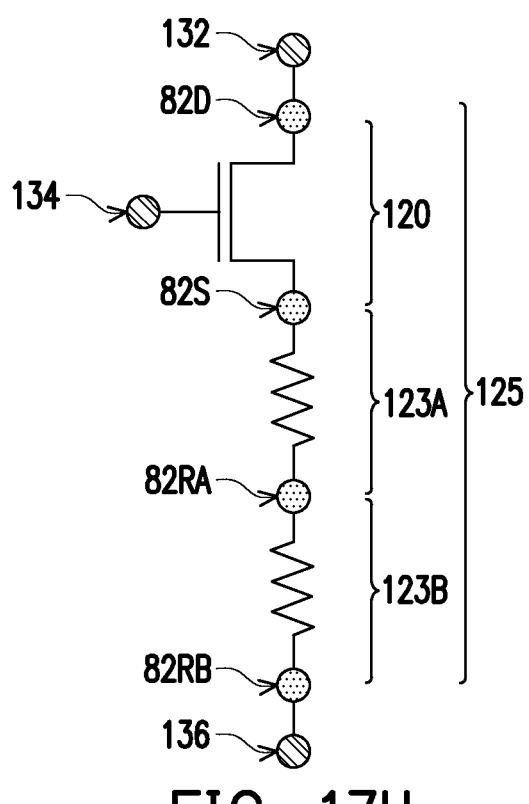
Figure 17I:
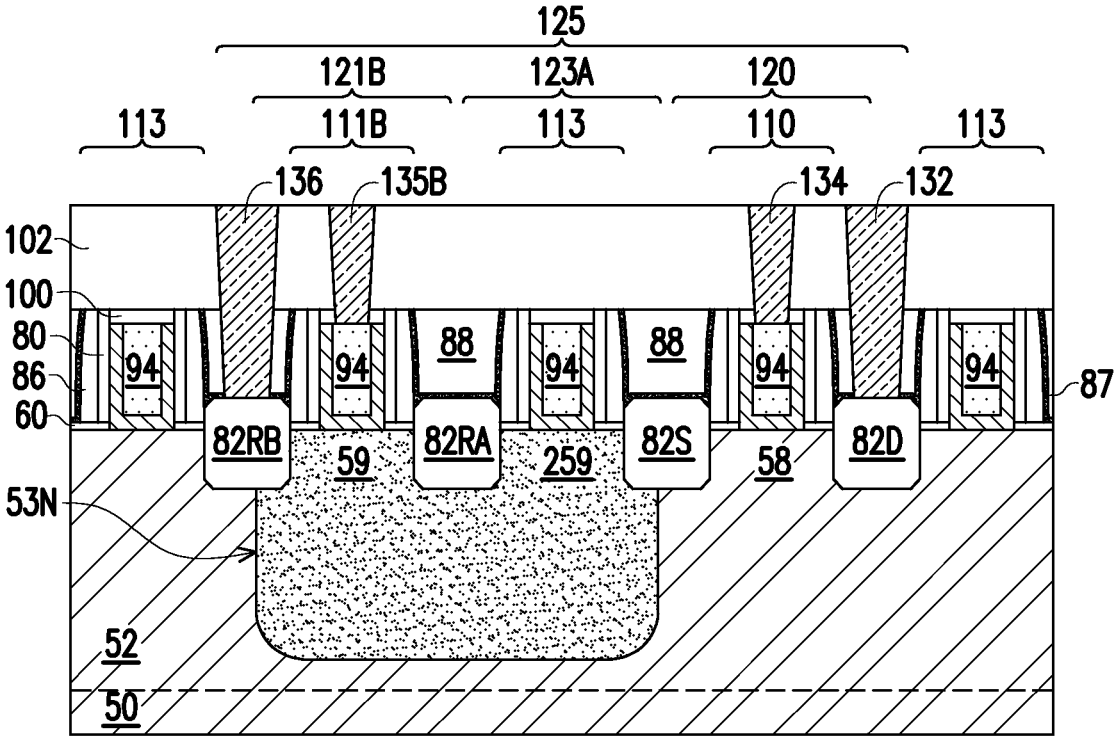
Figure 17J:
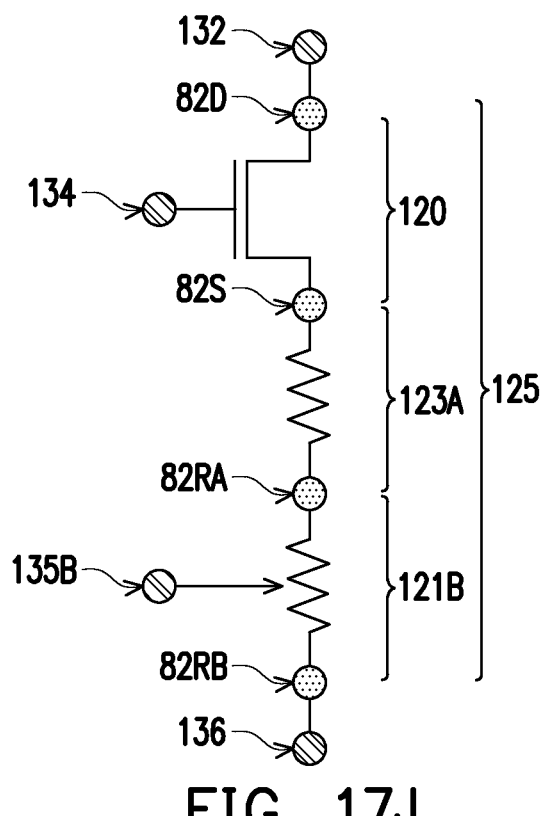

In FIGS. 17G and 17H, as another non-limiting example, a SDT device 125 may be similar to the SDT device 125 of FIGS. 15E and 15F except that both the active resistor 121A and active resistor 121B are replaced with passive resistor 123A and passive resistor 123B, the passive resistors 123B each sharing the epitaxial region 82RA. FIG. 17H illustrates a simplified circuit schematic of the SDT device 125 shown in FIG. 17G. In FIGS. 171 and 17J, as another non-limiting example, a SDT device 125 may be similar to the SDT device 125 of FIGS. 15E and 15F except that the active resistor 121A is replaced with a passive resistor 123A, so that the passive resistor 123A is between the active resistor 121B and the FinFET 120, sharing the epitaxial region 82S. FIG. 17J illustrates a simplified circuit schematic of the SDT device 125 shown in FIG. 171. Other configurations are possible, including adding additional active resistors 121 and/or passive resistors 123.

In some embodiments, the epitaxial regions 82 of the active resistors 121, passive resistors 123, and FinFET 120 all have the same pitch. In some embodiments, the distance W2 (see FIGS. 10B-10C) between neighboring epitaxial regions 82 may be controlled to control the lengths of the channel region 58, conductive channel 59, and conductive channel 259. In some cases, controlling the width W2 in this manner can also control the resistances of the active resistors 121 and the passive resistors 123.

Figure 18:
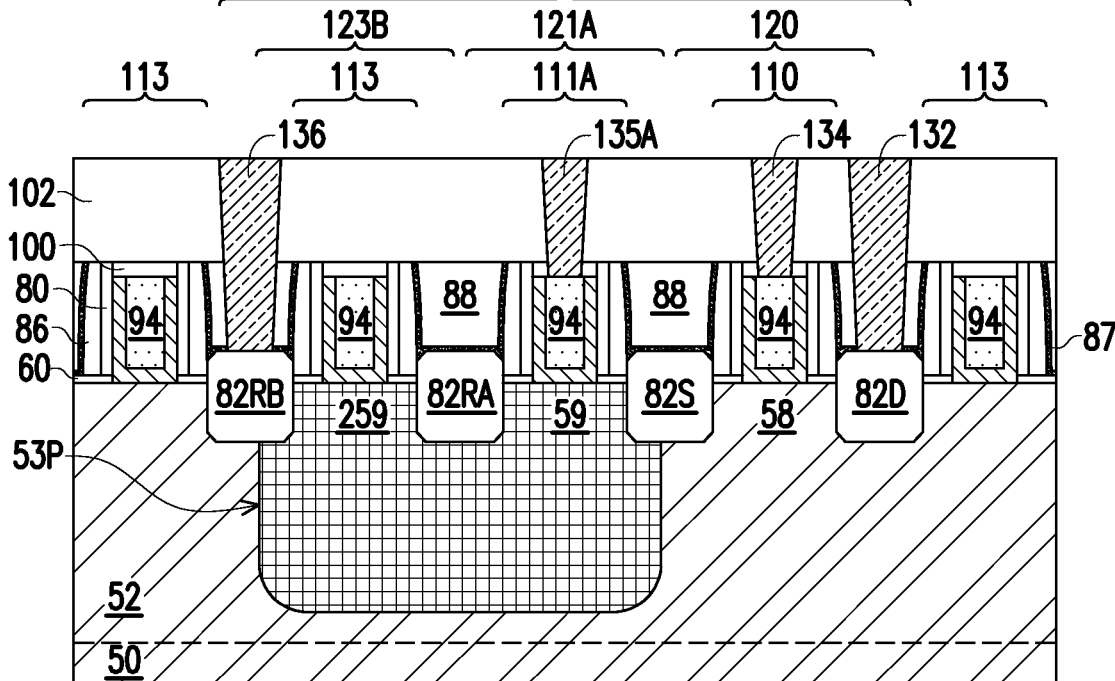
FIG. 18 is a view of an intermediate stage in the manufacturing of a transistor device with an active resistor and passive resistor, in accordance with some embodiments.

FIG. 18 illustrates an SDT device 125P formed in the p-type region 50P, in accordance with some embodiments. The various example SDT devices 125 are described as being in the n-type region and SDT devices may also be formed in the p-type region 50P. As an illustrative example, FIG. 18 shows a SDT device 125P formed in the p-type region 50P, in accordance with some embodiments. The SDT device 125P is similar to the SDT device 125 described for FIG. 17E, except that the SDT device 125P is formed in the p-type region 50P instead of the n-type region 50N. Accordingly, the fin 52 may be doped with different dopant types and in different regions than the SDT device 125 of FIG. 17E. For example, the FinFET 120 in the SDT device 125P may be a p-type FinFET, and the conductive channels 59/259 of the active resistors 121 and the passive resistors 123 may be doped with p-type dopants. The SDT device 125P is an illustrative example, and other configurations or variations are possible utilizing the descriptions above for the SDT device 125. In some embodiments, regions of SDT devices in the n-type region 50N and regions of SDT devices in the p-type region 50P are implanted in the same implant steps. Any of the example SDT devices and their variations described herein in relation to be formed in the n-type region 50N may instead be formed in the p-type region 50P by appropriate modifications as discussed in relation to FIG. 18.

Figure 19A:
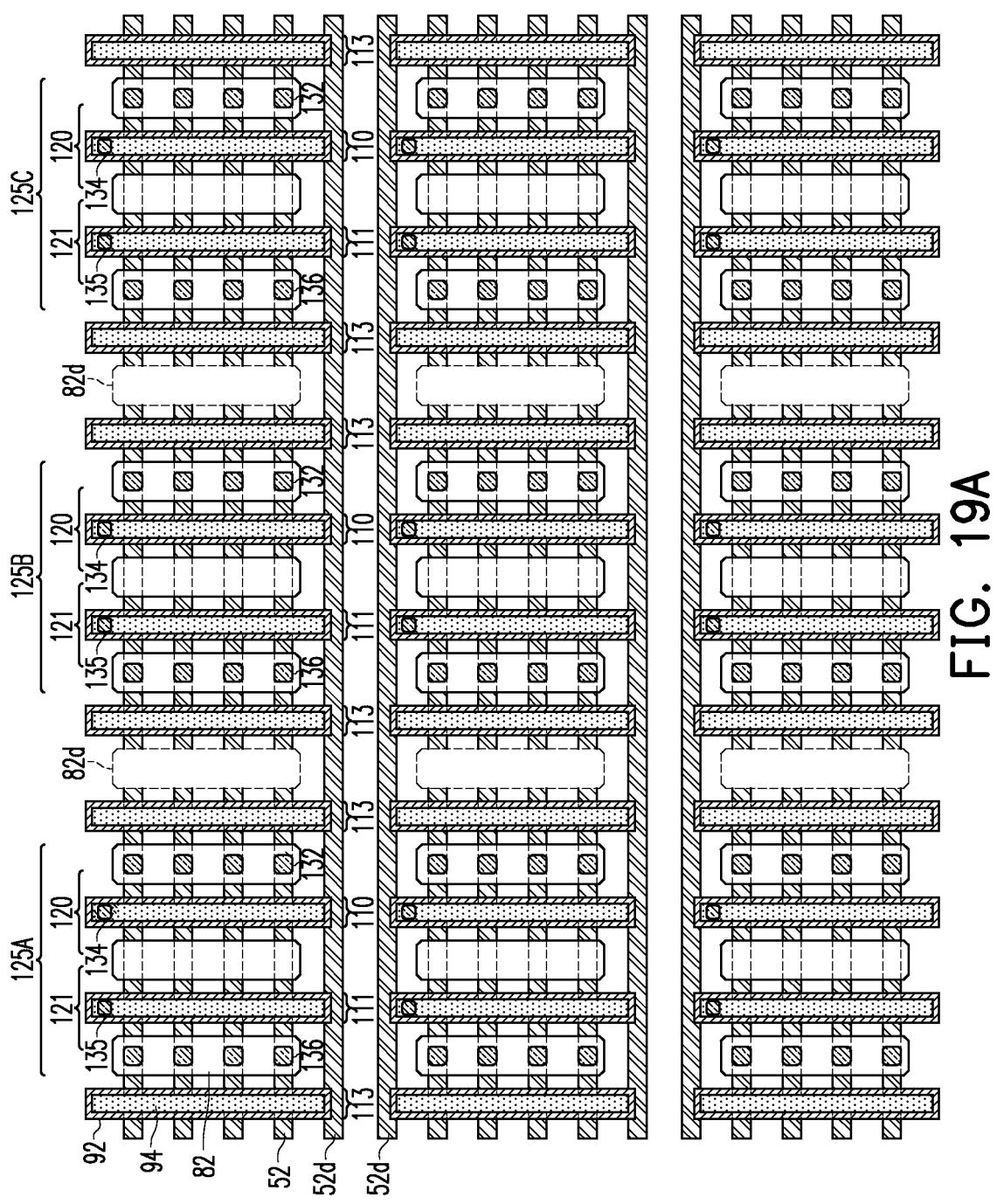
FIGS. 19A and 19B are top-down or plan views of an intermediate stage in the manufacturing of various transistor devices with active resistors and/or passive resistors, in accordance with some embodiments.
Figure 19B:
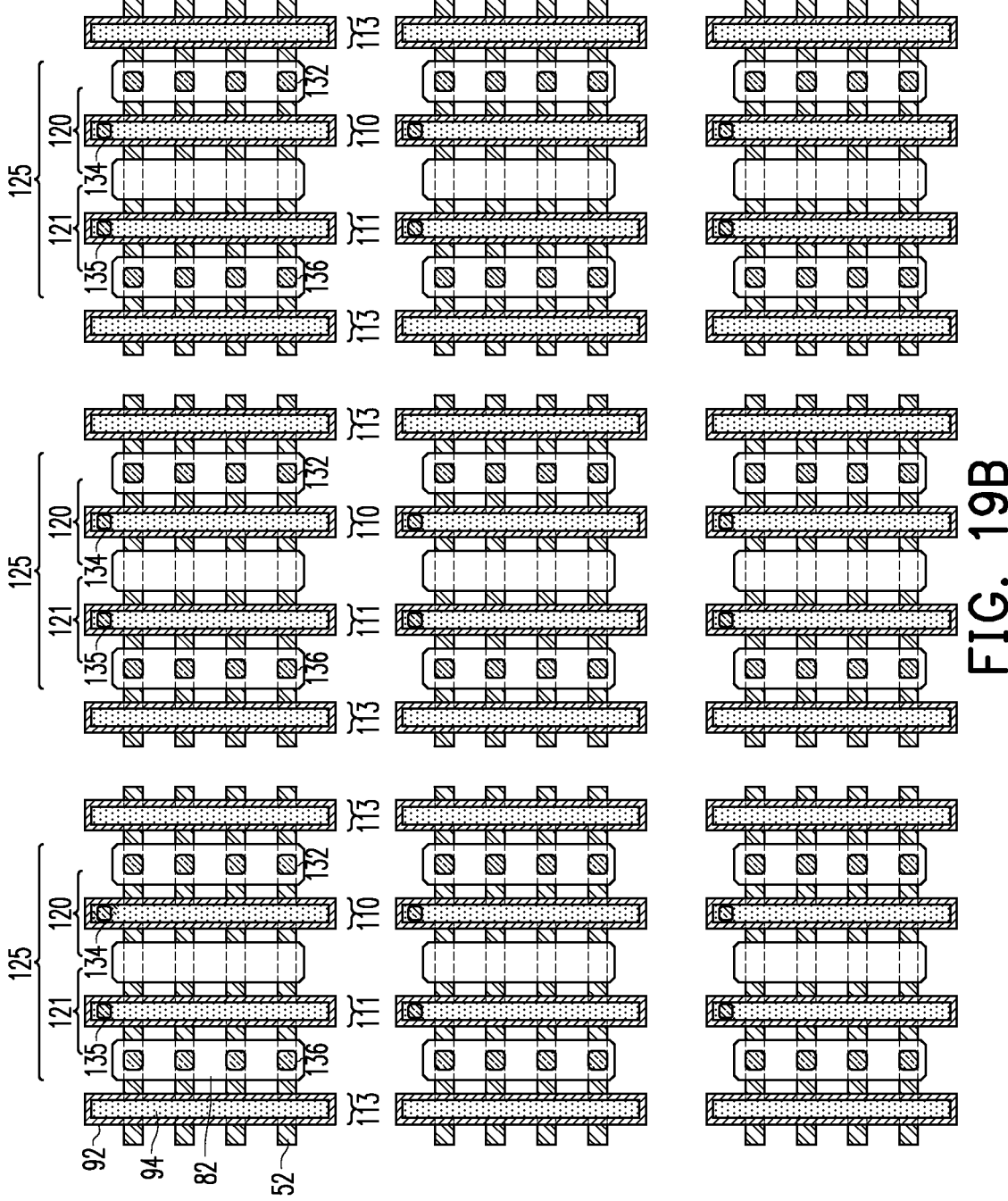

FIGS. 19A and 19B illustrate various plan view configurations of the SDT device 125 of FIGS. 15A-15D, labeled as the SDT device 125B of FIGS. 19A and 19B, in relation to other SDT devices, though some features are not shown for clarity reasons. As illustrated in FIG. 19A, for two adjacent SDT devices 125 (e.g., SDT device 125A and SDT device 125B), the dummy gates 113 which are formed at the edges of the SDT devices 125 are repeated so that two dummy gates 113 are adjacent to each other in between two SDT devices 125. As noted above, the dummy gates 113 have replacement metal gates, including gate electrodes 94, but do not have contacts to the gate electrodes 94. Maintaining separate edge gates 113 at each end of the SDT devices 125 provides sufficient electrical separation between the adjacent SDT devices 125.

As suggested in FIG. 19A, the gate structures 110, control structures 111, and dummy gate structures 113 may initially be patterned to continue perpendicular to the fins 52 in an unbroken manner (see FIGS. 8A, 8B, and 8C, and accompanying description). In a separate process, in some embodiments, the dummy gates 72 and/or masks 74 may be cut cross-wise to separate the dummy gates 72 into separate structures. In other embodiments the gates structures 110, control structures 111, and dummy gate structures 113 may be cut after the dummy gates 72 have been replaced by the gate dielectric layers 92 and the gate electrodes 94. In other embodiments, the dummy gates 72 may be patterned in such a manner as to form distinct and separate segments when the dummy gate layer 62 is patterned into the dummy gates 72 (see FIGS. 8A-8C). The gates may be cut using acceptable photolithography and etching techniques. In some embodiments, a dummy epitaxial region 82*d* may be formed between the two adjacent dummy gate structures 113, while in other embodiments, it may be omitted. One or more of the fins 52 may be dummy fins 52*d* which traverse between the ends of the gate structures 110, control structures 111, and dummy gate structures 113 of two adjacent SDT devices.

FIG. 19B is similar to that of FIG. 19A, except that fin cutting and/or fin removal has been performed. For example, the dummy fins 52*d* (FIG. 19B) may be removed between adjacent SDT devices 125 prior to forming the dummy gate layer 62 of FIG. 7. Such dummy fins 52*d* may be removed using acceptable photolithography and etching techniques. Generally, all the fins 52 formed for the SDT devices 125 would have a regular pattern and regular pitch due to pattern loading effects, however, in some embodiments, the dummy fins 52 may be omitted when the fins 52 are formed in conjunction with FIG. 3. Fin cutting may also be performed, such as illustrated in FIG. 19B. The fins 52 between two adjacent dummy gate structures 113 may be cut to separate the fins 52 end to end between two SDT devices 125 (e.g., between 125A and 125B). The fins 52 may be cut using acceptable photolithography and etching techniques.

Figure 21A:
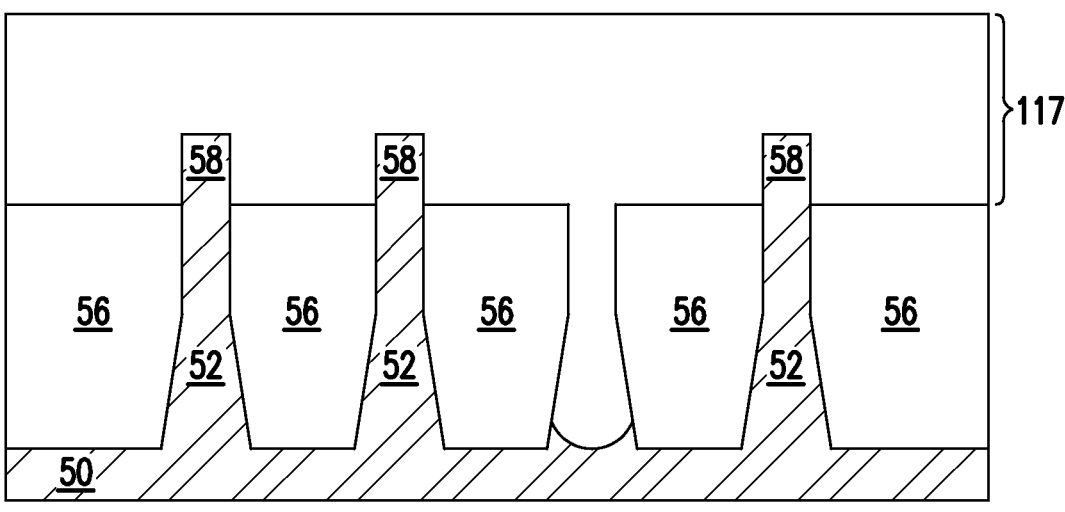
Figure 21B:
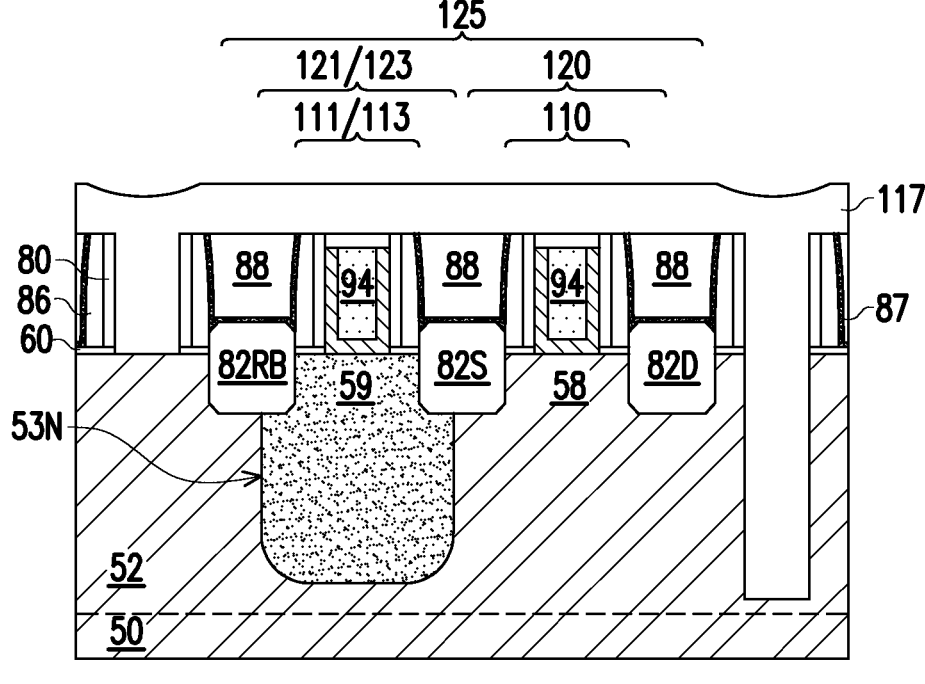
Figure 22A:
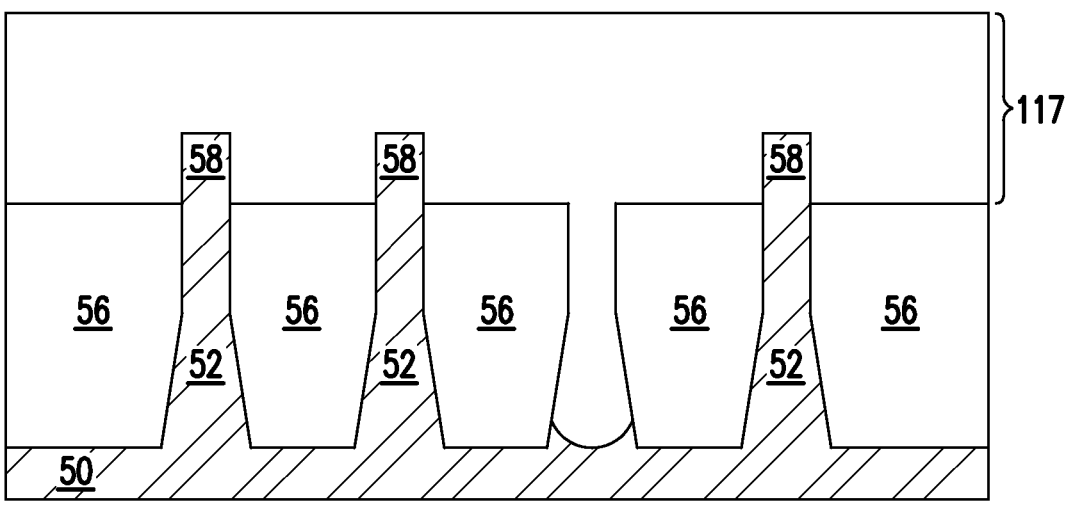
Figure 22B:
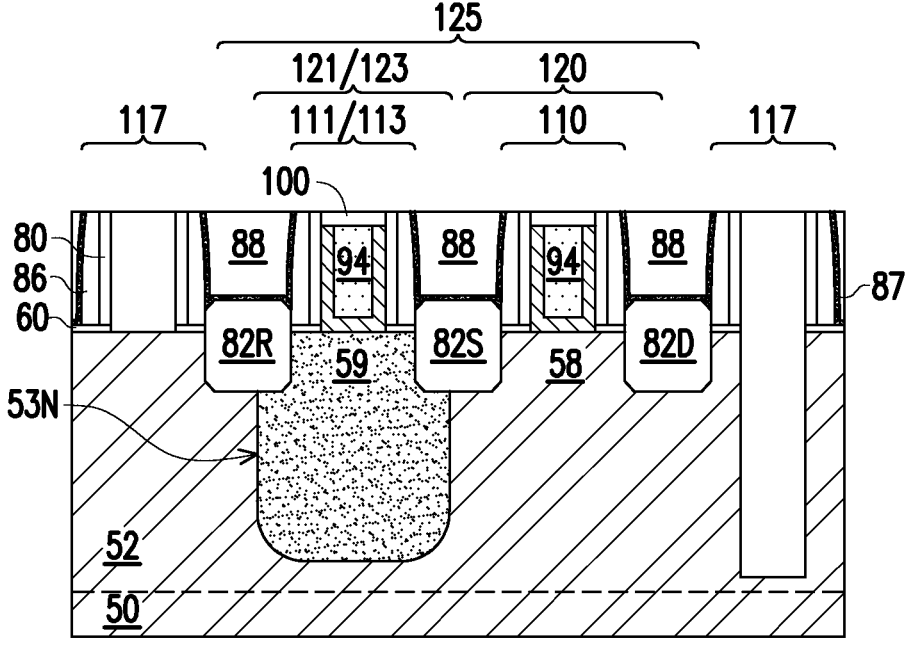
Figure 22C:
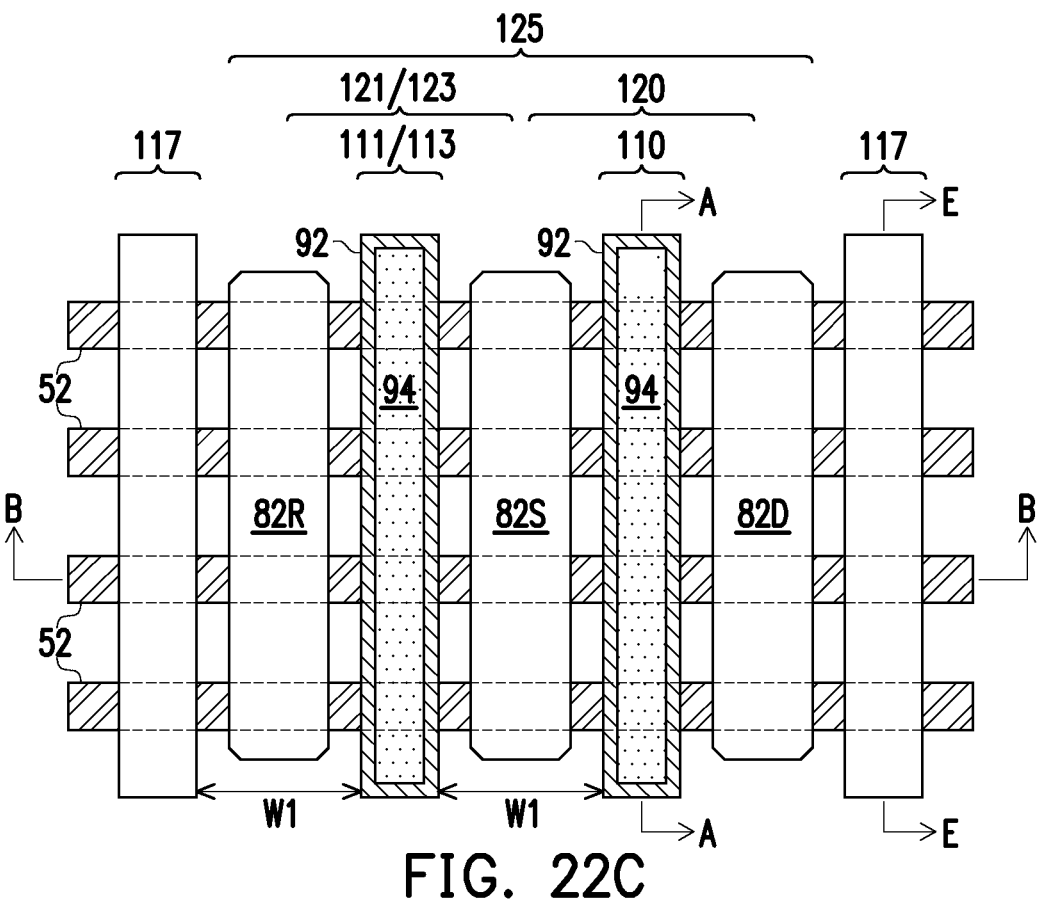
Figure 23A:
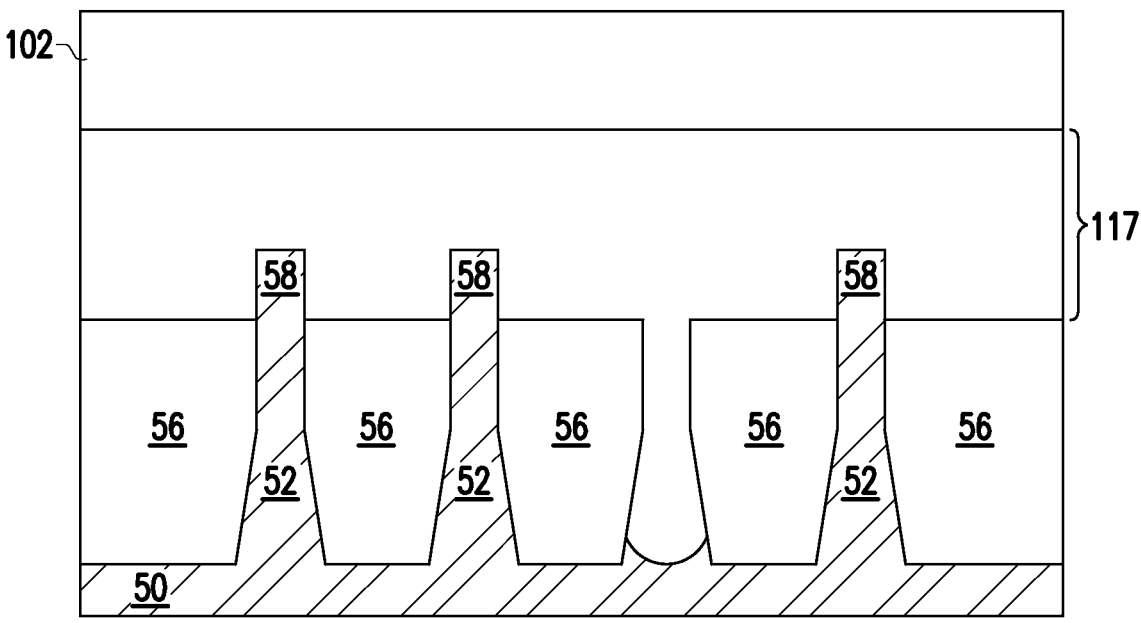
Figure 23B:
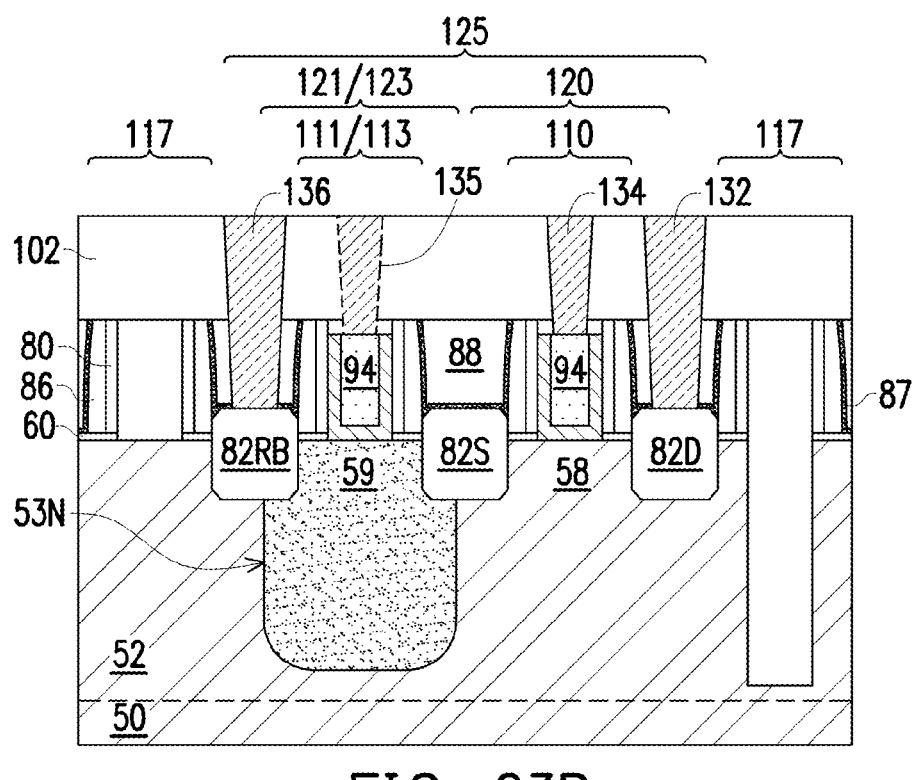
Figure 23C:
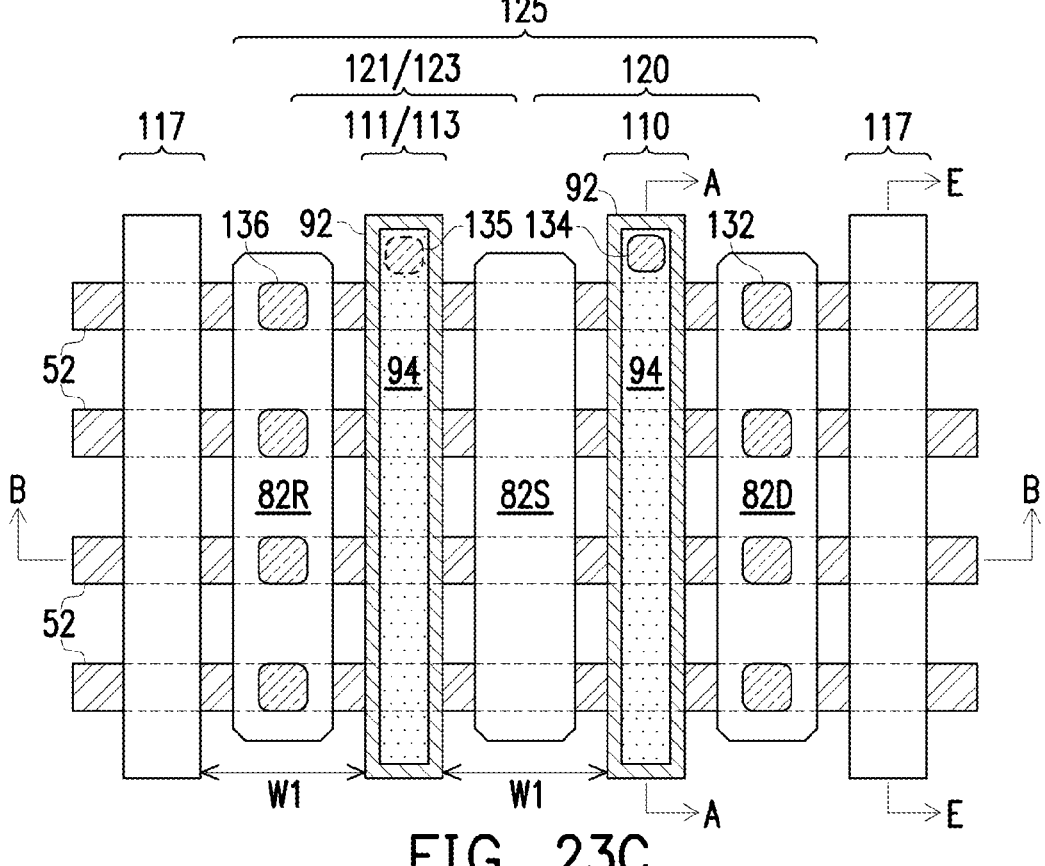

FIGS. 20A through 23C include cross-sectional views and plan views of intermediate stages in the manufacturing of FinFETs, in accordance with some embodiments. FIGS. 20A, 21A, 22A, and 23A are illustrated along reference cross-section E-E which is parallel to the cross-section A-A illustrated in FIG. 1, and further described below with respect to FIG. 20C. FIGS. 20B, 21B, 22B, and 23B are illustrated along reference cross-section B-B illustrated in FIG. 1, except for multiple fins/FinFETs. FIGS. 20C, 22C, and 23C are plan views.

FIGS. 20A, 20B, and 20C through FIGS. 23A, 23B, and 23C illustrate intermediate stages in the formation of a SDT device 125, in accordance with some embodiments. These figures illustrate a process for replacing the edge dummy gate structures 113 of the SDT device 125 with a dielectric filled gate. (These same techniques may also be used to replace the dummy gate structures 113 used within a passive resistor 123.) Replacing the edge dummy gate structures 113 allows for compaction of the layout of multiple SDT devices 125 in an adjacent manner. For example, as illustrated above with respect to FIGS. 19A and 19B, between two adjacent SDT devices 125, a first edge dummy gate structure 113 is used for the SDT device 125A and a second immediately adjacent edge dummy gate structure 113 is used for the SDT device 125B. In that embodiment, using at least two dummy gate structures 113 provides sufficient isolation between the two adjacent SDT devices 125A and 125B. By replacing the edge dummy gate structure 113 with an isolation structure, sufficient electrical isolation may be realized between the adjacent SDT devices using a singular isolation structure between them. The process illustrated in FIGS. 20A, 20B, and 20C through FIGS. 23A, 23B, and 23C may be performed on a SDT device having an active resistor 121 and/or passive resistor 123. For the sake of simplicity only one such resistor is illustrated as either active resistor 121 or passive resistor 123 (and corresponding control structure 111 or dummy gate structure 113, respectively), however, one will understand that multiples of such structures may be used in any combination, such as provided above.

FIGS. 20A through 23C include a combined view of an embodiment which removes the gate electrode 94 and gate dielectrics 92, but leaves the underlying fin 52 intact, in addition to another embodiment which removes the gate electrode 94, gate dielectrics 92, and underlying fins 52. These embodiments may be combined such that both exist in the same device, or one or the other may be used when forming the insulating structures 117.

Figure 20A:
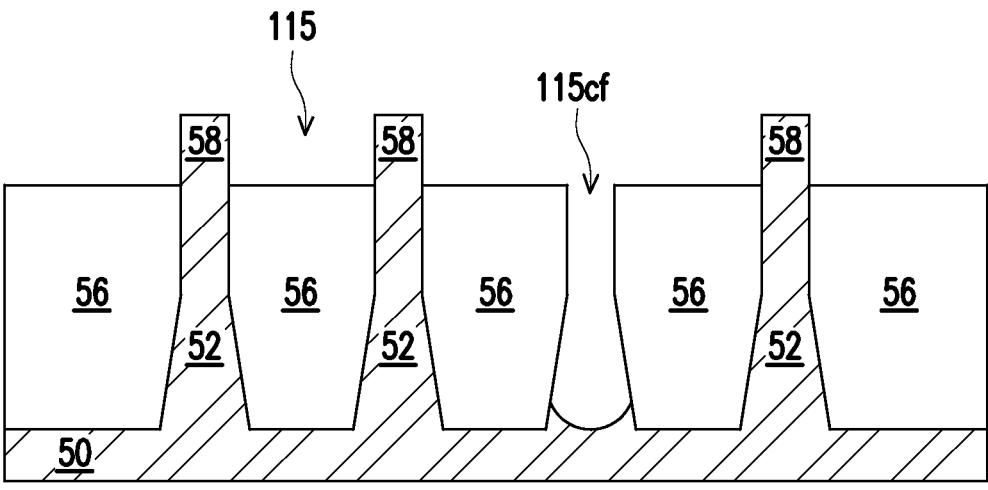
FIGS. 20A, 20B, 20C, 21A, 21B, 22A, 22B, 22C, 23A, 23B, 23C, 24A, and 24B are various views of intermediate stages in the manufacturing of transistor devices with active resistors and/or passive resistors, in accordance with some embodiments.
Figure 20B:
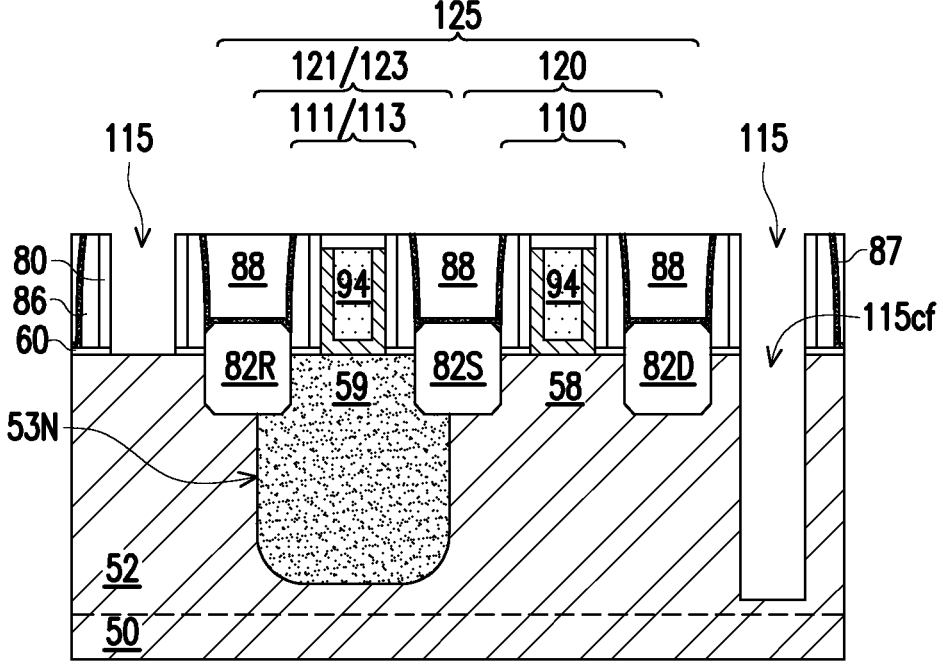
Figure 20C:
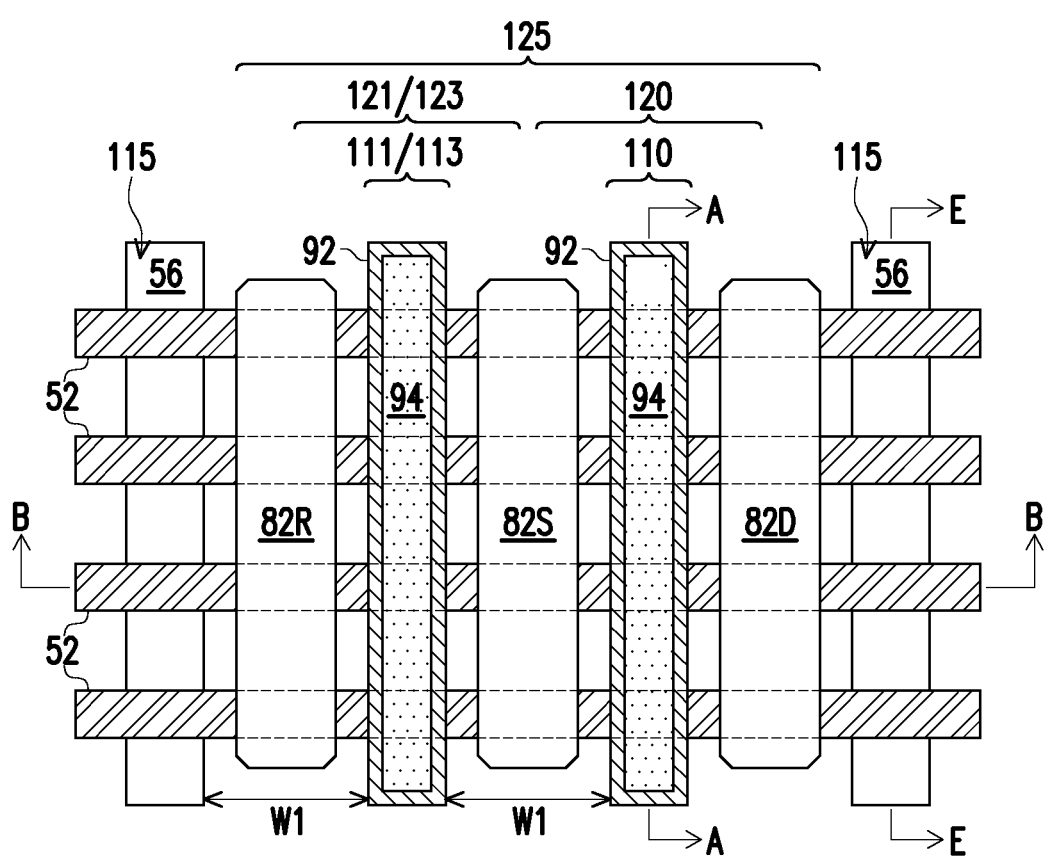

The structure illustrated in FIGS. 20A, 20B, and 20C illustrate processes performed on the structure of FIGS. 14A, 14B, and 14C. FIG. 20A illustrates a cross-sectional view along the cross-section E-E of FIG. 20C through the dummy gate structure 113 (see FIGS. 14A, 14B, and 14C), the cross-section E-E being parallel to the reference cross-section A-A, and FIG. 20B illustrates a cross-sectional view along reference cross-section B-B. FIG. 20C illustrates a plan view, though some features are not shown for clarity reasons.

In FIGS. 20A, 20B, and 20C, the edge dummy gate structures 113 are removed by an acceptable photoetching technique. For example, a photoresist may be deposited over the structure in FIGS. 20A, 20B, and 20C and patterned to form openings therein exposing the dummy gate structures 113 to be removed. Then the gate masks 100 (if used), gate electrodes 94, and gate dielectric layers 92 may be removed by suitable etchants, thereby forming the recesses 115. In some embodiments, one or more of the gate dielectric layers 92 may remain in the recesses 115. In some embodiments, other dummy gate structures 113 may be removed, forming recesses 115 where they were. For example, a dummy gate structure 113 over a channel region 259 of a passive resistor 123 may be removed in some embodiments. As illustrated in FIG. 20C, portions of the STI regions 56 may be exposed, in addition to the fins 52. In some embodiments, the exposed fins 52 may be cut by forming an additional recess 115*cf* by etching the fins 52 exposed in the recesses 115 using an acceptable photoetching technique. For the sake of simplicity, only one fin 52 is shown as being removed, however, it should be understood that all of the exposed portions of the fins 52 may be removed. Removing the fins 52 may provide better electrical isolation between two adjacent SDT devices. In some embodiments, the portions of the fins 52 which would be in the recesses 115 may be removed by fin cutting process previously performed, such as prior to forming the dummy gate layer 62 of FIG. 7, using acceptable photolithography and etching techniques.

In FIGS. 21A and 21B, next, an insulation material is deposited in the recesses 115 to form insulating structures 117. FIG. 21A illustrates a cross-sectional view along the cross-section E-E of FIG. 20C, the cross-section E-E being parallel to the reference cross-section A-A, and FIG. 21B illustrates a cross-sectional view along reference cross-section B-B. The insulation material may be an oxide, such as silicon oxide, a nitride, the like, or a combination thereof, and may be formed by a high-density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. In an embodiment, the insulation material is formed such that excess insulation material may extend over a top of the gate structure 110, the control structure 111, and the first ILD 88. Although the insulation material is illustrated as a single layer, some embodiments may utilize multiple layers. For example, in some embodiments a liner (not shown) may first be formed along a surface of the STI regions 56 and the fins 52. Thereafter, a fill material, such as those discussed above may be formed over the liner. In embodiments which remove the fins 52, such as illustrated by way of example (see recesses 115*cf* of FIGS. 20A and 20B), the insulation material may be deposited such that it fills the recesses 115*cf*.

In FIGS. 22A, 22B, and 22C, next, the excess insulation material is removed through a removal process, thereby separating the insulating structures 117. FIG. 22A illustrates a cross-sectional view along the cross-section E-E of FIG. 22C through the insulating structure 117, the cross-section E-E being parallel to the reference cross-section A-A, and FIG. 22B illustrates a cross-sectional view along reference cross-section B-B. FIG. 22C illustrates a plan view, though some features are not shown for clarity reasons. In some embodiments, a planarization process such as a chemical mechanical polish (CMP), an etch-back process, combinations thereof, or the like may be utilized as the removal process. The planarization process exposes the upper surfaces of the gate structure 110, control structures 111, other remaining dummy structures 113, first ILD 88, gate spacers 86, and so forth such that top surfaces of the gate structures 110, control structures 111, first ILD 88, and insulating structures 117 are level after the planarization process is complete. In FIG. 22C, the fins 52 are shown in dashed lines under the insulating structure 117, except where, by way of example, the fin 52 has been removed, as described above with respect to FIGS. 20A, 20B, and 20C.

In FIGS. 23A, 23B, and 23C, next the second ILD 102 may be deposited over the structures illustrated in FIGS. 22A, 22B, and 22C and contacts formed therein, in accordance with some embodiments. FIG. 23A illustrates a cross-sectional view along the cross-section E-E of FIG. 23C through the insulating structure 117, the cross-section E-E being parallel to the reference cross-section A-A, and FIG. 23B illustrates a cross-sectional view along reference cross-section B-B. FIG. 23C illustrates a plan view, though some features are not shown for clarity reasons.

In some embodiments, the gate masks 100 may not have yet been formed. Thus, in some embodiments which utilize gate masks 100, the gate masks 100 may be formed using processes and materials and configurations such as those described above with respect to FIGS. 15A, 15B, and 15C. The second ILD 102 may likewise be formed using processes and materials similar to those discussed above with respect to FIGS. 15A, 15B, and 15C. The contacts such as gate contacts 134, control contacts 135, and epitaxial region contacts 132/136 may then be formed through the second ILD 102 and the first ILD 88, in accordance with some embodiments. Processes and materials similar to those discussed above with respect to the contacts of FIGS. 15A, 15B, and 15C may be used.

Figure 24A:
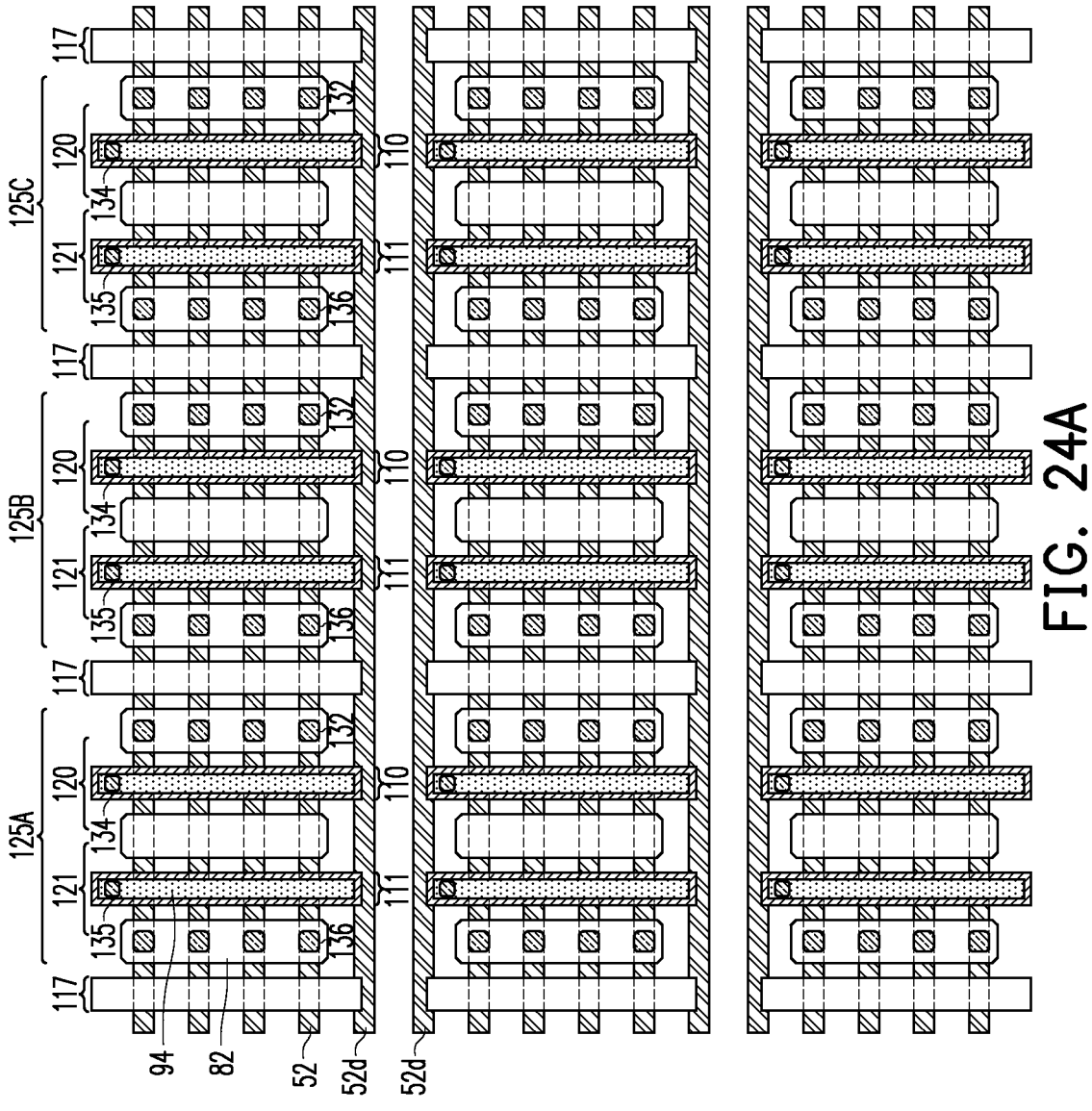
Figure 24B:
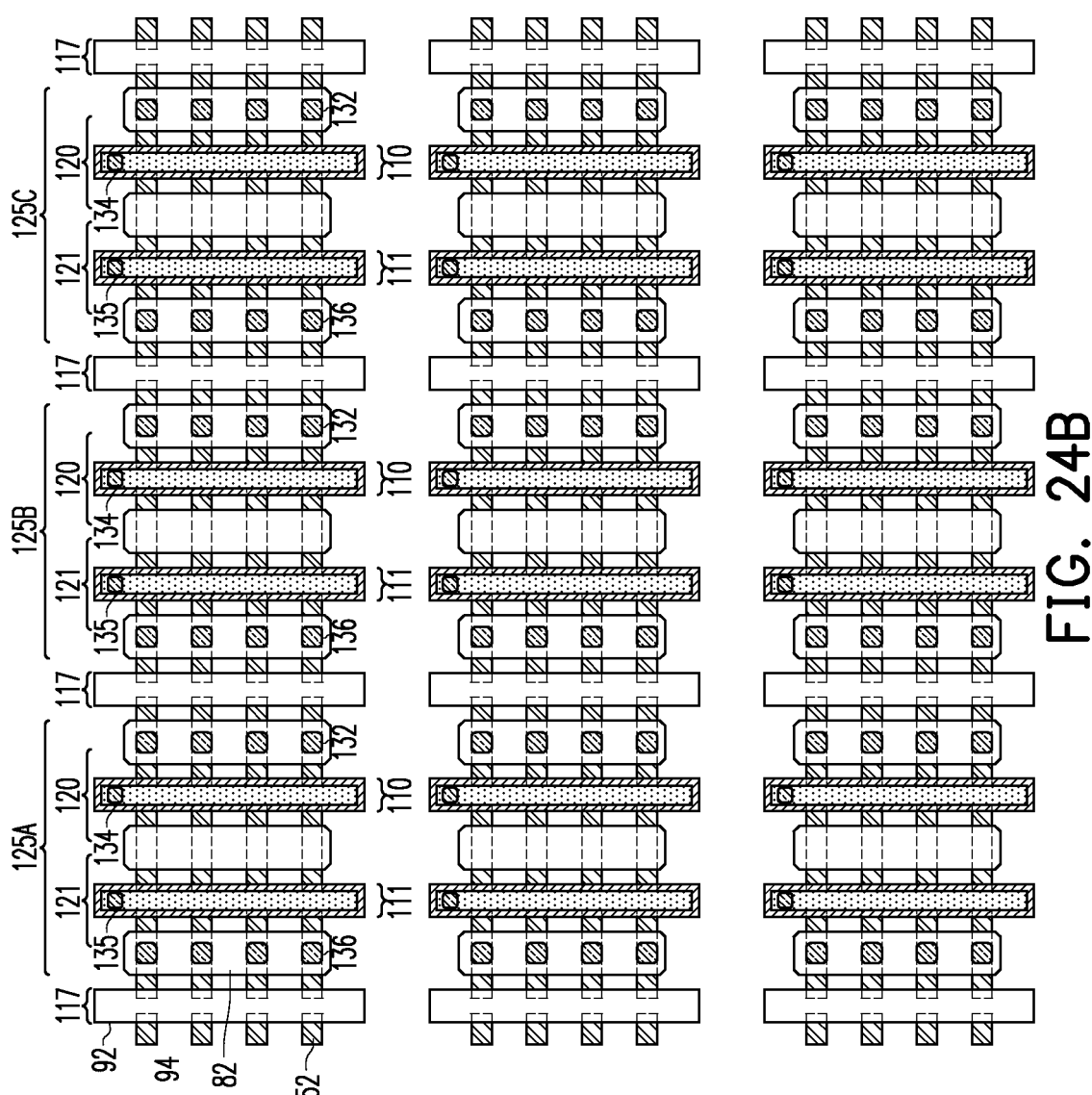

FIGS. 24A and 24B illustrate various plan view configurations of the SDT device 125 of FIGS. 23A-23C, labeled as the SDT device 125B of FIGS. 24A and 24B, in relation to other SDT devices (e.g., SDT device 125A and 125C), though some features are not shown for clarity reasons. As illustrated in FIG. 24A, for two adjacent SDT devices 125 (e.g., SDT device 125A and SDT device 125B), because the dummy gates 113 which are formed at the edges of the SDT devices 125 are replaced with the insulating structures 117, only one of the insulating structures 117 need be disposed between two adjacent SDT devices 125. The insulating structures 117 provide sufficient electrical separation between the adjacent SDT devices 125. Although control structures 111 and control contacts 135 are illustrated for an active resistor 121, it should be understood that a passive resistor 123 having a dummy gate structure 113 may be used instead or in addition to the active resistor 121 and possibly other active resistors 121 and/or passive resistors 123. Such dummy gate structures 113 used within a passive resistor 123 may also have been replaced with an insulating structure 117.

As suggested in FIG. 24A (and similar to that discussed with respect to FIG. 19A), the gate structures 110, control structures 111, and dummy gate structures 113 (at least some of which may have now been replaced with the insulating structures 117) may initially be patterned to continue perpendicular to the fins 52 in an unbroken manner (see FIGS. 8A, 8B, and 8C, and accompanying description). In a separate process, in some embodiments, the dummy gates 72 and/or masks 74 may be cut cross-wise to separate the dummy gates 72 into separate structures. In other embodiments the gates structures 110, control structures 111, and dummy gate structures 113 may be cut after the dummy gates 72 have been replaced by the gate dielectric layers 92 and the gate electrodes 94. In other embodiments, the dummy gates 72 may be patterned in such a manner as to form distinct and separate segments when the dummy gate layer 62 is patterned into the dummy gates 72 (see FIGS. 8A-8C). The gates may be cut using acceptable photolithography and etching techniques. One or more of the fins 52 may be dummy fins 52*d* which traverse between the ends of the gate structures 110, control structures 111, and dummy gate structures 113 of two adjacent SDT devices (e.g., 125A and 125D).

FIG. 24B is similar to that of FIG. 24A (and FIG. 19B), except that fin cutting and/or fin removal has been performed. For example, the dummy fins 52*d* (FIG. 24B) may be removed between adjacent SDT devices (e.g., 125A and 125D) prior to forming the dummy gate layer 62 of FIG. 7. Such dummy fins 52*d* may be removed using acceptable photolithography and etching techniques. Generally, all the fins 52 formed for the SDT devices 125 would have a regular pattern and regular pitch due to pattern loading effects, however, in some embodiments, the dummy fins 52 may be omitted when the fins 52 are formed in conjunction with FIG. 3. Fin cutting may also be performed, such as illustrated in FIG. 24B. The fins 52 between two adjacent SDT devices (e.g., 125A and 12B) may be cut to separate the fins 52 end-to-end between two SDT devices (e.g., between 125A and 125B). In some embodiments, the fins 52 may be cut in a prior process, which may be performed, for example prior to forming the dummy gate layer 62 of FIG. 7 using acceptable photolithography and etching techniques. In other embodiments, the fins 52 may be cut during removing the metal gates as illustrated above with respect to FIGS. 20A, 20B, and 20C. In embodiments where some of the fins 52 are retained underneath the insulating structure 117, the cut ends of the fins 52 are shown in dashed lines under the insulating structure 117. In some embodiments, the cut ends may not be covered by the insulating structure 117, but may abut the insulating structure 117 or may extend toward, but all the way up to the insulating structure 117. Examples of these alternatives are demonstrated within FIG. 24B in the center row of devices.

Figure 25A:
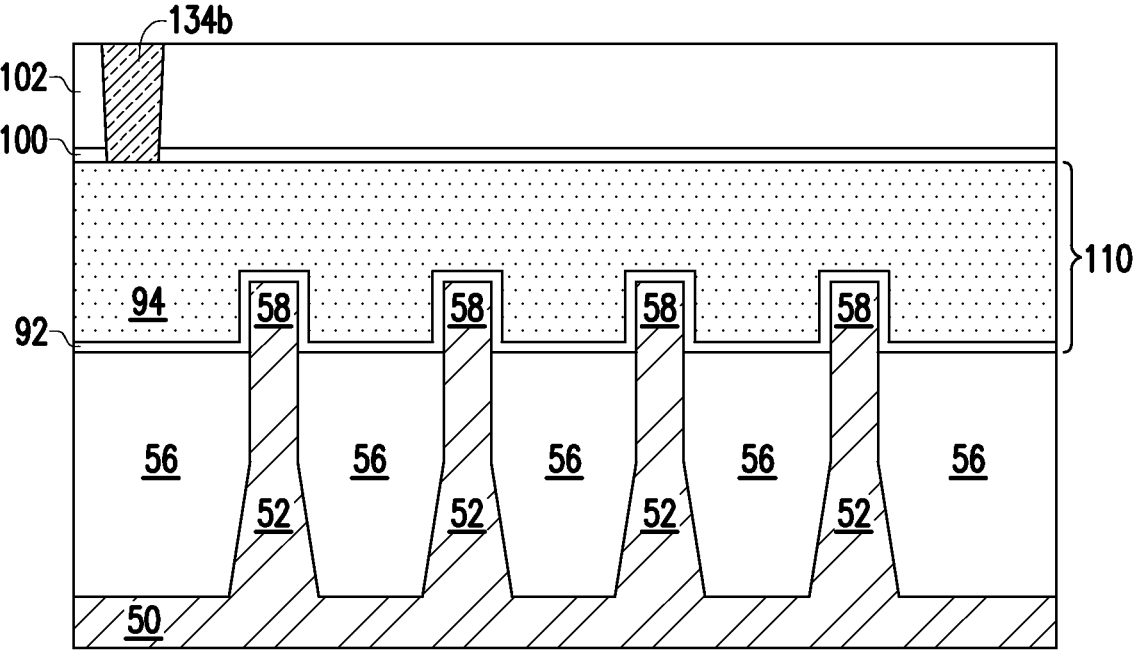
FIGS. 25A, 25B, 25C, 25E, 25F, 25G, 25H, 25J, and 25K are various views of intermediate stages in the manufacturing of transistor devices with active resistors and/or passive resistors with a shared source, in accordance with some embodiments.
Figure 25B:
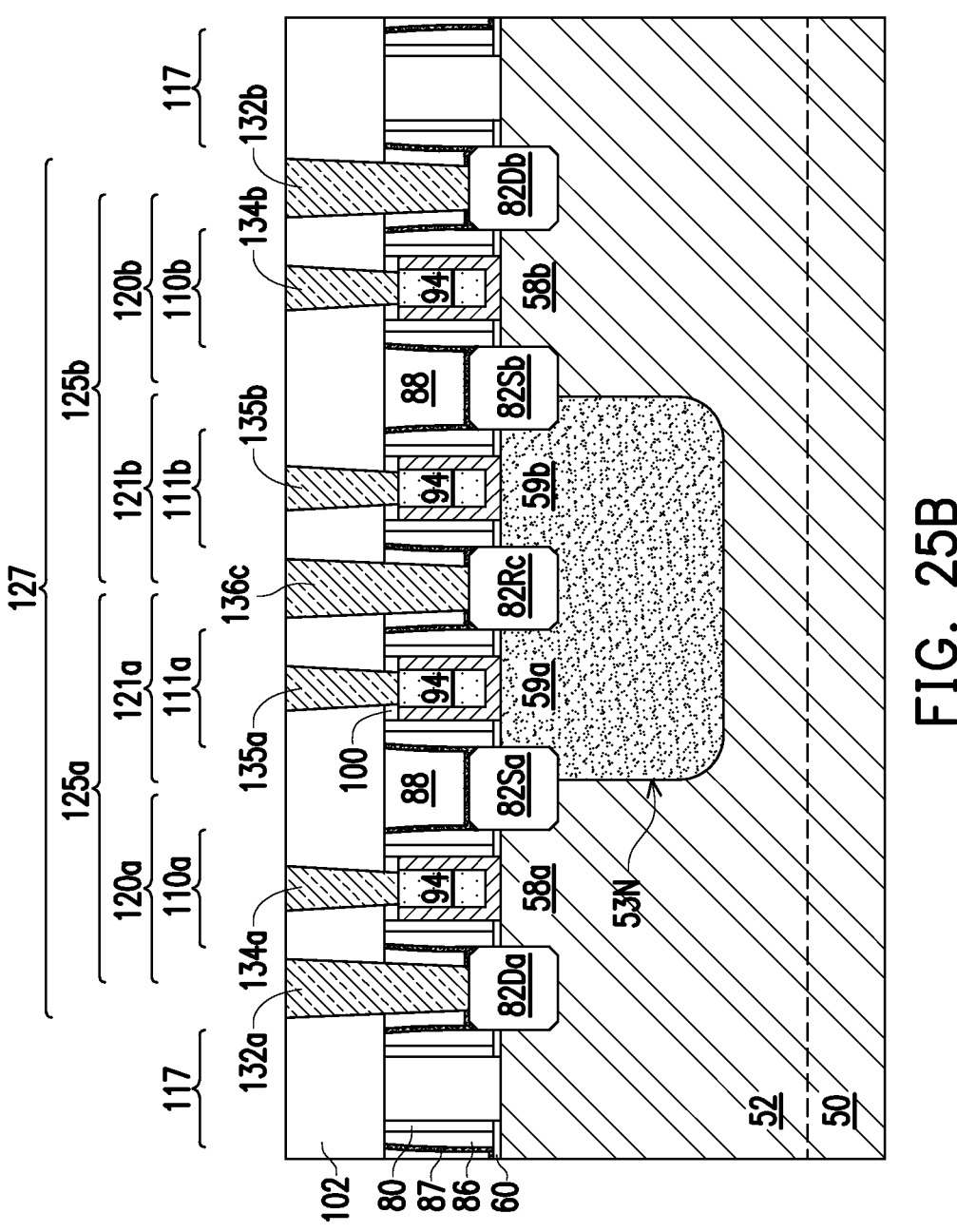
Figure 25C:
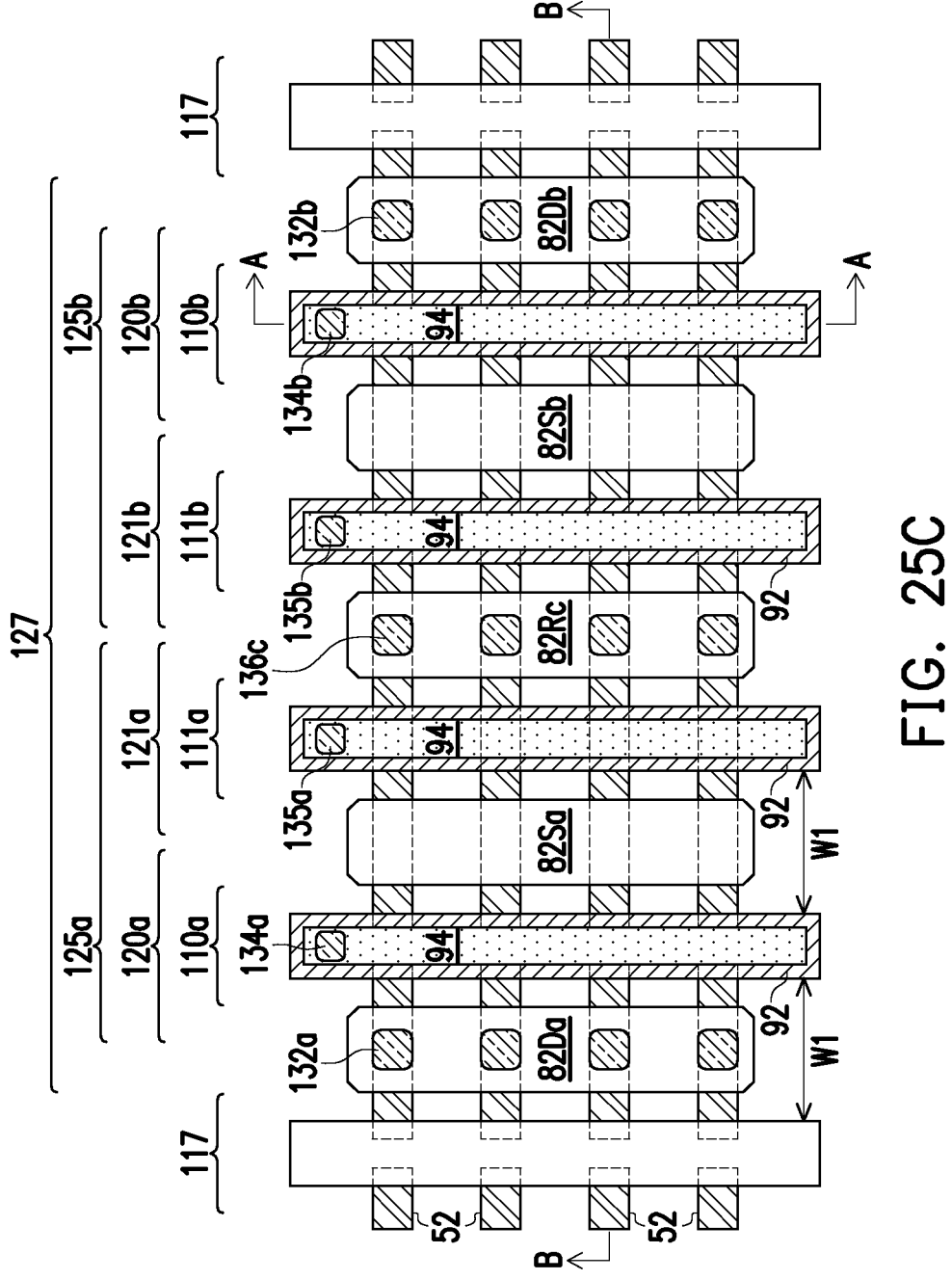
Figure 25D:
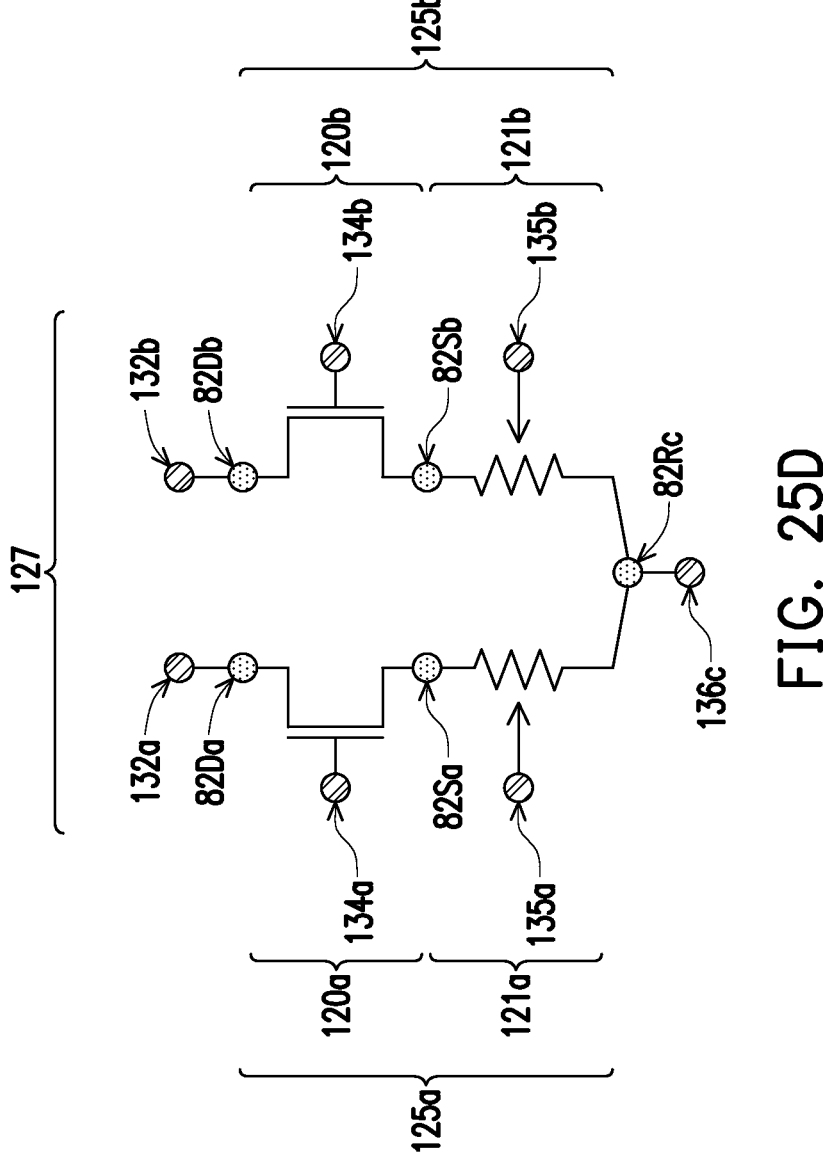
FIGS. 25D and 25I are schematics of such transistor devices, in accordance with some embodiments.
Figure 25E:
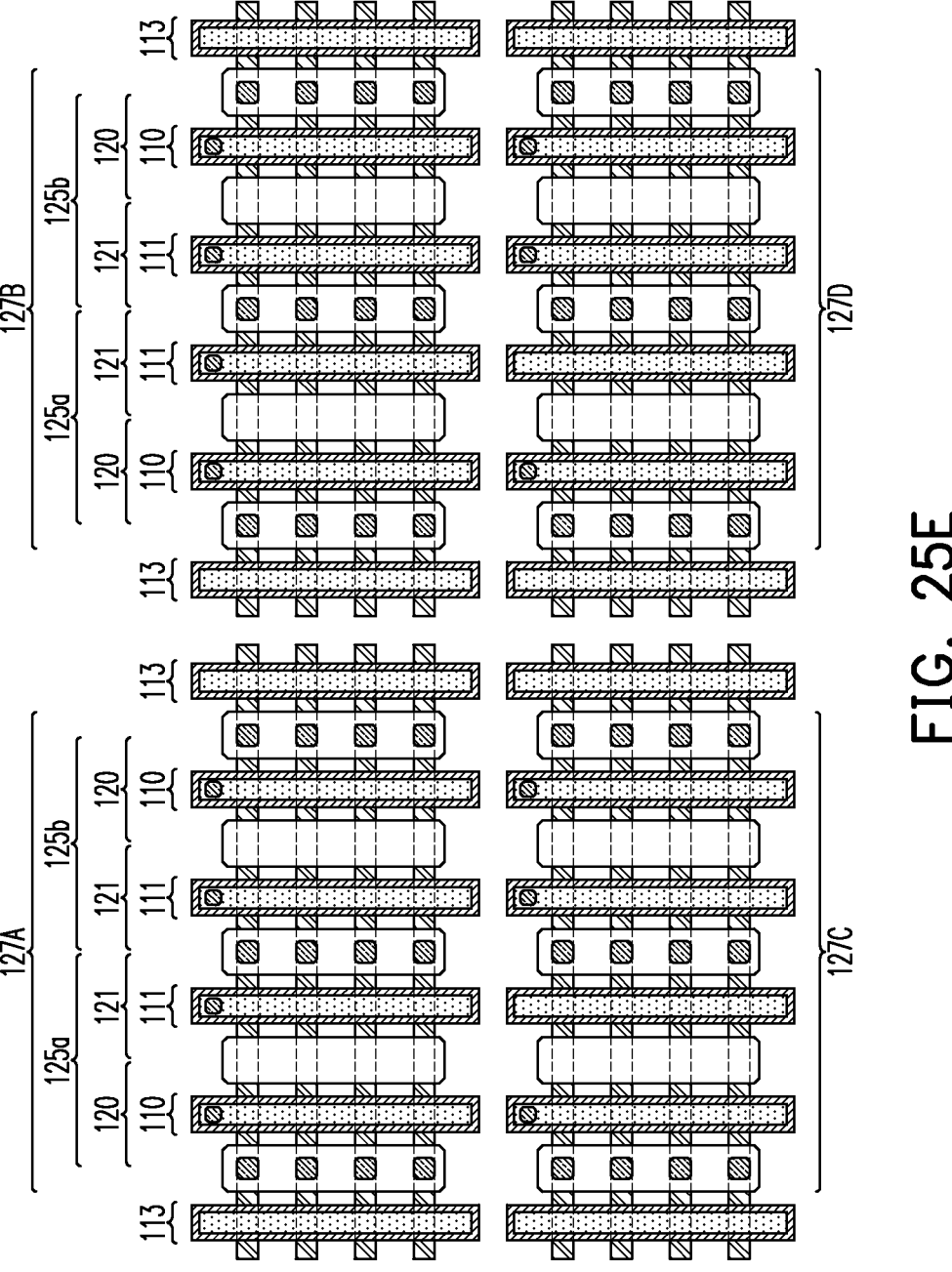
Figure 25F:
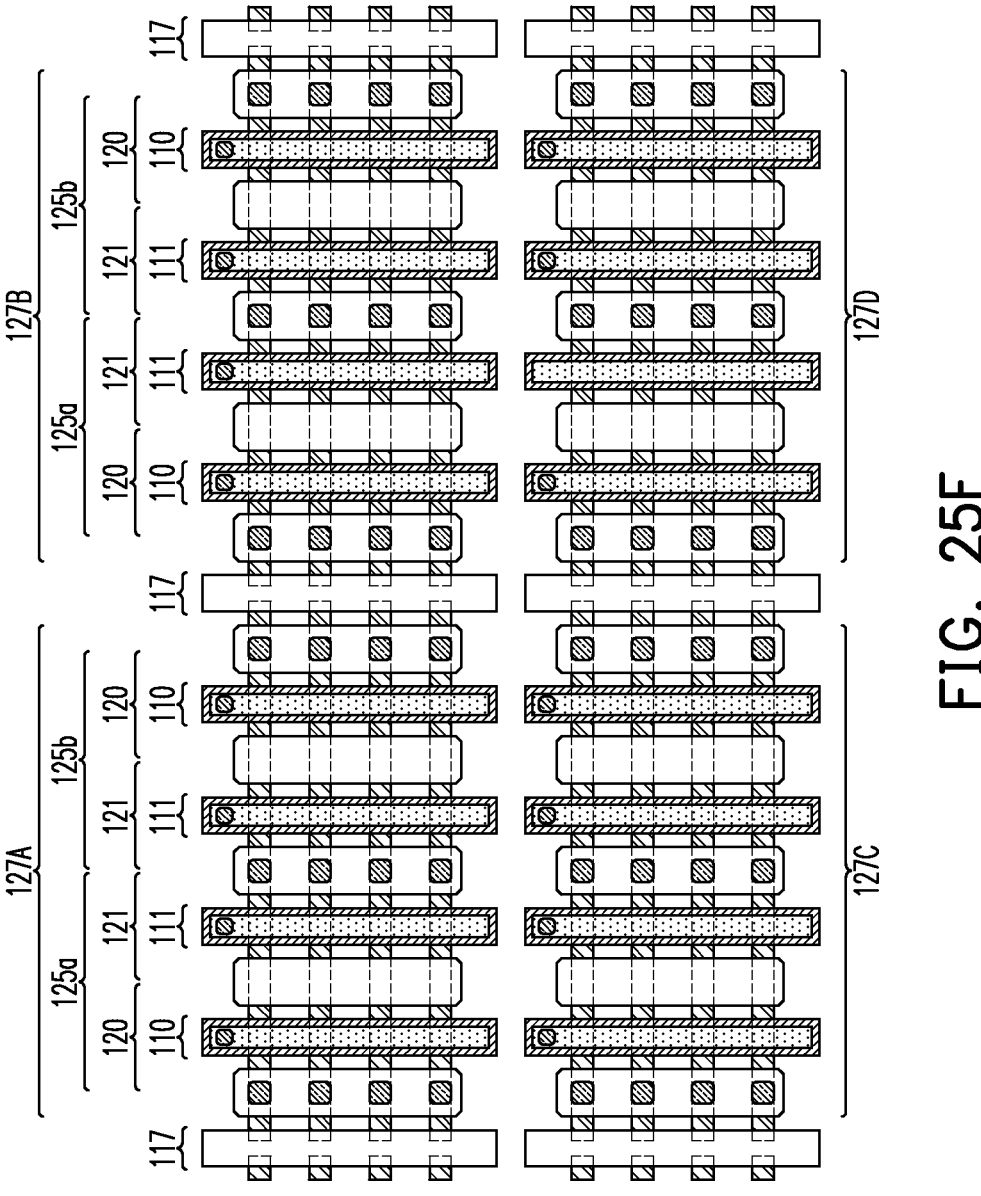
Figure 25G:
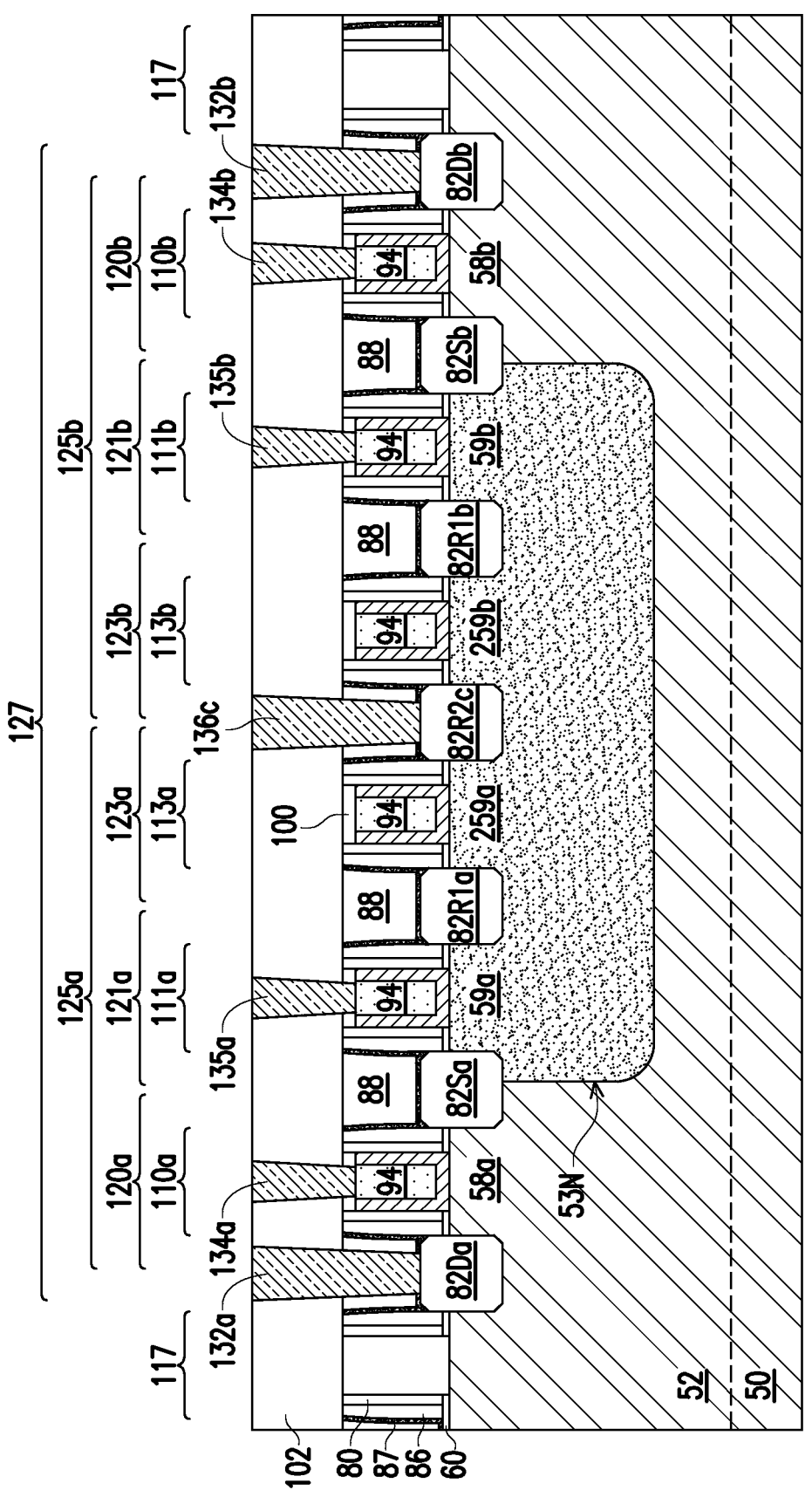
Figure 25H:
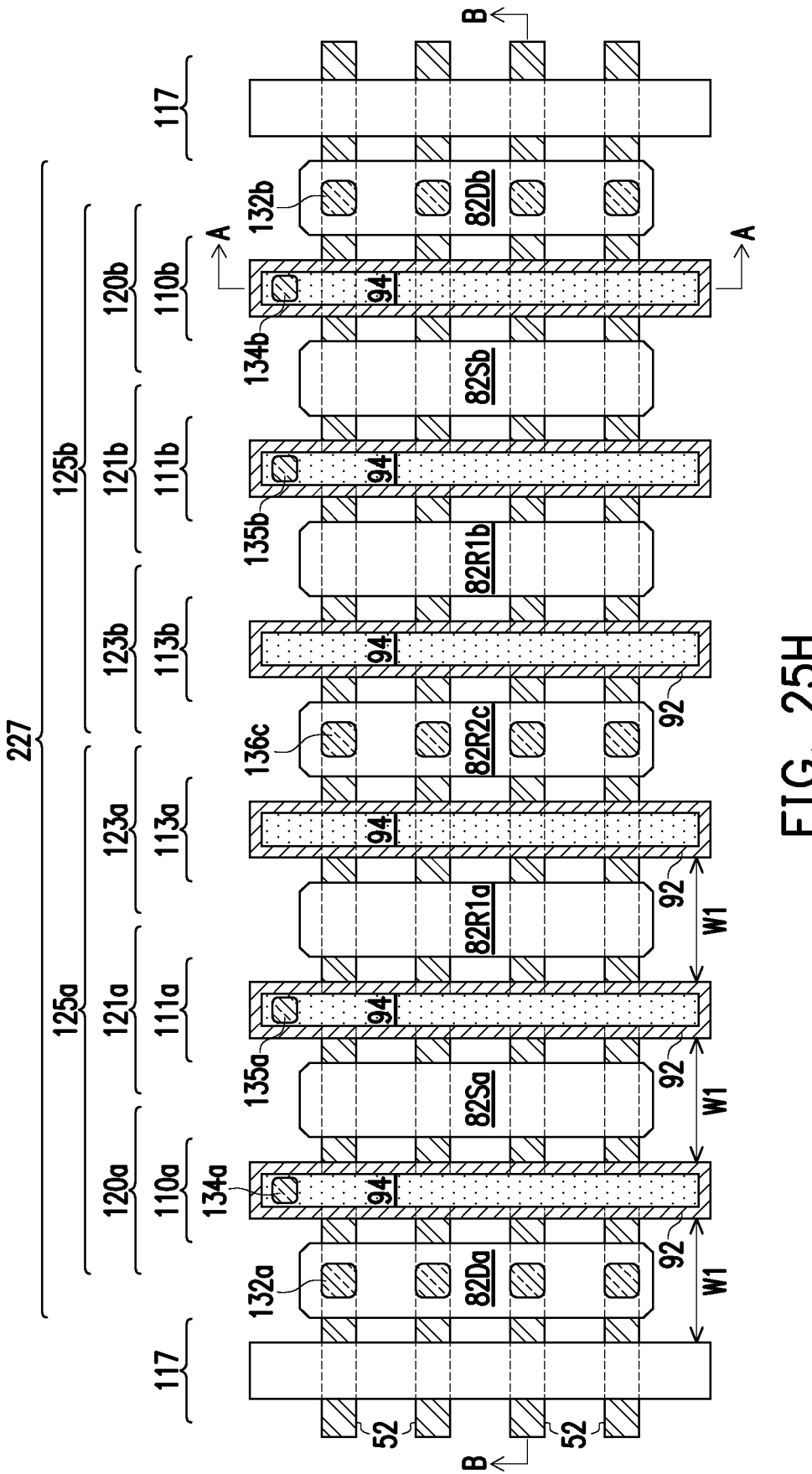
Figure 25I:
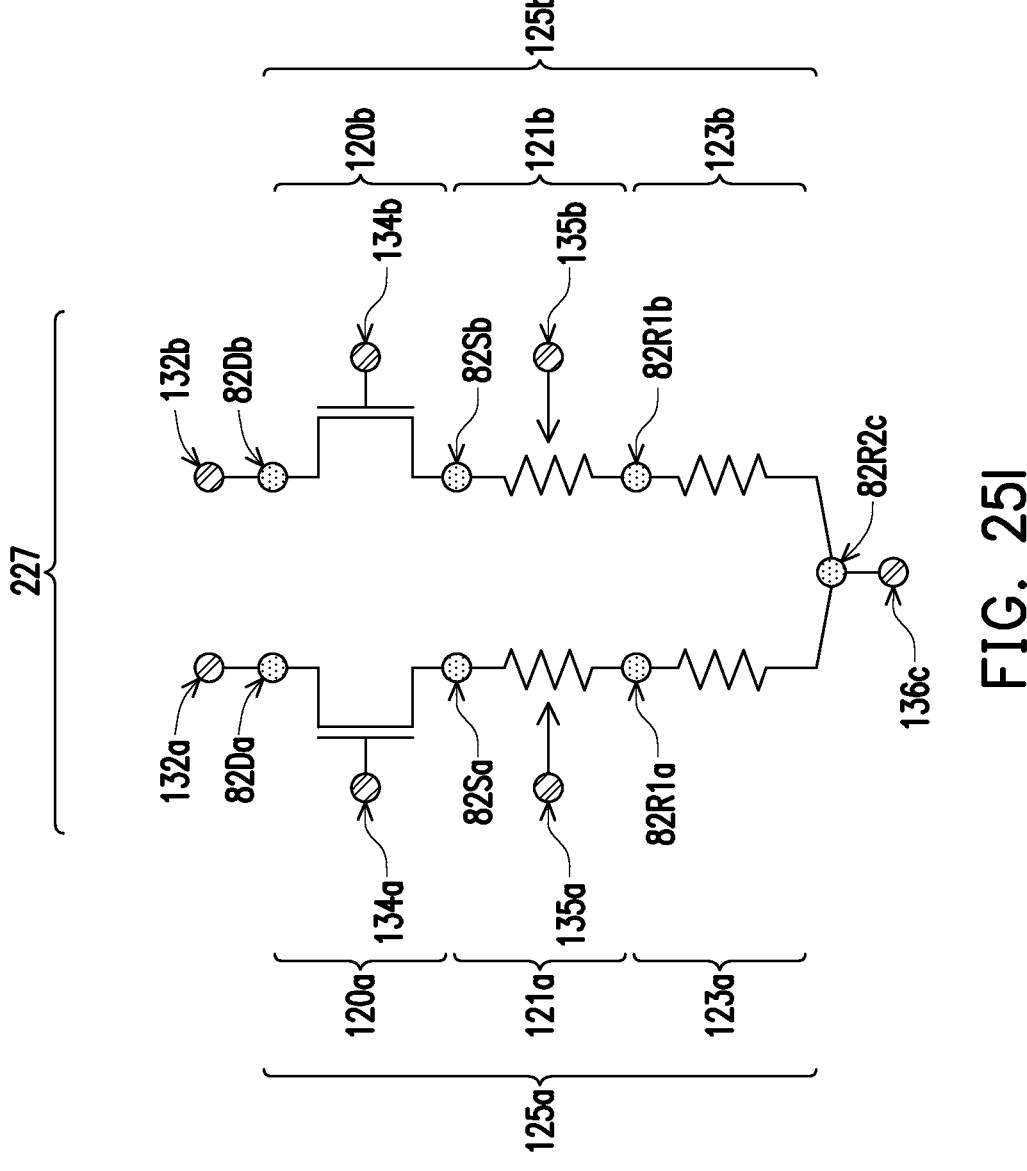
Figure 25J:
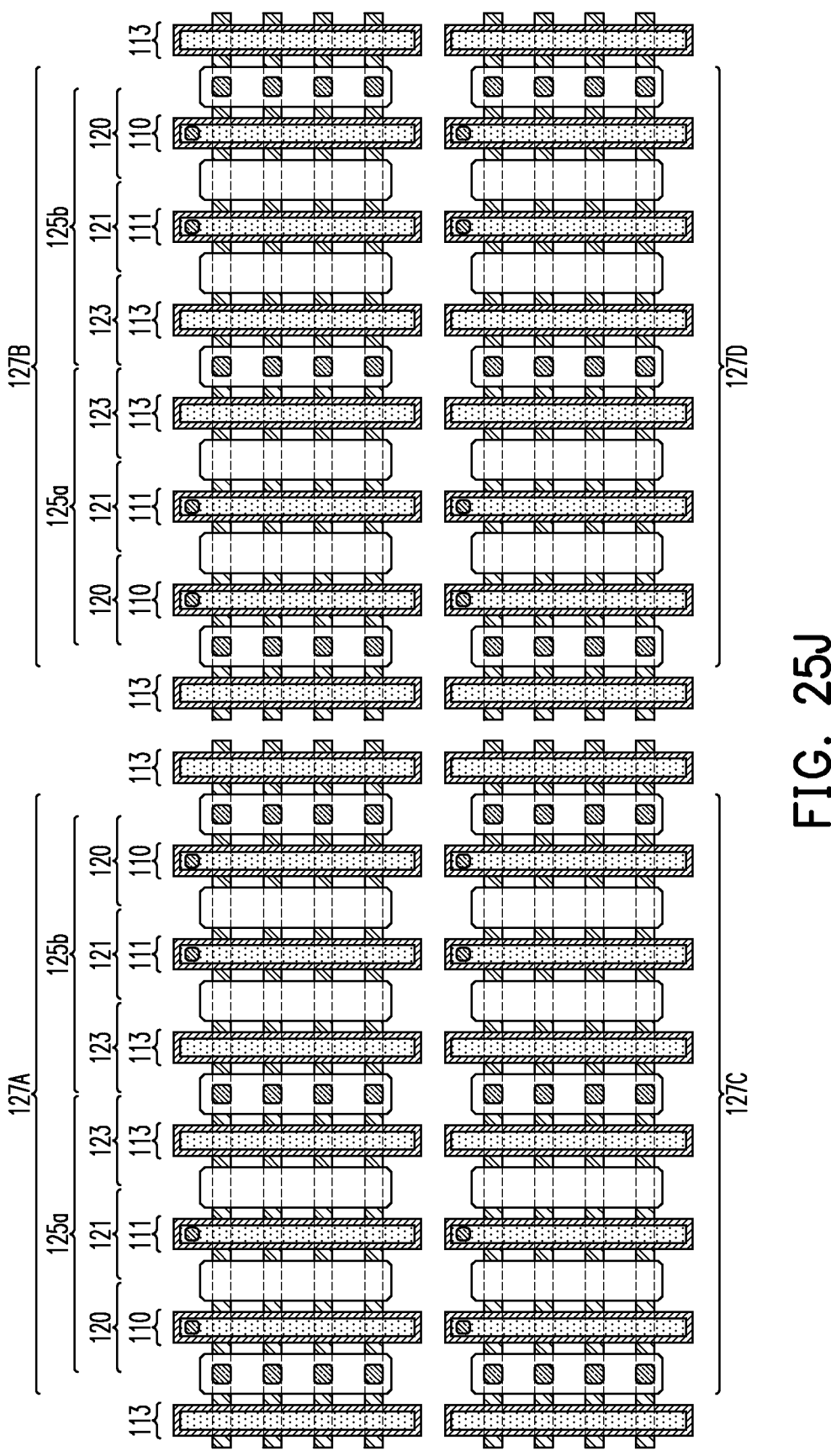
Figure 25K:
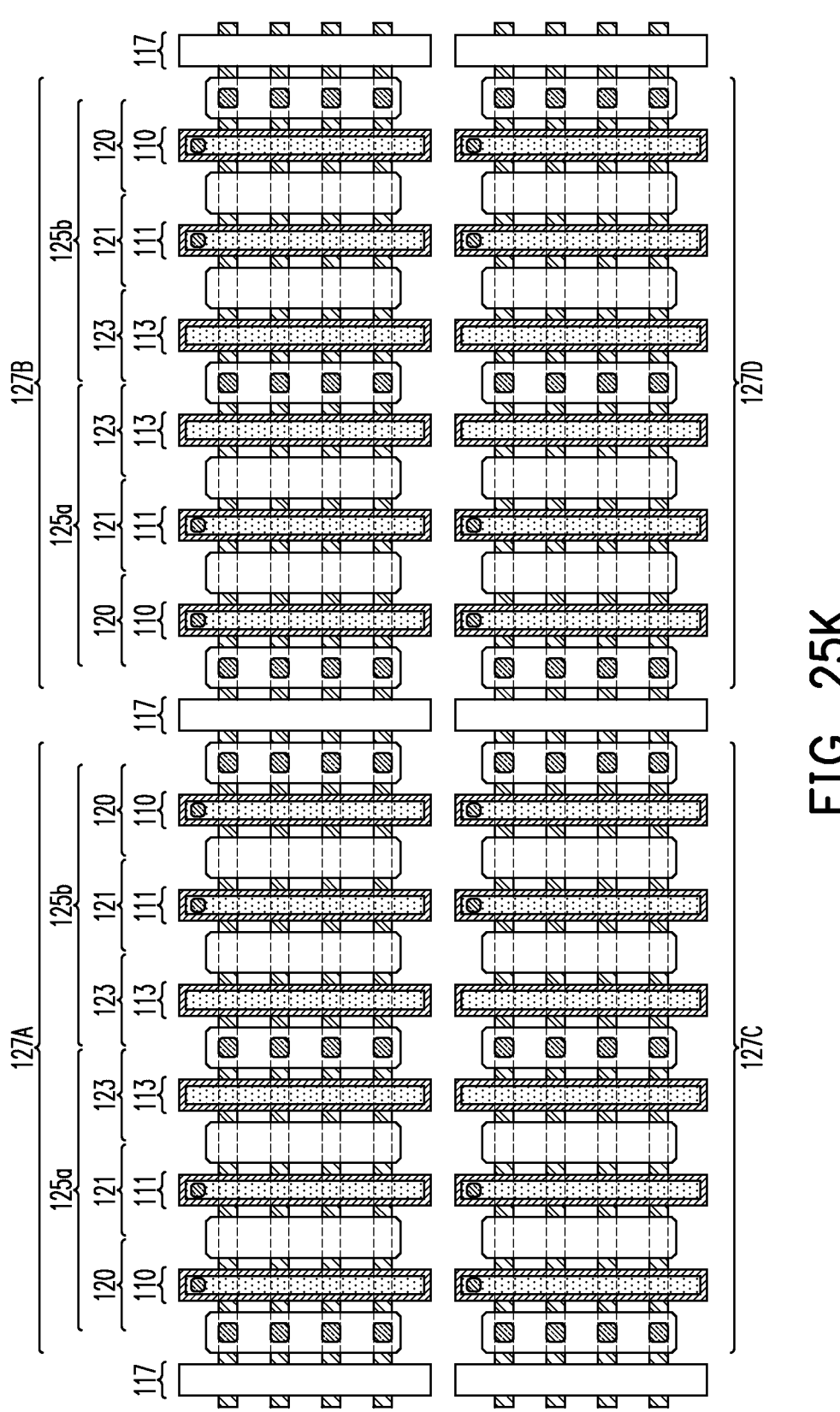

FIGS. 25A through 25K illustrate various views of embodiment devices utilizing a common epitaxial region contact 136c for two mirrored and adjacent SDT devices 125a and 125b. Embodiments utilize devices similar to the SDT devices 125 discussed above with respect to FIGS. 15A-15F and FIGS. 17A-17J, with like reference numbers correspond to like elements discussed above. Elements associated with the SDT device 125a have an 'a' appended to their reference label, elements associated with the SDT device 125b have a 'b' appended to their reference label, and elements which are common to both the SDT device 125a and the SDT device 125b have a 'c' appended to their reference label. For example, contacts 132a, 134a, 135a, and 136c; epitaxial regions 82Da, 82Sa, 82R1a, 82Rc, and 82R2c; gate structures 110a, 111a, and 113a; resistors 121a and 123a; and FinFET 120a are in SDT device 125a. Also, Contacts 132b, 134b, 135b, and 136c; epitaxial regions 82Db, 82Sb, 82R1b, 82Rc, and 82R2c; gate structures 110b, 111b, and 113b; resistors 121b and 123b; and FinFET 120b are in SDT device 125b. Such elements discussed generically in such a manner that applies to either device may have the 'a,' 'b,' or 'c' omitted during the discussion. The illustrated view of FIG. 25A may apply to the device in FIGS. 25B, and 25D, as well as the device in FIGS. 25H, 25I, and 25J. The illustrated embodiments of Figures through 25I and FIG. 25K illustrate embodiments where the edge dummy gate structures 113 of the SDT devices 125 have been removed and replaced with an insulating structure 117, such as described above with respect to FIGS. 20A through 23D. It should be understood that the depicted embodiments may also use SDT devices 125 where the edge dummy gate structures 113 have not been replaced by the insulating structures 117, such as illustrated in FIG. 25J.

FIGS. 25A, 25B, 25C, and 25D illustrate a coupled pair of source-degenerated transistor (SDT) devices 125a and 125b, in accordance with some embodiments. The source coupled pair of SDT devices 125a and 125b are collectively referred to as a source coupled SDT device 127. It should be understood that, although the term "source coupled SDT device" is used, it should be understood that embodiments may have any number of embedded active resistors 121 or embedded passive resistors 123 disposed between the source pick up contact (e.g., contact 136c) and the actual source region (e.g., epitaxial region 82Sa or epitaxial region 82Sb). FIG. 25D illustrates a simplified circuit schematic of the source coupled SDT device 127 shown in FIGS. 25A-25C. Each of the SDT devices 125a and 125b shown in FIGS. 25A-25D includes an active resistor 121 electrically coupled in series with the epitaxial source region 82S of a FinFET 120.

For example, the SDT device 125a includes a FinFET 120a comprising a channel region 58a between an epitaxial drain region 82Da and an epitaxial source region 82Sa, and an active resistor 121a comprising a conductive channel 59a between the epitaxial source region 82Sa and an epitaxial region 82Rc. The SDT device 125b includes a FinFET 120b comprising a channel region 58b between an epitaxial drain region 82Db and an epitaxial source region 82Sb, and an active resistor 121b comprising a conductive channel 59b between the epitaxial source region 82Sb and the epitaxial region 82Rc. The epitaxial region 82Rc is part of both the SDT device 125a and the SDT device 125b, and thus SDT devices 125a and 125b are electrically coupled together at the epitaxial region 82Rc to form the coupled SDT device 127.

Individually, each of the SDT devices 125a and 125b operate in a manner consistent with that illustrated and discussed above with respect to FIGS. 15A-15D, however, the techniques described herein allow for the formation of multiple SDT devices 125 that are electrically coupled at a single epitaxial region 82, which can allow for the formation of source-degenerated transistors at a greater density and without requiring additional process steps.

The active resistors 121a and 121b of the SDT device 125a and 125b may be similar or different. For example, the active resistors 121a and 121b may have similar or different doping profiles. A voltage applied to the control structure 111a of the active resistor 121a may be the same or different from a voltage applied to the control structure 111b of the active resistor 121b. The active resistors 121a and 121b of the SDT devices 125a and 125b of the coupled SDT device 127 may have similar resistances or different resistances. In some embodiments, only one of the coupled pair of SDT devices 125a and 125b includes an active resistor 121 (not illustrated), or the SDT device 125a may have a different number of active resistors 121 than the SDT device 125b. In this manner, the degeneration resistances of the SDT devices 125a and 125b may be similar or different.

FIGS. 25A-25D show an embodiment of SDT devices 125a-125b each having a single active resistor 121 (e.g., 121a and 121b), but in other embodiments, a SDT device 125 may have more than one active resistor 121 (see, e.g., FIGS. 15E and 15F). For example, a SDT device 125 may include two or more adjacent active resistors 121 disposed between the FinFET 120 and the epitaxial region contacts 136. Other configurations for the SDT devices 125a and 125b are contemplated as discussed above.

FIGS. 25E and 25F illustrate various plan view configurations of multiples of the coupled SDT device 127, in accordance with some embodiments. Similar to that discussed above with respect to FIGS. 19A and 19B and with respect to FIGS. 24A and 24B, fin cutting and/or gate cutting can separate fins 52, remove fins 52, separate gate structures (e.g., 110, 111, and 113) or remove gate structures, in accordance with some embodiments. As illustrated in FIG. 25E adjacent coupled SDT devices 127 include adjacent edge dummy gate structures 113 (see, e.g., FIGS. 19A and 19B). As illustrated in Figure adjacent coupled SDT devices 127 reduce the spacing by including only one insulating structure 117 (though more may be used) between adjacent coupled SDT devices 127 (e.g., 127A and 127B). The edge dummy gates 113 have been replaced with the insulating structures 117, such as described above with respect to FIGS. 20A-23C to allow for a more compact integration on a device workpiece.

The SDT devices 125a and 125b shown in FIGS. 25A-25D each include an active resistor 121 (e.g., 121A and 121B) that provides degeneration resistance, but in other embodiments the degeneration resistance of a SDT device 125 may be provided by a passive resistor 123 instead of or in addition to an active resistor 121. As an example, FIGS. 25G, 25H, and 25I illustrate a coupled pair of SDT devices 125a and 125b including passive resistors 123a and 123a and active resistors 121a and 121b, in accordance with some embodiments. FIG. 25I illustrates a simplified circuit schematic of the coupled SDT devices 127 shown in FIGS. 25G-25H. The SDT devices 125*a* and 125*b* shown in FIGS. 25G-25I are similar to the SDT devices 125*a* and 125*b* shown in FIGS. 25A-25D, except the SDT device 125*a* includes a passive resistor 123*a* formed in the fins 52 in addition to the active resistor 121*a*, and the SDT device 125*b* includes a passive resistor 123*b* formed in the fins 52 in addition to the active resistor 121*b*. Each passive resistor 123*a* and 123*b* is electrically coupled in series with a corresponding active resistor 121*a* and 121*b*, and thus the passive resistors 123*a* and 123*b* add to the degeneration resistance of the SDT devices 125*a* and 125*b*. A passive resistor 123 may be similar to an active resistor 121 as described herein, except that the resistance of the passive resistor 123 is substantially fixed and is not controlled by applying a control voltage.

As shown in FIG. 25G, the passive resistor 123*a* includes a conductive channel 259*a* between epitaxial resistor region 82R1*a* and epitaxial region 82R2*c* and the passive resistor 123*b* includes a conductive channel 259*b* between epitaxial resistor region 82R1*b* and epitaxial region 82R2*c*. A passive resistor 123 may include a single conductive channel 259 formed in one fin 52 or multiple conductive channels 259 formed in multiple fins 52. In some embodiments, one (or both) of the neighboring epitaxial regions 82 of a passive resistor 123 is also a neighboring epitaxial region 82 of an adjacent active resistor 121 (e.g. epitaxial resistor regions 82R1*a* and 82R1*b* in FIGS. 25G-25I), an adjacent FinFET 120, or another passive resistor 123.

FIGS. 25J and 25K illustrate various plan view configurations of multiples of the coupled SDT device 127, in accordance with some embodiments. Similar to that discussed above with respect to FIGS. 19A and 19B and with respect to FIGS. 24A and 24B, fin cutting and/or gate cutting can separate fins 52, remove fins 52, separate gate structures (e.g., 110, 111, and 113) or remove gate structures, in accordance with some embodiments. FIGS. 25J and 25K are similar to FIGS. 25E and 25F, discussed above, except that the coupled SDT devices 127 used in FIGS. 25J and 25K correspond as an example from the coupled SDT devices 127 illustrated in FIGS. 25G-25I. As illustrated in FIG. 25G adjacent coupled SDT devices 127 (e.g., 127A and 127B) include adjacent edge dummy gate structures 113 (see, e.g., FIGS. 19A and 19B). As illustrated in FIG. 25I adjacent coupled SDT devices 127 reduce the spacing by including only one insulating structure 117 (though more may be used) between adjacent coupled SDT devices 127 (e.g., 127A and 127B). The edge dummy gates 113 have been replaced with the insulating structures 117, such as described above with respect to FIGS. 20A-23C to allow for a more compact integration on a device workpiece.

Figure 26A:
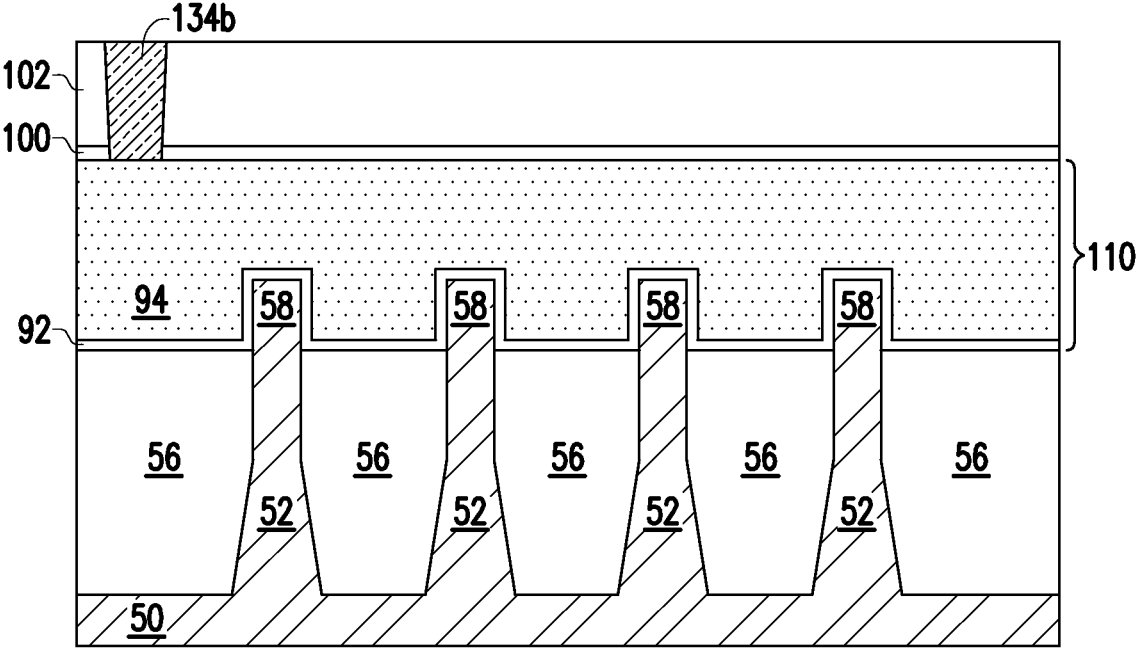
FIGS. 26A, 26B, 26C, 26E, 26F, 26G, 26H, 26J, and 26K are various views of intermediate stages in the manufacturing of transistor devices with active resistors and/or passive resistors with a shared drain, in accordance with some embodiments.
Figure 26B:
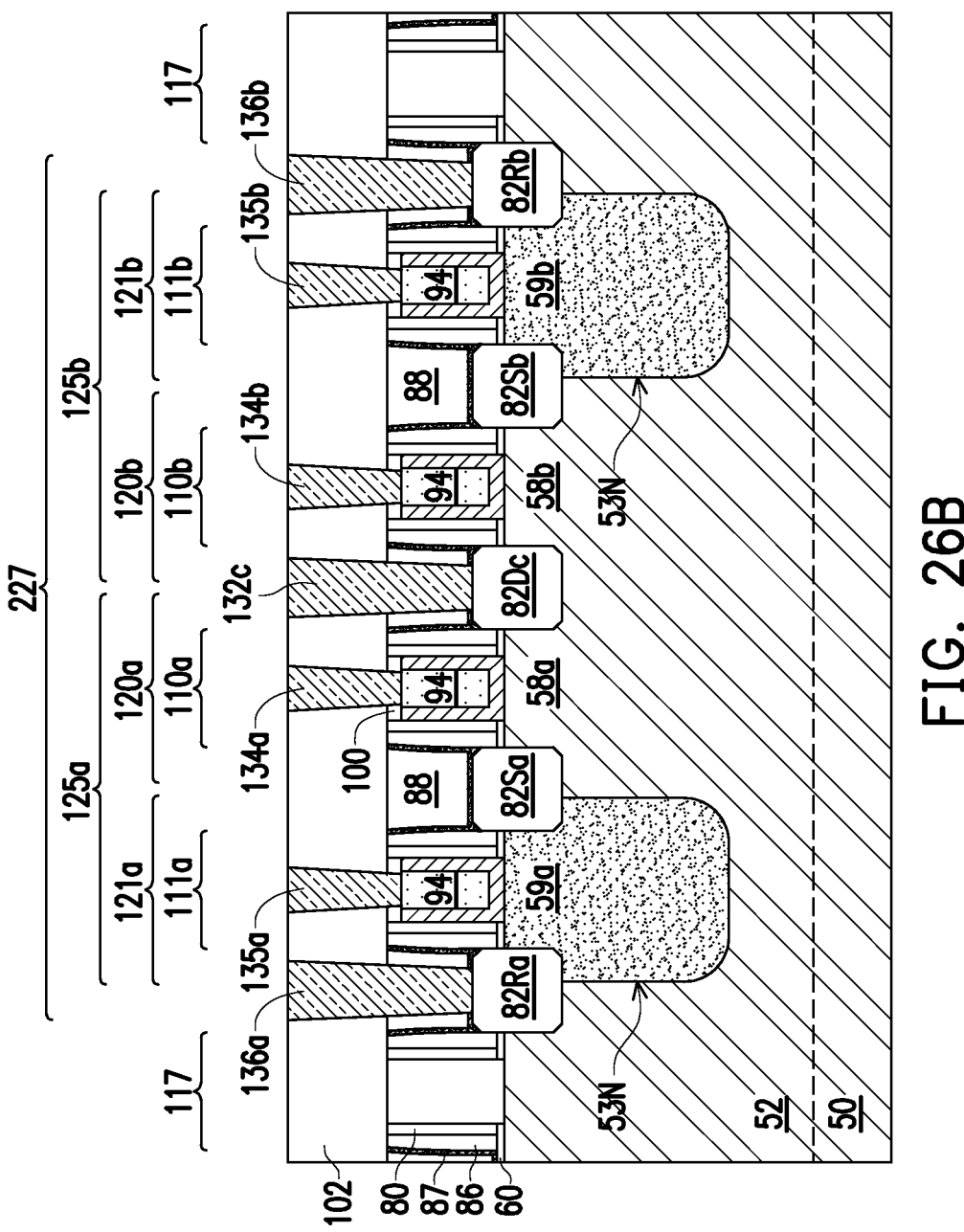
Figure 26C:
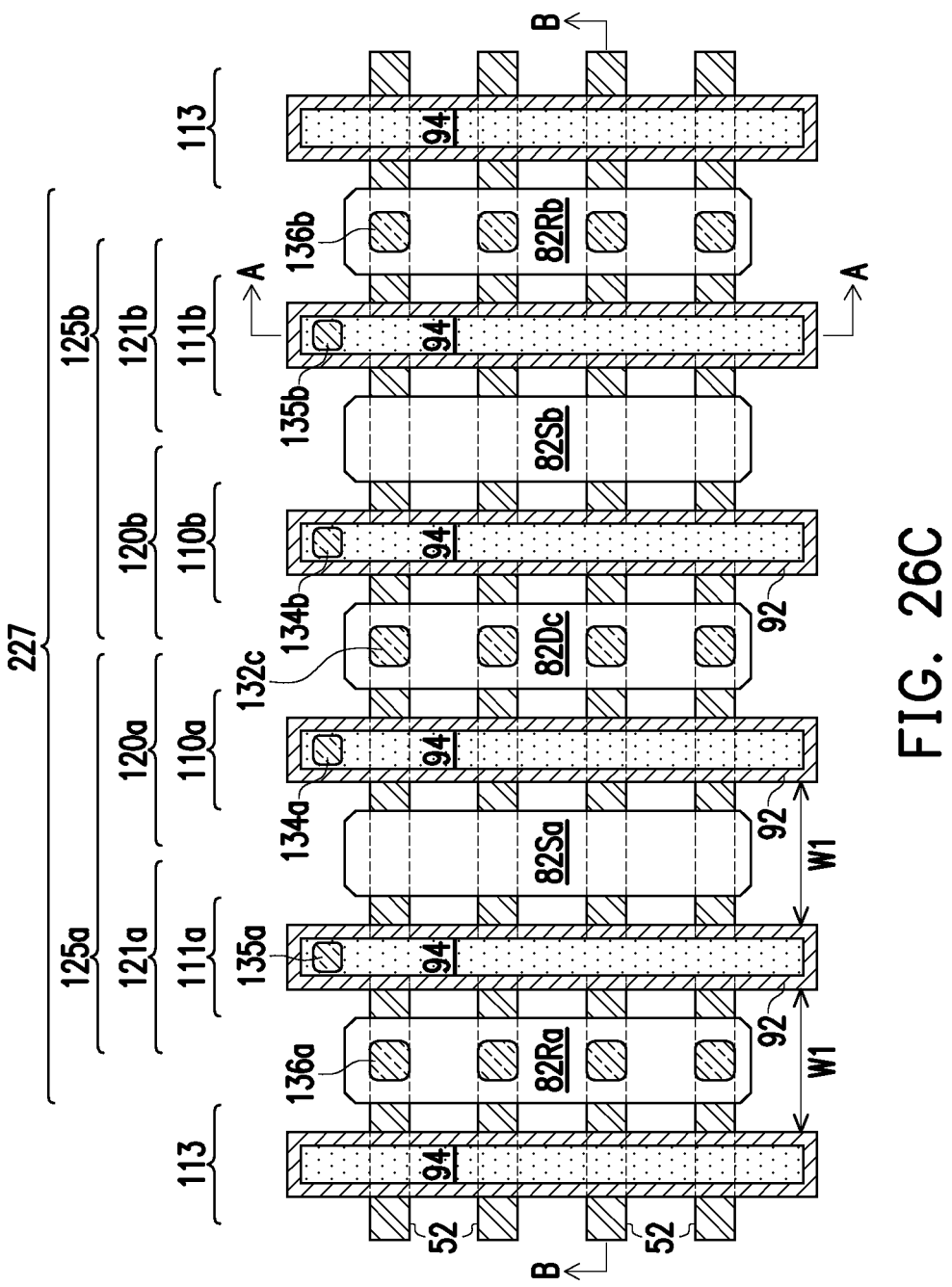
Figure 26D:
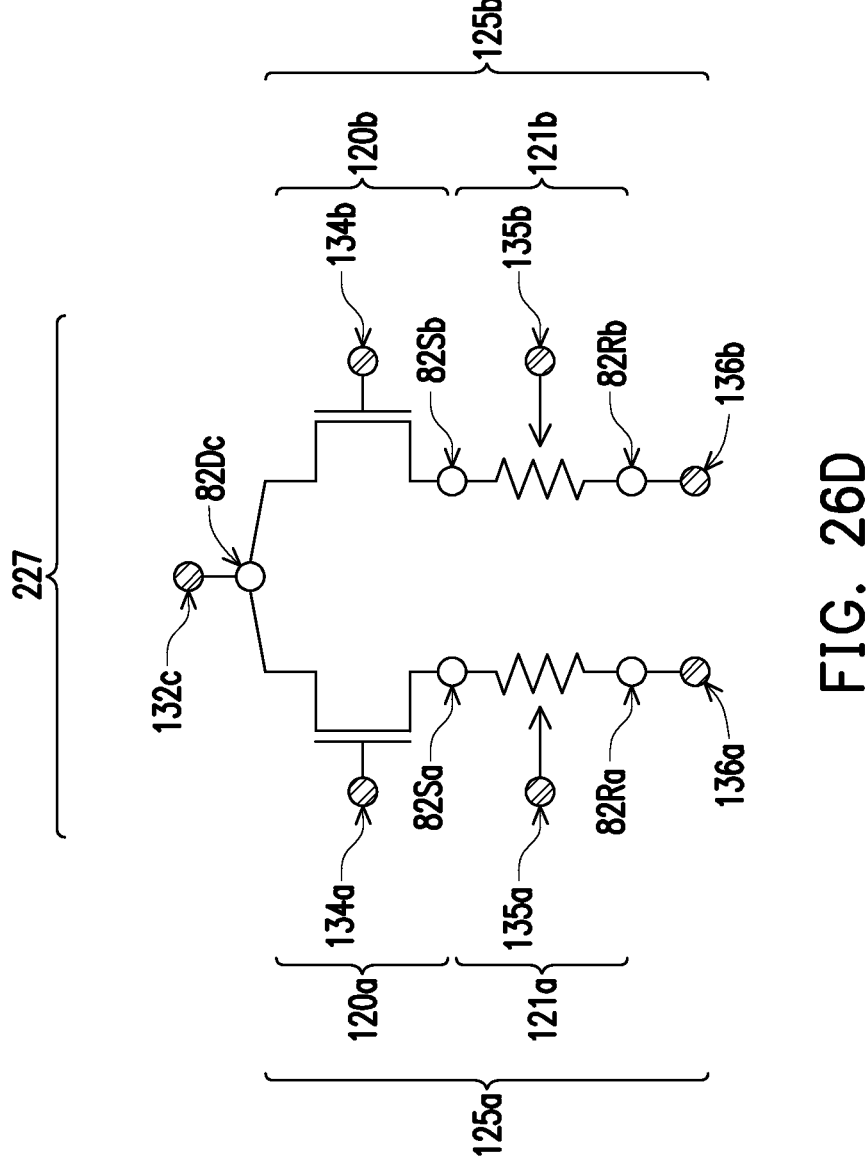
FIGS. 26D and 26I are schematics of such transistor devices, in accordance with some embodiments.
Figure 26E:
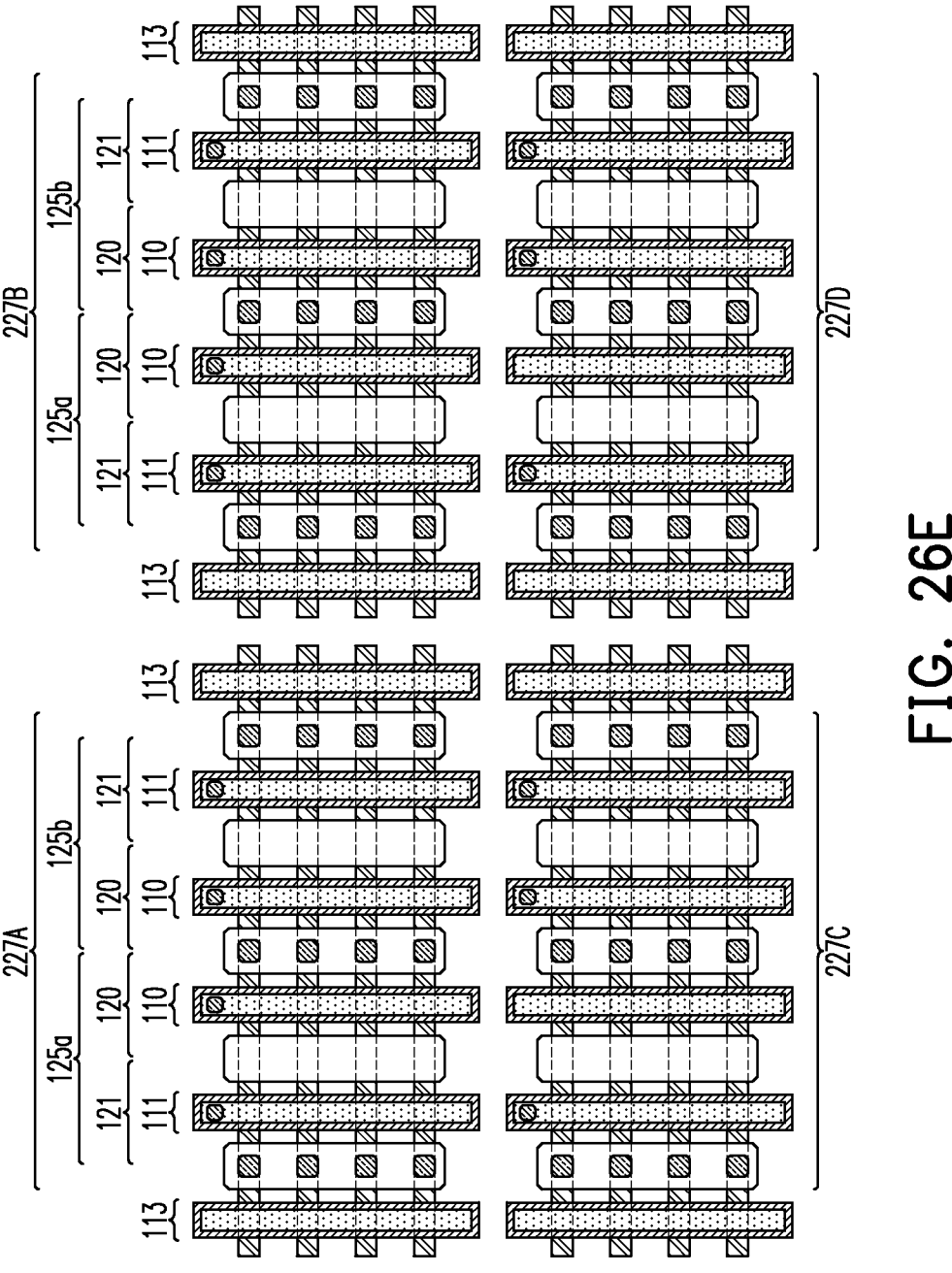
Figure 26F:
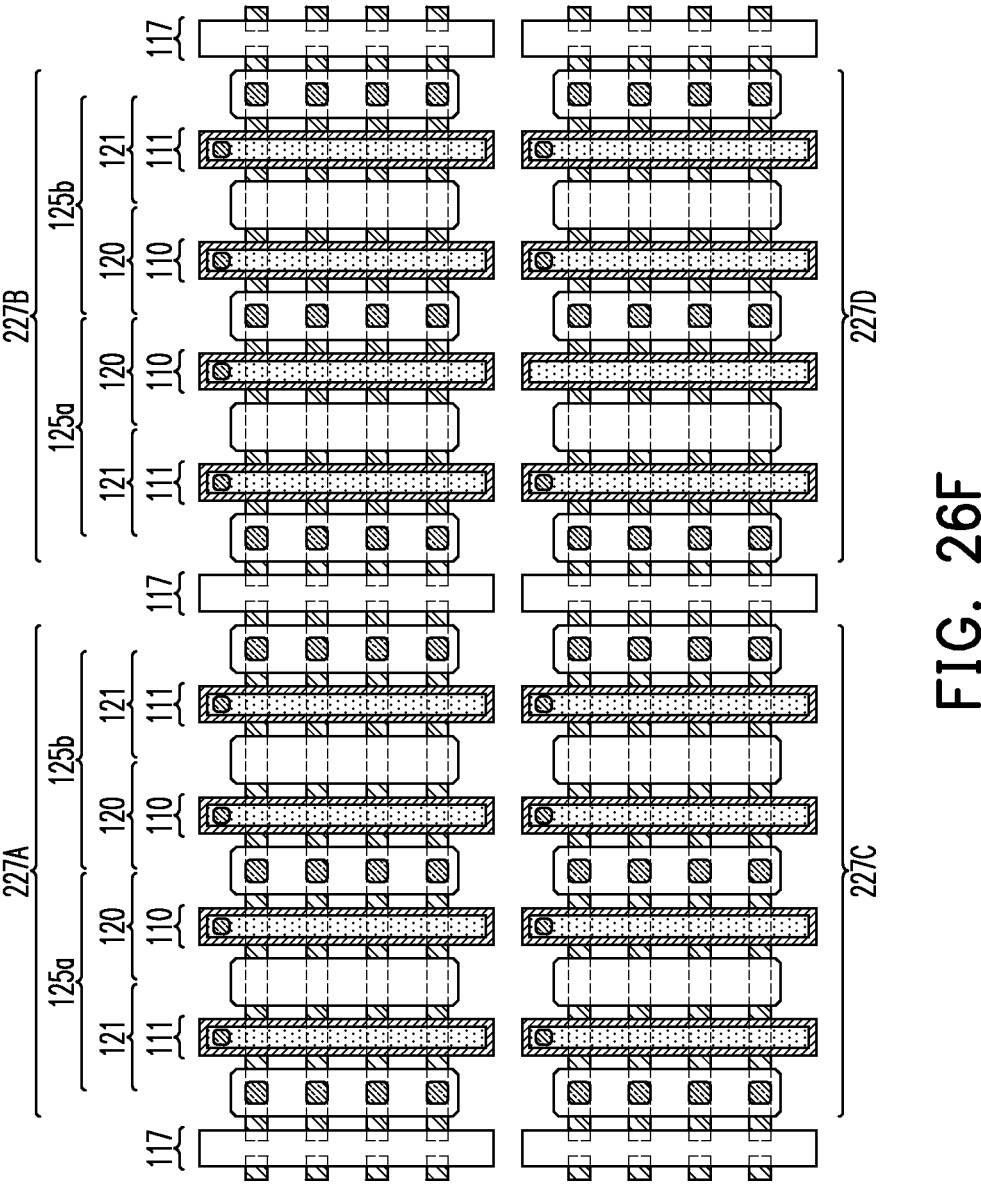
Figure 26G:
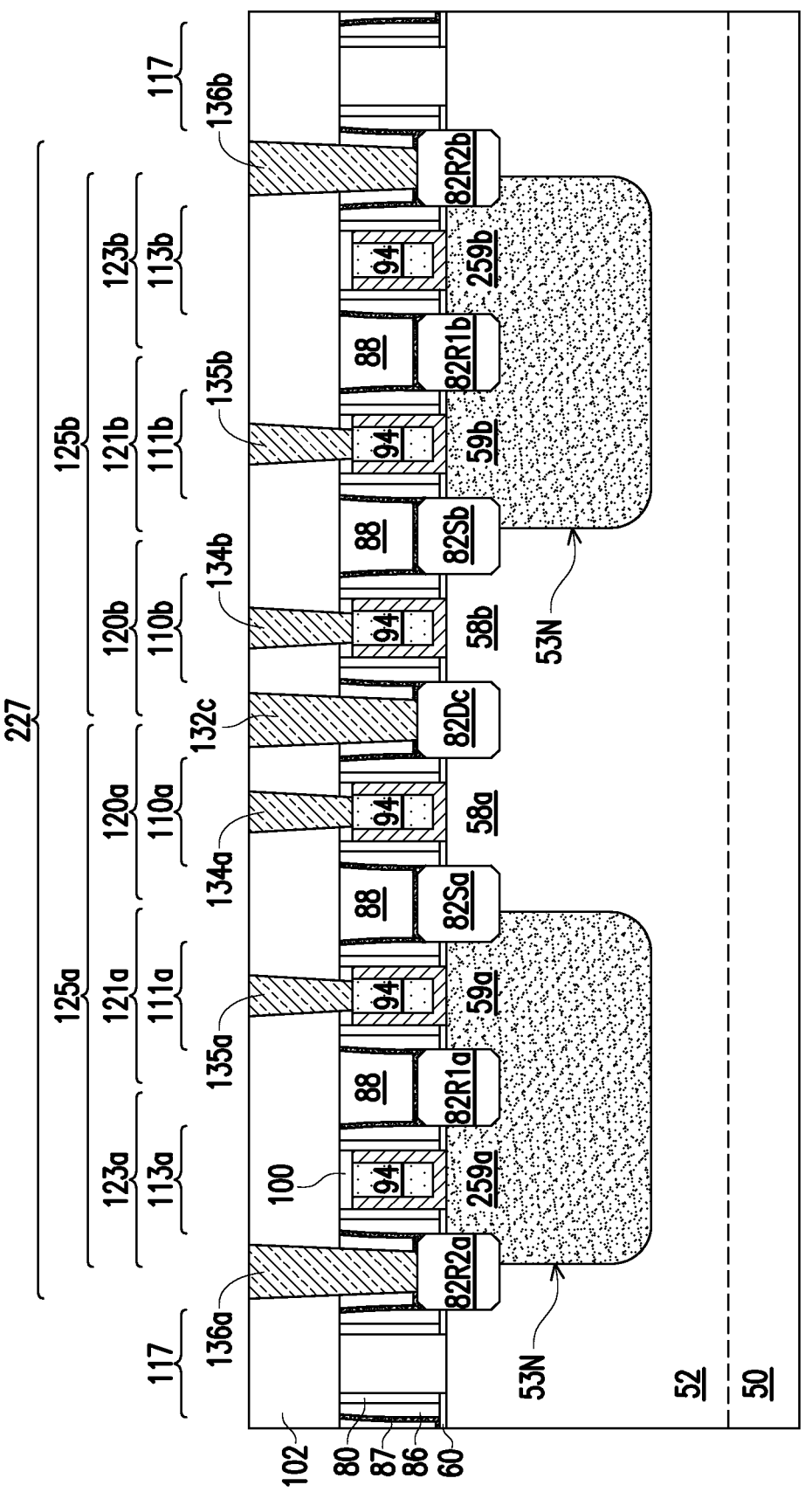
Figure 26H:
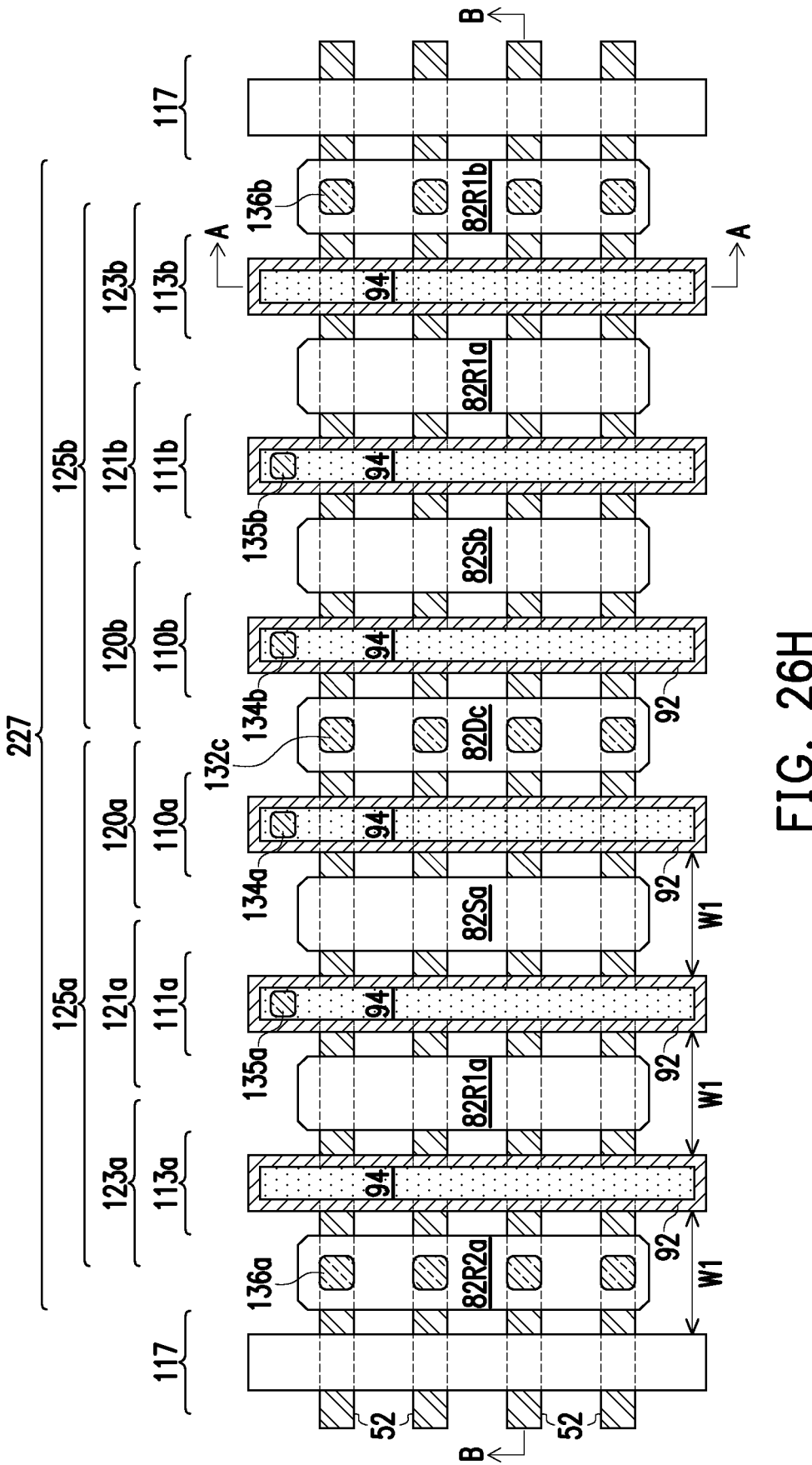
Figure 26I:
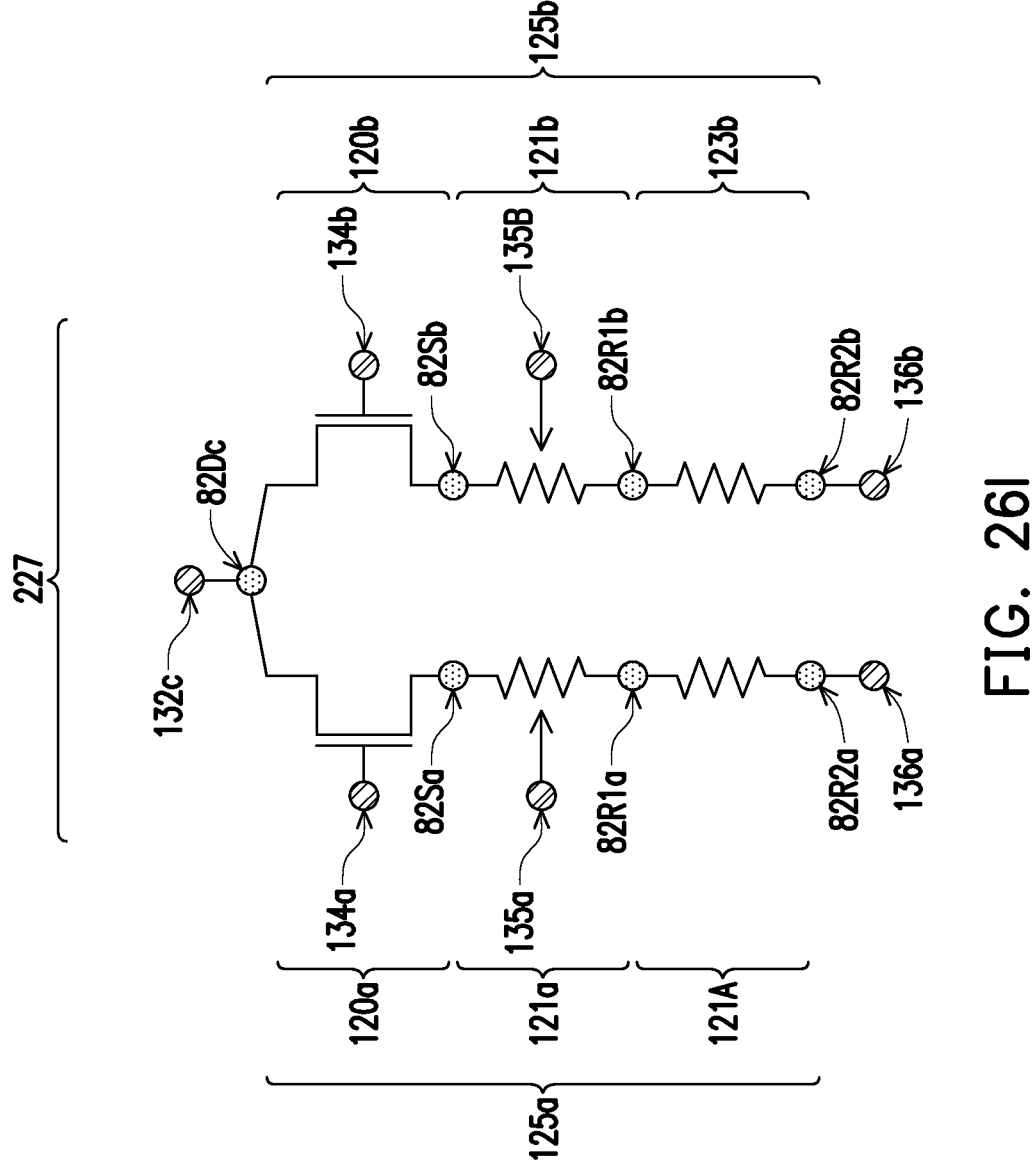
Figure 26J:
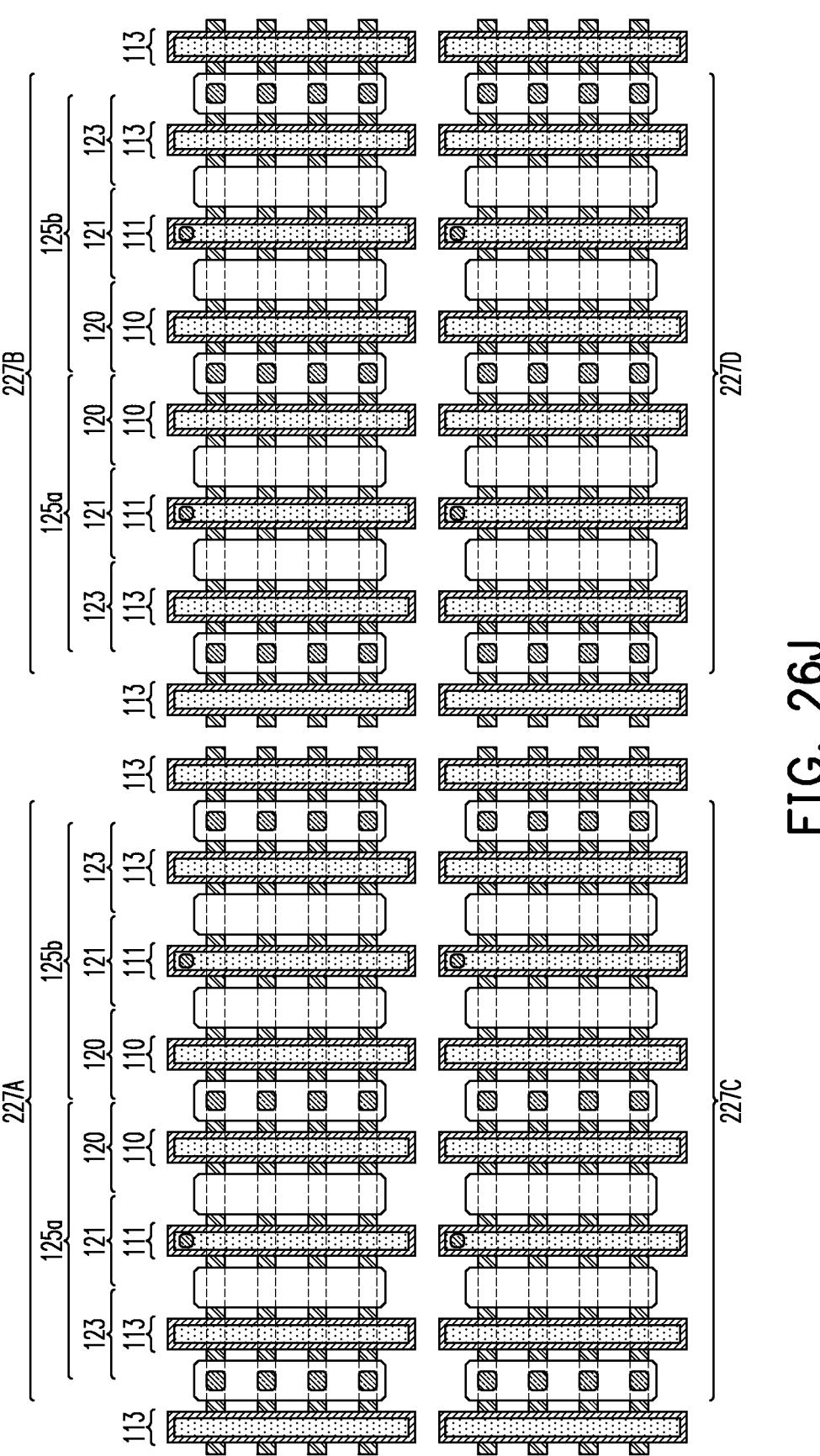

FIGS. 26A through 26K illustrate various views of embodiment devices utilizing a common epitaxial region 82Dc and contact 132*c* for two mirrored and adjacent SDT devices 125*a* and 125*b*. The SDT devices 125*a* and 125*b* shown in FIGS. 26A-26K are similar to the SDT devices 125*a* and 125*b* shown in FIGS. 25A-25K, except the currently described SDT devices 125*a* and 125*b* are coupled at an epitaxial drain region 82Dc shared by both FinFETs 120*a* and 120*b* instead of being coupled at an epitaxial region shared by two resistors (active resistor 121 and/or passive resistor 123). Embodiments utilize devices similar to the SDT devices 125 discussed above with respect to FIGS. 15A-15F and FIGS. 17A-17J, with like reference numbers correspond to like elements discussed above. Elements associated with the SDT device 125*a* have an 'a' appended to their reference label, elements associated with the SDT device 125*b* have a 'b' appended to their reference label, and elements which are common to both the SDT device 125*a* and the SDT device 125*b* have a 'c' appended to their reference label. For example, contacts 132*c*, 134*a*, 135*a*, and 136*a*; epitaxial regions 82Dc, 82Sa, 82Ra, 82R1*a*, and 82R2*a*; gate structures 110*a*, 111*a*, and 113*a*; resistors 121*a* and 123*a*; and FinFET 120*a* are in SDT device 125*a*. Also, contacts 132*c*, 134*b*, 135*b*, and 136*b*; epitaxial regions 82Dc, 82Sb, 82Rb, 82R1*b*, and 82R2*b*; gate structures 110*b*, 111*b*, and 113*b*; resistors 121*b* and 123*b*; and FinFET 120*b* are in SDT device 125*b*. Such elements discussed generically in such a manner that applies to either device may have the 'a,' 'b,' or 'c' omitted during the discussion. The illustrated view of FIG. 26A may apply to the device in FIGS. 26B, 26C, and 26D, as well as the device in FIGS. 26H, 26I, and 26J. The illustrated embodiments of FIGS. 26A through 26I and FIG. 26K illustrate embodiments where the edge dummy gate structures 113 of the SDT devices 125 have been removed and replaced with an insulating structure 117, such as described above with respect to FIGS. 20A through 23D. It should be understood that the depicted embodiments may also use SDT devices 125 where the edge dummy gate structures 113 have not been replaced by the insulating structures 117, such as illustrated in FIG. 26J.

FIGS. 26A, 26B, 26C, and 26D illustrate a coupled pair of source-degenerated transistor (SDT) devices 125*a* and 125*b*, in accordance with some embodiments. The drain coupled pair of SDT devices 125*a* and 125*b* are collectively referred to as a drain coupled SDT device 227. FIG. 26D illustrates a simplified circuit schematic of the source coupled SDT device 127 shown in FIGS. 26A-26C. Each of the SDT devices 125*a* and 125*b* shown in FIGS. 26A-26D includes an active resistor 121 electrically coupled in series with the epitaxial source region 82S of a FinFET 120.

For example, the SDT device 125*a* includes a FinFET 120*a* comprising a channel region 58*a* between an epitaxial drain region 82Dc and an epitaxial source region 82Sa, and an active resistor 121*a* comprising a conductive channel 59*a* between the epitaxial source region 82Sa and an epitaxial region 82Rc. The SDT device 125*b* includes a FinFET 120*b* comprising a channel region 58*b* between an epitaxial drain region 82Db and an epitaxial source region 82Sb, and an active resistor 121*b* comprising a conductive channel 59*b* between the epitaxial source region 82Sb and the epitaxial region 82Rc. The epitaxial region 82Dc is part of both the SDT device 125*a* and the SDT device 125*b*, and thus the SDT devices 125*a* and 125*b* are electrically coupled together at the epitaxial region 82Dc to form the drain coupled SDT device 227. The pitch between the control structure 111*a* and the epitaxial region 82Dc of the FinFET 120*a* may be tunable, for example by adjusting the dummy gate pitch, and may be between about 30 nm and 100 nm; likewise, the pitch between the control structure 111*b* and the epitaxial region 82Dc of the FinFET 120*b* may be tunable and may be between about 30 nm and 100 nm.

Individually, each of the SDT devices 125*a* and 125*b* operate in a manner consistent with that illustrated and discussed above with respect to FIGS. 15A-15D, however, the techniques described herein allow for the formation of multiple SDT devices 125 that are electrically coupled at a single epitaxial region 82, which can allow for the formation of source-degenerated transistors at a greater density and without requiring additional process steps.

The active resistors 121*a* and 121*b* of the SDT device 125*a* and 125*b* may be similar or different. For example, the active resistors 121*a* and 121*b* may have similar or different doping profiles. A voltage applied to the control structure 111*a* of the active resistor 121*a* may be the same or different from a voltage applied to the control structure 111*b* of the active resistor 121*b*. The active resistors 121*a* and 121*b* of the SDT devices 125*a* and 125*b* of the coupled SDT device 127 may have similar resistances or different resistances. In some embodiments, only one of the coupled pair of SDT devices 125*a* and 125*b* includes an active resistor 121 (not illustrated), or the SDT device 125*a* may have a different number of active resistors 121 than the SDT device 125*b*. In this manner, the degeneration resistances of the SDT devices 125*a* and 125*b* may be similar or different.

FIGS. 26A-26D show an embodiment of SDT devices 125*a* and 125*b* each having a single active resistor 121 (e.g., 121*a* and 121*b*), but in other embodiments, a SDT device 125 may have more than one active resistor 121 (see, e.g., FIGS. 15E and 15F). For example, a SDT device 125 may include two or more adjacent active resistors 121 disposed between the FinFET 120 and the epitaxial region contacts 136. Other configurations for the SDT devices 125*a* and 125*b* are contemplated as discussed above.

FIGS. 26E and 26F illustrate various plan view configurations of multiples of the coupled SDT device 227, in accordance with some embodiments. Similar to that discussed above with respect to FIGS. 19A and 19B and with respect to FIGS. 24A and 24B, fin cutting and/or gate cutting can separate fins 52, remove fins 52, separate gate structures (e.g., 110, 111, and 113) or remove gate structures, in accordance with some embodiments. As illustrated in FIG. 26E adjacent coupled SDT devices 227 include adjacent edge dummy gate structures 113 (see, e.g., FIGS. 19A and 19B). As illustrated in FIG. 26F adjacent coupled SDT devices 227 reduce the spacing by including only one insulating structure 117 (though more may be used) between adjacent drain coupled SDT devices 227 (e.g., 227A and 227B). The edge dummy gates 113 have been replaced with the insulating structures 117, such as described above with respect to FIGS. 20A-23C to allow for a more compact integration on a device workpiece.

The SDT devices 125*a* and 125*b* shown in FIGS. 26A-26D each include an active resistor 121 (e.g., 121A and 121B) that provides degeneration resistance, but in other embodiments the degeneration resistance of a SDT device 125 may be provided by a passive resistor 123 instead of or in addition to an active resistor 121. As an example, FIGS. 26G, 26H, and 26I illustrate a coupled pair of SDT devices 125*a* and 125*b* including passive resistors 123*a* and 123*a* and active resistors 121*a* and 121*b*, in accordance with some embodiments. FIG. 26I illustrates a simplified circuit schematic of the coupled SDT devices 127 shown in FIGS. 26G-26H. The SDT devices 125*a* and 125*b* shown in FIGS. 26G-26I are similar to the SDT devices 125*a* and 125*b* shown in FIGS. 26A-26D, except the SDT device 125*a* includes a passive resistor 123*a* formed in the fins 52 in addition to the active resistor 121*a*, and the SDT device 125*b* includes a passive resistor 123*b* formed in the fins 52 in addition to the active resistor 121*b*. Each passive resistor 123*a* and 123*b* is electrically coupled in series with a corresponding active resistor 121*a* and 121*b*, and thus the passive resistors 123*a* and 123*b* add to the degeneration resistance of the SDT devices 125*a* and 125*b*. A passive resistor 123 may be similar to an active resistor 121 as described herein, except that the resistance of the passive resistor 123 is substantially fixed and is not controlled by applying a control voltage.

As shown in FIG. 26G, the passive resistor 123*a* includes a conductive channel 259*a* between epitaxial resistor region

82R1*a* and epitaxial region 82R2*a* and the passive resistor 123*b* includes a conductive channel 259*b* between epitaxial resistor region 82R1*b* and epitaxial region 82R2*b*. A passive resistor 123 may include a single conductive channel 259 formed in one fin 52 or multiple conductive channels 259 formed in multiple fins 52. In some embodiments, one (or both) of the neighboring epitaxial regions 82 of a passive resistor 123 is also a neighboring epitaxial region 82 of an adjacent active resistor 121 (e.g. epitaxial resistor regions 82R1*a* and 82R1*b* in FIGS. 26G-26I), an adjacent FinFET 120, or another passive resistor 123.

Figure 26K:
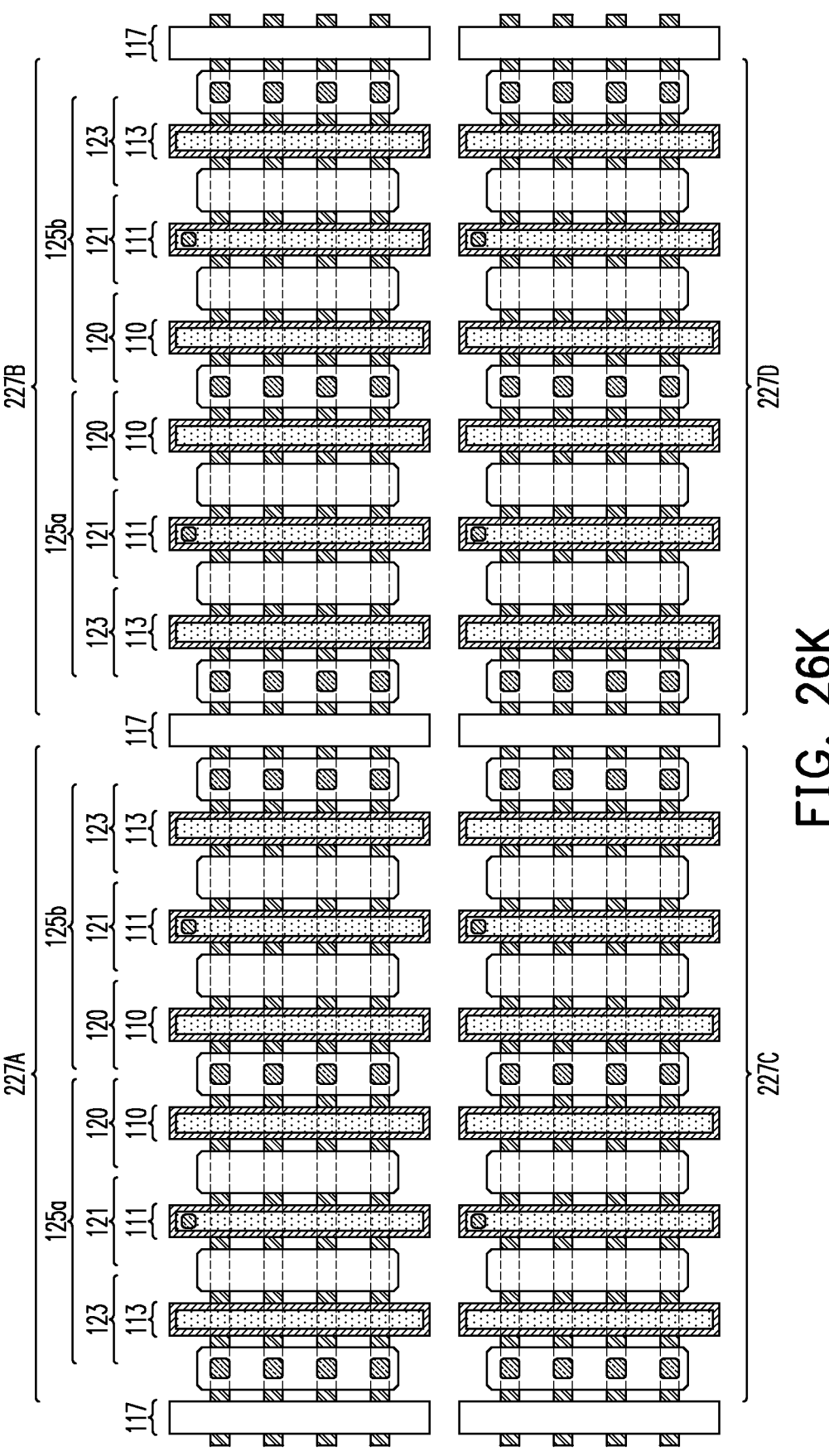

FIGS. 26J and 26K illustrate various plan view configurations of multiples of the coupled SDT device 227, in accordance with some embodiments. Similar to that discussed above with respect to FIGS. 19A and 19B and with respect to FIGS. 24A and 24B, fin cutting and/or gate cutting can separate fins 52, remove fins 52, separate gate structures (e.g., 110, 111, and 113) or remove gate structures, in accordance with some embodiments. FIGS. 26J and 26K are similar to FIGS. 26E and 26F, discussed above, except that the coupled SDT devices 227 used in FIGS. 26J and 26K correspond as an example from the coupled SDT devices 227 illustrated in FIGS. 26G-26I. As illustrated in FIG. 26G adjacent coupled SDT devices 227 (e.g., 227A and 227B) include adjacent edge dummy gate structures 113 (see, e.g., FIGS. 19A and 19B). As illustrated in FIG. 26I adjacent coupled SDT devices 227 reduce the spacing by including only one insulating structure 217 (though more may be used) between adjacent drain coupled SDT devices 227 (e.g., 227A and 227B). The edge dummy gates 113 have been replaced with the insulating structures 117, such as described above with respect to FIGS. 20A-23C to allow for a more compact integration on a device workpiece.

More than two SDT devices may be coupled in other embodiments. As an example, FIGS. 27A-27E illustrate an embodiment in which four SDT devices 125*a*, 125*b*, 125*c*, and 125*d* are coupled together to form multi-coupled SDT device 327. In other embodiments, three SDT devices or more than four SDT devices may be coupled together. The SDT devices 125*a* through 125*d* of FIGS. 27A-27E are similar to the SDT devices 125 of FIGS. 15A-15F and FIGS. 17A-17J, with like reference numbers correspond to like elements discussed above. Elements associated with the SDT device 125*a* have an 'a' appended to their reference label, elements associated with the SDT device 125*b* have a 'b' appended to their reference label, elements associated with the SDT device 125*c* have a 'c' appended to their reference label, elements associated with the SDT device 125*b* have a 'd' appended to their reference label, and elements which are common to adjacent coupled SDT devices 125*a*, 125*b*, 125*c*, or 125*d* list both applicable labels for each shared element. For example, contacts 132*a*, 134*a*, 135*a*, and 136*a*; epitaxial regions 82D*a*, 82S*a*, 82R1*a*, and 82R2*a*; gate structures 110*a*, 111*a*, and 113*a*; resistors 121*a* and 123*a*; conductive channels 59*a* and 259*a*; and FinFET 120*a* are in SDT device 125*a*. Contacts 132*b*, 134*b*, 135*b*, and 136*b*; epitaxial regions 82Db, 82Sb, 82R1*b*, and 82R2*b*; gate structures 110*b*, 111*b*, and 113*b*; resistors 121*b* and 123*b*; conductive channels 59*b* and 259*b*; and FinFET 120*b* are in SDT device 125*b*. Contacts 132*c*, 134*c*, 135*c*, and 136*c*; epitaxial regions 82Dc, 82Sc, 82R1*c*, and 82R2*c*; gate structures 110*c*, 111*c*, and 113*c*; resistors 121*c* and 123*c*; conductive channels 59*c* and 259*c*; and FinFET 120*c* are in SDT device 125*c*. Finally, contacts 132*d*, 134*d*, 135*d*, and 136*d*; and epitaxial regions 82Dd, 82Sd, 82R1*d*, and 82R2*d*; gate structures 110*d*, 111*d*, and 113*d*; resistors 121*d* and 123*d*; conductive channels 59*d* and 259*d*; and FinFET 120*d* are in SDT device 125*d*. Some of these elements are shared between devices, as discussed below. These elements may be discussed generically in such a manner that applies to any of the SDT devices 125*a*, 125*b*, 125*c*, or 125*d* and may have the 'a,' 'b,' 'c,' or 'd' omitted during the discussion. One or more of the SDT devices 125*a*, 125*b*, 125*c*, and/or 125*d* may be the same or may have a different configuration. For example, one or more of the SDT devices 125*a*, 125*b*, 125*c*, and/or 125*d* may have a different number of active resistors 121 and/or passive resistors 123 and/or may have different doping profiles in the channels 58, 59, or 259. All suitable combinations and configurations of coupled SDT devices and the FinFETs, active resistors, or passive resistors therein are within the scope of the present disclosure.

Figure 27A:
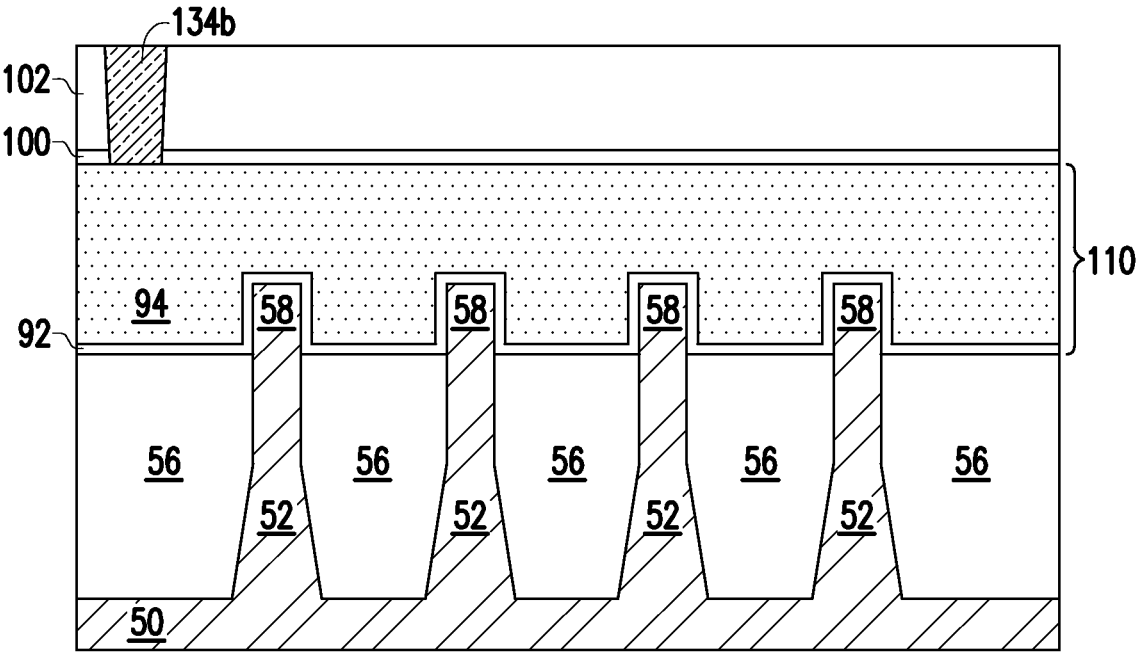
FIGS. 27A, 27B, 27C, and 27E, are various views of intermediate stages in the manufacturing of transistor devices with active resistors and/or passive resistors with a shared source and shared drain, in accordance with some embodiments.
Figure 27B:
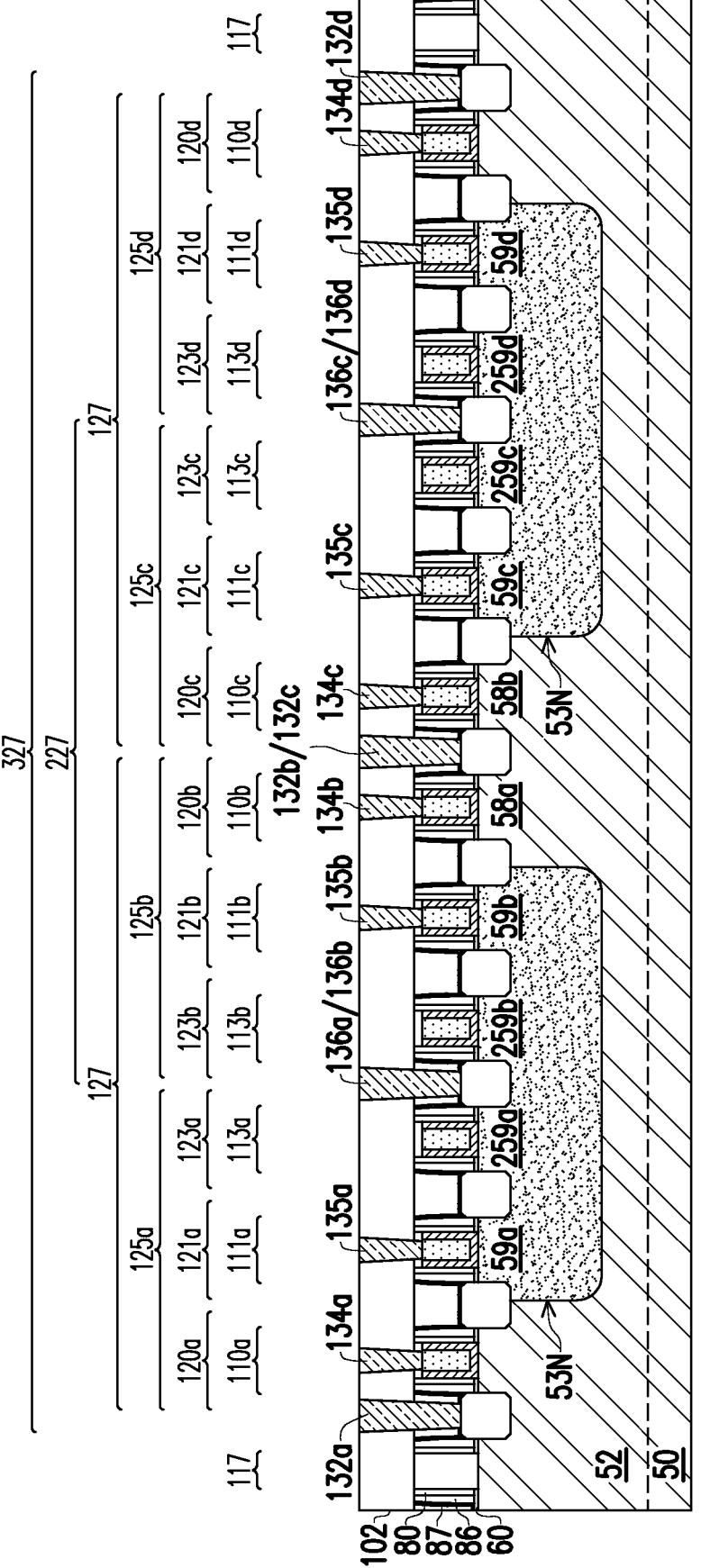
Figure 27C:
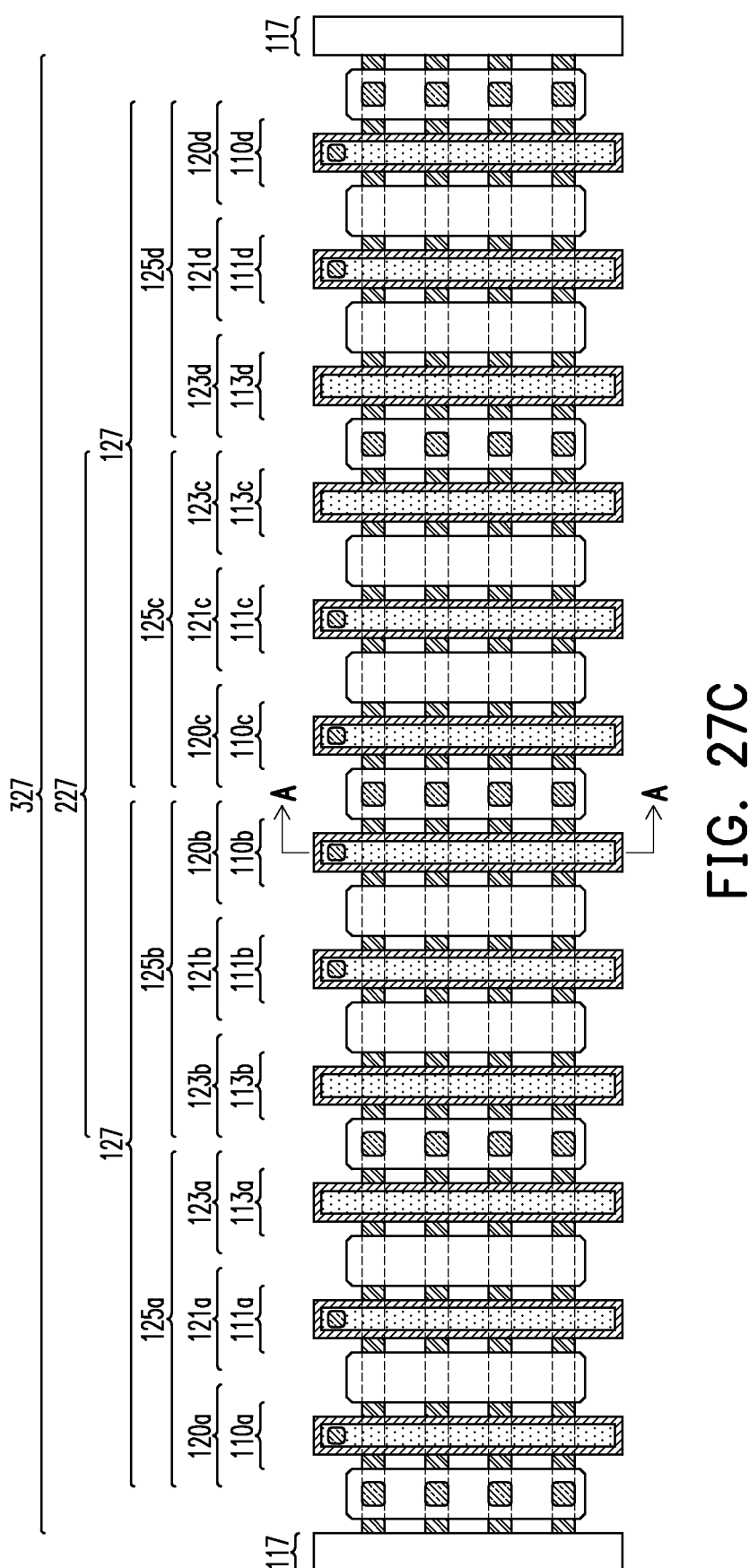
Figure 27D:
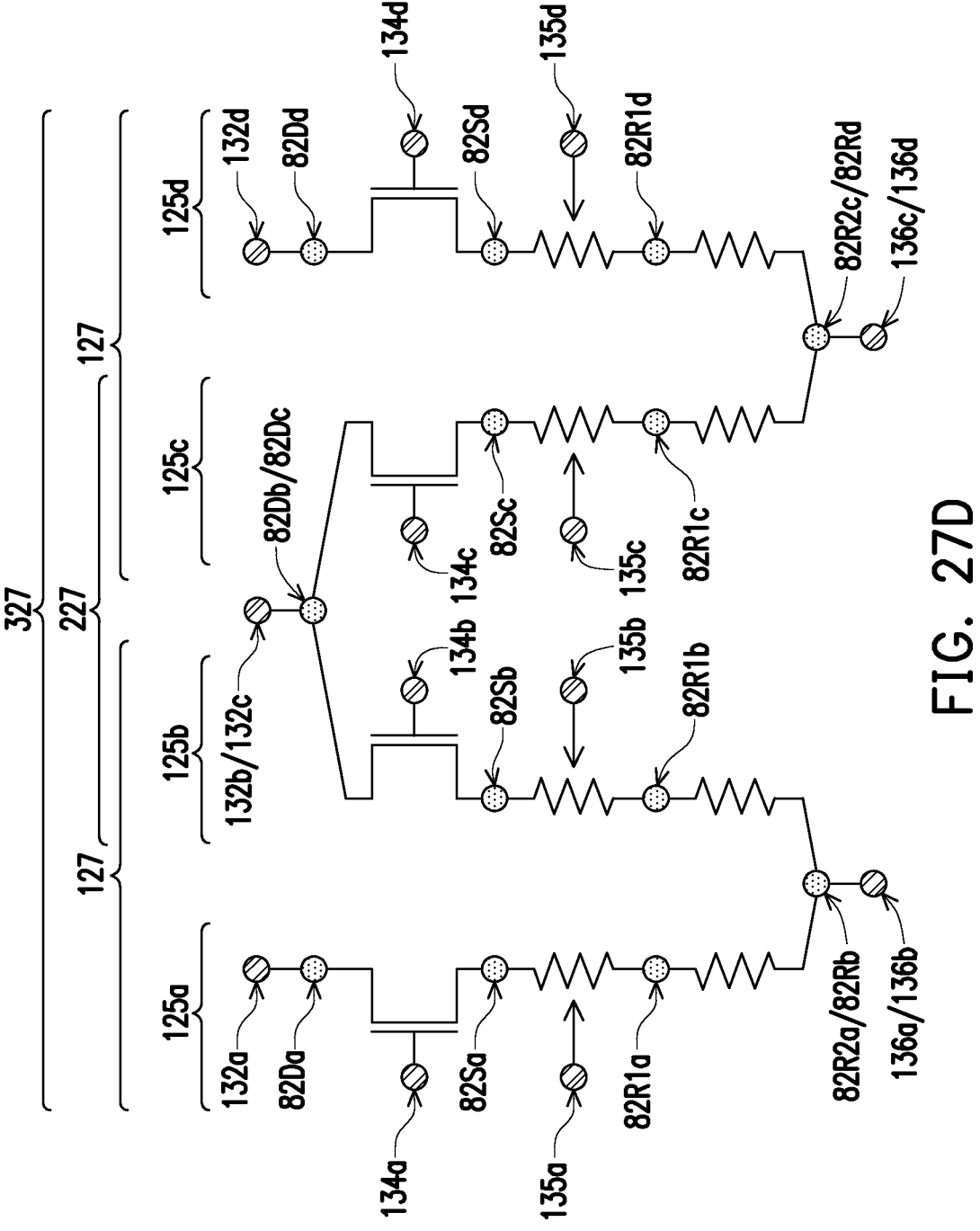
FIG. 27D is a schematic of such transistor devices, in accordance with some embodiments.
Figure 27E:
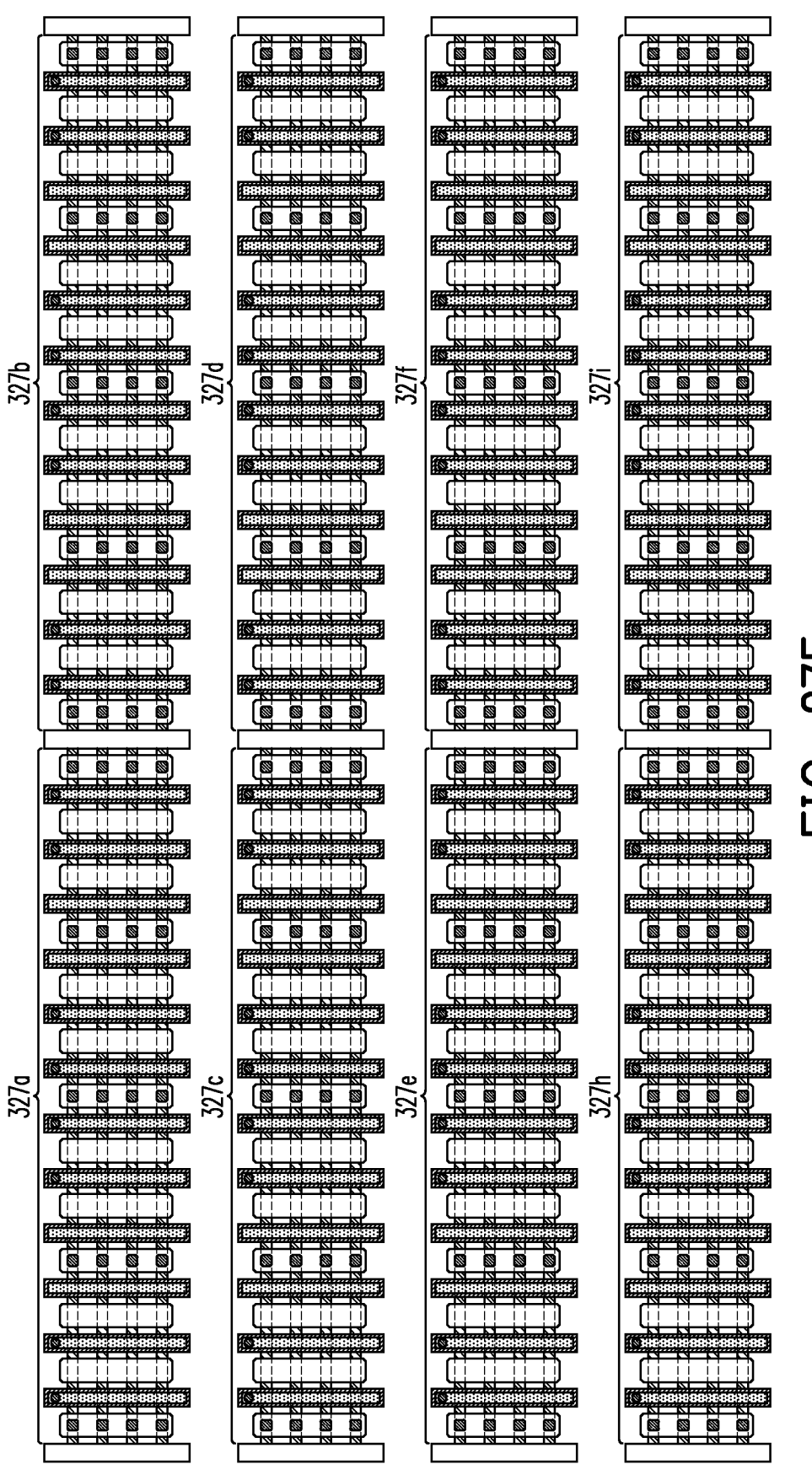

In the embodiment of FIGS. 27A-27E, the SDT devices 125*a* and 125*b* are coupled together in a manner consistent with the source coupled SDT device 127 discussed above, the SDT devices 125*b* and 125*c* are coupled together in a manner consistent with the drain coupled SDT device 227 discussed above, and the SDT devices 125*c* and 125*d* are coupled together in a manner consistent with the source coupled SDT device 127. The SDT devices 125*a* and 125*b* are coupled at an epitaxial region 82R2*a*/82R2*b* that neighbors both a passive resistor 123*a* of the SDT device 125*a* and a passive resistor 123*b* of the SDT device 125*b*. The SDT devices 125*b* and 125*c* are coupled at an epitaxial drain region 82D*b*/82D*c* shared by both a FinFET 120*b* of the SDT device 125*b* and a FinFET 120*c* of the SDT device 125*c*. The SDT devices 125*c* and 125*d* are coupled at an epitaxial region 82R2*c*/82R2*d* that neighbors both a passive resistor 123*c* of the SDT device 125*c* and a passive resistor 123*d* of the SDT device 125*d*. In this manner, multiple SDT devices may be coupled together at the epitaxial regions of neighboring pairs. FIG. 27D illustrates a simplified circuit schematic of the multi-coupled SDT device 327 shown in FIGS. 27A-27C. The edge gates of the multi-coupled SDT device 327 have been replaced with the insulating structures 117, such as described above with respect to FIGS. 20A-23C to allow for a more compact integration on a device workpiece, however, one should understand that the edge gates of the multi-coupled SDT device 327 may be the dummy gate structures 113 in some embodiments.

FIG. 27D illustrates an example plan view configurations of multiples of the multi-coupled SDT device 327, in accordance with some embodiments. Similar to that discussed above with respect to FIGS. 19A and 19B and with respect to FIGS. 24A and 24B, fin cutting and/or gate cutting can separate fins 52, remove fins 52, separate gate structures (e.g., 110, 111, and 113) or remove gate structures, in accordance with some embodiments. As illustrated in FIG. 27D adjacent multi-coupled SDT devices 327 reduce the spacing by including only one insulating structure 117 (though more may be used) between adjacent multi-coupled SDT devices 327 (e.g., 327A and 327B).

Figure 28:
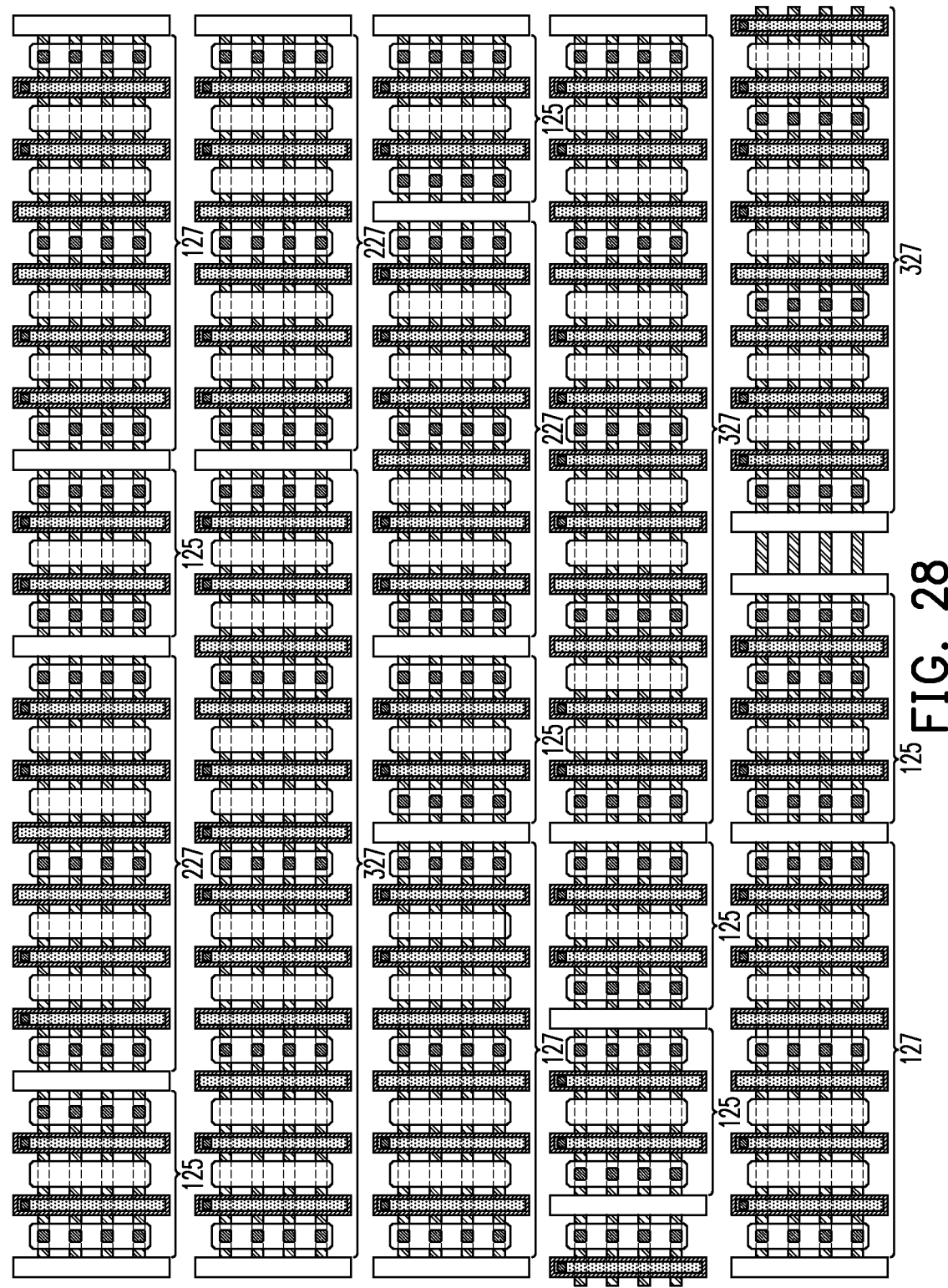
FIG. 28 is a are top-down or plan view of an intermediate stage in the manufacturing of various transistor devices with active resistors and/or passive resistors, in accordance with some embodiments.

FIG. 28 illustrates an example plan view configuration of multiples of the various SDT devices discussed herein (e.g. SDT devices 125 or 125P, source coupled SDT devices 127, drain coupled SDT devices 227, and/or multi-coupled SDT devices 327). It should be understood that the various SDT devices may be varied suitably and combined in any desired manner to produce a configuration of adjacent SDT devices, in accordance with some embodiments. The SDT devices may have their edge dummy gate structures 113 removed and replaced with insulating structures 117. In addition, additional insulating structures 117 may be used as desired. In some embodiments, some of the edge dummy gate structures 113 may be replaced, while others may be left intact. Similar to that discussed above with respect to FIGS. 19A and 19B and with respect to FIGS. 24A and 24B, fin cutting and/or gate cutting can separate fins 52, remove fins 52, separate gate structures (e.g., 110, 111, and 113) or remove gate structures, in accordance with some embodiments. As illustrated in FIG. 28 spacing between adjacent SDT devices may be reduced by including only one insulating structure 117 (though more may be used) between adjacent SDT devices.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Pat. No. 9,647,071, which is incorporated herein by reference in its entirety.

Embodiments herein may achieve advantages. Embodiments utilize a transistor device that includes one or more source degeneration resistors, thereby reducing the effects of transistor noise such as flicker noise. This can improve the performance of devices such as RF devices or the like. The source degeneration resistors described herein include both passive resistors and variable resistors for which the resistance can be modulated with an applied bias voltage. The total degeneration resistance may be configured using a combination of one or more passive resistors and/or active (variable) resistors, which allows for design flexibility. The source degeneration resistors described herein are formed using front-end-of-line (FEOL) processes, and may be formed having a smaller size than resistors formed using back-end-of-line (BEOL) processes, in some cases. For example, the source degeneration resistors may be formed in the same fins as an adjacent FinFET. Embodiments described herein also allow for source degeneration resistors to be formed without the addition of extra process steps. The features and techniques described herein may be used to form various transistor devices with resistors such as common source-amplifiers, common-drain amplifiers, or the like. Embodiments also allow for further resistance to be added by adjusting the number of epitaxial region contacts and/or size of the epitaxial region contacts to provide the source signal pick up for the transistor device. The features and techniques described herein also provide flexibility in layout and provide tools and techniques to reduce space by using common features between adjacent SDT devices or removing and replacing dummy edge gate structures with insulating structures, including removing portions of fins.

One embodiment is a method including forming a fin field-effect transistor (FinFET), the FinFET may include a fin may include a semiconductor material, a transistor gate disposed over a channel region of the fin, a source epitaxial region embedded in the fin at a first side of the transistor gate, and a drain epitaxial region embedded in the fin at a second side of the transistor gate. The method also includes forming a first resistor embedded in the fin between the source epitaxial region and a first epitaxial region. The method also includes disposing a first gate structure over the first resistor, the source epitaxial region embedded in the fin at a second side of the first gate structure, the first epitaxial region embedded in the fin at a first side of the first gate structure.

Another embodiment is a method including doping a fin with a first conductivity type, the fin may include a semiconductor material. The method also includes doping the fin with a second conductivity type, thereby forming a first well in the fin of the second conductivity type. The method also includes forming a first gate structure and a second gate structure over the fin, the first gate structure and the second gate structure oriented perpendicular to a lengthwise direction of the fin, the first gate structure covering a portion of the fin with the first conductivity type and the second gate structure covering a portion of the fin with the second conductivity type. The method also includes forming a first epitaxial region in the fin at a first side of the first gate structure, a second epitaxial region in the fin interposed between the first gate structure and the second gate structure, and a third epitaxial region in the fin at a second side of the second gate structure. The method also includes forming a first contact to the first epitaxial region, a second contact to the first gate structure, and a third contact to the third epitaxial region, the second epitaxial region being free from a contact thereto.

Another embodiment is a semiconductor device comprising a fin extending vertically from a substrate. The semiconductor device also includes a first gate structure over a first channel of the fin. The device also includes a second gate structure over a second channel of the fin. The device also includes a first epitaxial region embedded in the fin adjacent the first gate structure at a first side of the first gate structure. The device also includes a second epitaxial region embedded in the fin adjacent the first gate structure at a second side of the first gate structure. The device also includes a third epitaxial region embedded in the fin adjacent the second gate structure at a second side of the second gate structure, where the first epitaxial region, the second epitaxial region, the third epitaxial region, and the second channel of the fin each have a first conductivity type, where the first channel region has a second conductivity type opposite the first conductivity type.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a fin field-effect transistor (FinFET), the FinFET comprising a fin comprising a semiconductor material, a transistor gate disposed over a channel region of the fin, a source epitaxial region embedded in the fin at a first side of the transistor gate, and a drain epitaxial region embedded in the fin at a second side of the transistor gate;
forming a first resistor embedded in the fin between the source epitaxial region and a first epitaxial region; and
disposing a first gate structure over the first resistor, the source epitaxial region embedded in the fin at a second side of the first gate structure, the first epitaxial region embedded in the fin at a first side of the first gate structure.

2. The method of claim 1, further comprising forming a first contact to the transistor gate, a second contact to the drain epitaxial region, and a third contact to the first epitaxial region, wherein the source epitaxial region is free from any contacts.

3. The method of claim 1, further comprising forming a control contact to the first gate structure, the first gate structure configured to transmit a voltage signal on the control contact to the first resistor, thereby altering a resistance value of the first resistor.

4. The method of claim 1, further comprising:
forming a second resistor embedded in the fin between the first epitaxial region and the source epitaxial region;
forming a second epitaxial region embedded in the fin between the first epitaxial region and the source epitaxial region, wherein one end of the second resistor contacts the source epitaxial region and a second end of the second resistor contacts the second epitaxial region; and
disposing a second gate structure over the second resistor.

5. The method of claim 1, further comprising:
forming a first dummy gate structure adjacent the drain epitaxial region on a side of the drain epitaxial region opposite the transistor gate; and
forming a second dummy gate structure adjacent the first epitaxial region on a side of the first epitaxial region opposite the first gate structure.

6. The method of claim 5, further comprising:
depositing a first inter-layer dielectric (ILD) material over the source epitaxial region, the drain epitaxial region, and the first epitaxial region, the first ILD material laterally surrounding the transistor gate, the first gate structure, the first dummy gate structure, and the second dummy gate structure;
selectively removing the first dummy gate structure and the second dummy gate structure, thereby forming a recess; and
filling the recess with an insulating material.

7. The method of claim 6, wherein forming the recess exposes the fin, further comprising:
removing the fin, thereby extending the recess; and
filling the extended recess with the insulating material.

8. The method of claim 1, wherein the first epitaxial region, the source epitaxial region, and the first resistor share a same conductivity type.

9. A method comprising:
doping a fin with a first conductivity type, the fin comprising a semiconductor material;
doping the fin with a second conductivity type, thereby forming a first well in the fin of the second conductivity type;
forming a first gate structure and a second gate structure over the fin, the first gate structure and the second gate structure oriented perpendicular to a lengthwise direction of the fin, the first gate structure covering a portion of the fin with the first conductivity type and the second gate structure covering a portion of the fin with the second conductivity type;

forming a first epitaxial region in the fin at a first side of the first gate structure, a second epitaxial region in the fin interposed between the first gate structure and the second gate structure, and a third epitaxial region in the fin at a second side of the second gate structure; and forming a first contact to the first epitaxial region, a second contact to the first gate structure, and a third contact to the third epitaxial region, the second epitaxial region being free from a contact thereto.

10. The method of claim 9, wherein the first contact corresponds to a drain contact of a transistor, wherein the second contact corresponds to a gate contact of the transistor, and wherein the third contact corresponds to a source contact of a transistor.

11. The method of claim 9 further comprising:

forming a third gate structure and a fourth gate structure over the fin;

forming a fourth epitaxial region in the fin between the third gate structure and the fourth gate structure and a fifth epitaxial region in the fin at a first side of the third gate structure; and forming a fourth contact to the first gate structure and forming a fifth contact to the fifth epitaxial region, the fourth epitaxial region being free from a contact thereto, wherein the second contact corresponds to a gate contact of a first transistor, wherein the fourth contact corresponds to a gate contact of a second transistor, and wherein the first transistor and second transistor utilize a shared drain contact or shared source contact.

12. The method of claim 9, wherein the portion of the fin under the second gate structure corresponds to an embedded resistor interposed between the second epitaxial region and the third epitaxial region, wherein the second epitaxial region corresponds to a source epitaxial region of a transistor.

13. The method of claim 9, further comprising forming a fourth contact to the second gate structure, the second contact configured to receive a voltage level, the voltage level configured to bias a resistivity property of the portion of the fin under the second gate structure.

14. The method of claim 9, further comprising:

forming a third gate structure over the fin adjacent the first epitaxial region;

depositing an inter-layer dielectric (ILD) structure over the first epitaxial region, the ILD structure laterally surrounding the third gate structure;

removing the third gate structure to form a recess in the ILD structure; and depositing an insulating material in the recess.

15. The method of claim 14, wherein the recess is a first recess, the first recess exposing a portion of the fin, further comprising:

removing the exposed portion of the fin to form a second recess within the first recess, the insulating material filling the second recess.

16. A method comprising:

forming a fin extending from a substrate;

forming a first gate structure over a first channel of the fin;

forming a second gate structure over a second channel of the fin;

forming a first epitaxial region embedded in the fin adjacent the first gate structure at a first side of the first gate structure;

forming a second epitaxial region embedded in the fin adjacent the first gate structure at a second side of the first gate structure; and forming a third epitaxial region embedded in the fin adjacent the second gate structure at a second side of the second gate structure, wherein the first epitaxial region, the second epitaxial region, the third epitaxial region, and the second channel of the fin each have a first conductivity type, wherein the first channel has a second conductivity type opposite the first conductivity type.

17. The method of claim 16, further comprising:

forming a well in the fin, wherein the second channel of the fin is formed in the well.

18. The method of claim 16, further comprising:

forming a drain contact coupled to the first epitaxial region;

forming a gate contact coupled to the first gate structure; and forming a source contact coupled to the third epitaxial region, the source contact separated from the second epitaxial region by the third epitaxial region and the second channel.

19. The method of claim 16, further comprising a control contact coupled to the second gate structure, the control contact configured to receive a voltage signal, wherein the voltage signal is configured to bias the second channel, thereby changing a resistivity of the second channel.

20. The method of claim 16, further comprising:

forming a third gate structure and a fourth gate structure over the fin; and forming a fourth epitaxial region in the fin between the third gate structure and the fourth gate structure and a fifth epitaxial region in the fin at a first side of the third gate structure, wherein the fourth epitaxial region is free from a contact thereto, wherein the first gate structure is a gate structure of a first transistor, wherein the third gate structure is a gate structure of a second transistor, and wherein the first transistor and second transistor utilize a shared drain contact or shared source contact.

* * * * *